(12) United States Patent
Liu et al.

(10) Patent No.: US 8,461,458 B2
(45) Date of Patent: Jun. 11, 2013

(54) CARD STRUCTURE, SOCKET STRUCTURE, AND ASSEMBLY STRUCTURE THEREOF

(71) Applicant: Industrial Technology Research Institute, Hsinchu (TW)

(72) Inventors: Chih-Yuan Liu, Hsinchu County (TW); Chien-Hong Lin, Hsinchu County (TW); Yuan-Heng Sun, Taipei County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/707,459

(22) Filed: Dec. 6, 2012

(65) Prior Publication Data
US 2013/0095674 A1   Apr. 18, 2013

Related U.S. Application Data

(62) Division of application No. 12/759,671, filed on Apr. 13, 2010.

(60) Provisional application No. 61/187,856, filed on Jun. 17, 2009.

(30) Foreign Application Priority Data

Oct. 28, 2009 (TW) ............................ 98136426 A

(51) Int. Cl.
*H05K 5/00* (2006.01)
*H05K 7/00* (2006.01)

(52) U.S. Cl.
USPC ...... 174/250; 361/679.31; 361/761; 361/777; 174/251; 174/255; 174/260

(58) Field of Classification Search
USPC .................. 174/250–268; 361/679.31–679.4, 361/679.55–679.6, 724–727, 750–755
See application file for complete search history.

(56) References Cited

U.S. PATENT DOCUMENTS 6,854,984 B1   2/2005   Lee et al.
(Continued)

FOREIGN PATENT DOCUMENTS

| CN | 1501553 | 6/2004 |
| CN | 1987718 | 6/2007 |
| CN | 101316012 A | 12/2008 |

(Continued)

OTHER PUBLICATIONS

China Patent Office, Office Action, Patent Application Serial No. 200910246782.6, Nov. 5, 2012, China.

*Primary Examiner* — Zachary M Pape
*Assistant Examiner* — Jerry Wu

(57) ABSTRACT

A card structure includes a first substrate, a second substrate, and a connector. The first substrate includes a base surface, wherein at least one electronic part region and a terminal region are disposed on the base surface. The second substrate is disposed on the base surface and is coupled to the terminal region of the first substrate. The connector is disposed on the base surface to juxtapose the second substrate. The connector includes a connecting surface, a contact unit, and a plurality of contact regions disposed on the connecting surface and coupled to the contact unit and the terminal region, such that the plurality of contact regions are coupled to the second substrate via the terminal region of the first substrate.

9 Claims, 47 Drawing Sheets

U.S. PATENT DOCUMENTS

| | | | |
|---|---|---|---|
| 7,440,287 B1 * | 10/2008 | Ni et al. | 361/752 |
| 2003/0040222 A1 * | 2/2003 | Price et al. | 439/638 |
| 2009/0311895 A1 | 12/2009 | Chen | |

FOREIGN PATENT DOCUMENTS

| | | |
|---|---|---|
| TW | 201001822 | 1/2010 |

\* cited by examiner

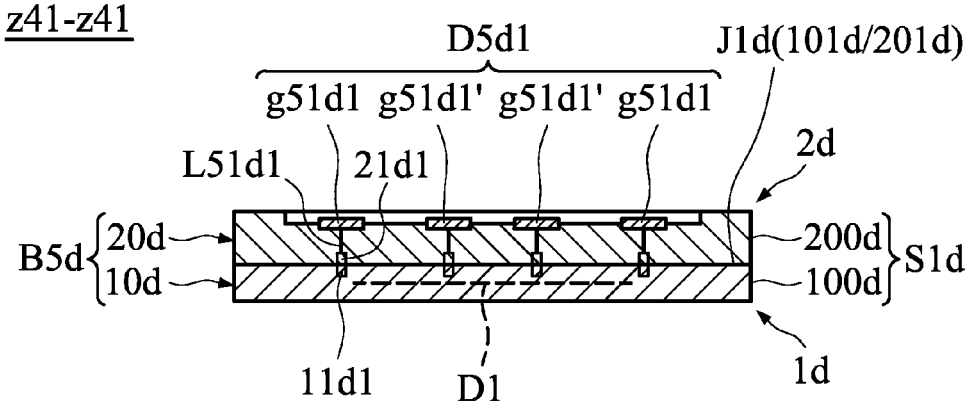
FIG. 16D1
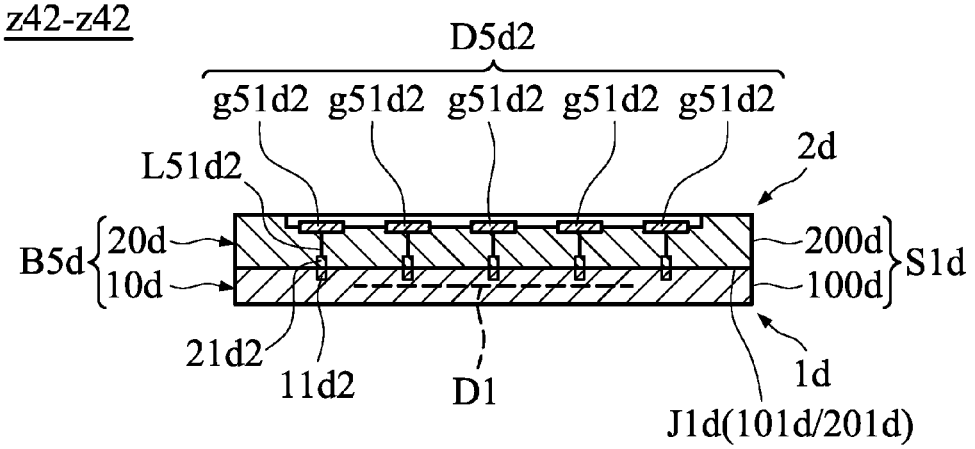
FIG. 16D2

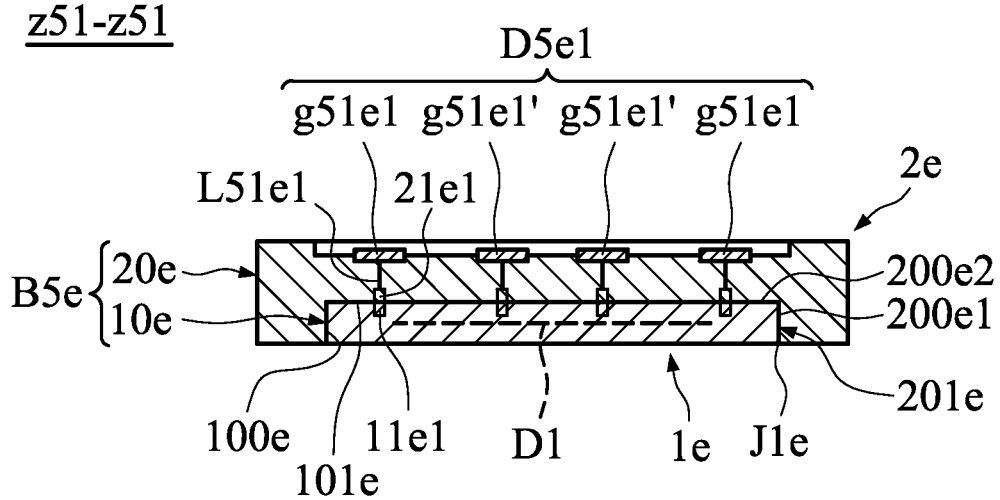
FIG. 17D1
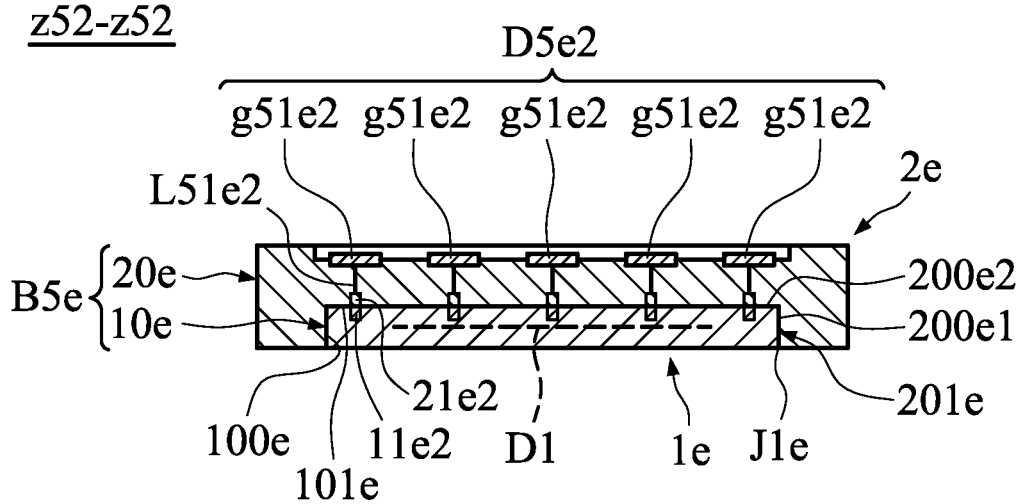
FIG. 17D2

CARD STRUCTURE, SOCKET STRUCTURE, AND ASSEMBLY STRUCTURE THEREOF

CROSS REFERENCE TO RELATED APPLICATIONS

This application is a division of U.S. patent application Ser. No. 12/759,671 filed Apr. 13, 2010, claims the benefit of U.S. Provisional Application No. 61/187,856, filed on Jun. 17, 2009, the entirety of which is/are incorporated by reference herein. This application claims priority of Taiwan Patent Application No. 98136426, filed on Oct. 28, 2009, the entirety of which is incorporated by reference herein.

BACKGROUND OF THE DISCLOSURE

1. Field of the Disclosure

The present disclosure relates to a card structure, a socket structure and an assembly structure thereof, and in particular relates to a slim memory card structure, a socket structure and an assembly structure thereof for USB 3.0 specifications.

2. Description of the Related Art

For USB slim memory cards or USB plugs provided with electronic parts (not shown in FIGs.) therein (referred to U.S. Pat. No. 7,440,287), a chip on board (COB) device is provided with a number of electronic parts, chips and welding dots. When the COB and a connector are connected to each other by a welding process, heat flux generated during the welding process will reheat these electronic parts, chips and welding dots, and these electronic parts, chips and welding dots are possibly dislocated or damaged by thermal effect.

Furthermore, in the present market, most of card memory devices or products (e.g., micro SD, thin USB storage cards, etc.) are manufactured by methods such as semiconductor manufacturing processes. A flat metallic pad of these card memory devices or products can be produced by an integral formation method, but non-flat metallic pads are not.

BRIEF SUMMARY OF THE DISCLOSURE

The disclosure provides a card structure capable of eliminating the thermal effect affecting electrical components to be dislocated or damaged while welding, thus, to increase yield of products. Additionally, the disclosure provides different designs and manufacturing procedures to produce connectors and electrical circuits, respectively. Under associated protocols, these connectors and electrical circuits are coupled to each other by their contact points which are juxtaposed to each other, and these juxtaposed contact points are snugly welded or glued by an associated mechanism, thereby attaining the desired functions and reducing dimension of the products.

One embodiment of the disclosure provides a card structure, comprising a first element and a second element. The first element comprises a first peripheral portion and at least one first contact point exposed by the first peripheral portion. The second element comprises a second peripheral portion and at least one second contact point corresponding to the at least one first contact point of the first element and exposed by the second peripheral portion. When the first and second elements are joined with each other, the first peripheral portion of the first element and the second peripheral portion of the second element are adjacent to each other, such that the at least one first contact point of the first element and the at least one second contact point of the second element are juxtaposed to each other.

One embodiment of the disclosure provides an assembly structure, comprising a socket structure and a card structure. The socket structure comprises a socket body and a socket contact unit disposed on the socket body. The card structure is detachably disposed on the socket body of the socket structure. The card structure comprises a first element, a second element and a card contact unit. The first element comprises a first peripheral portion and at least one first contact point exposed by the first peripheral portion. The second element comprises a second peripheral portion and at least one second contact point corresponding to the at least one first contact point of the first element and exposed by the second peripheral portion, wherein the first peripheral portion of the first element and the second peripheral portion of the second element are adjacent to each other when the first and second elements are joined with each other, such that the at least one first contact point of the first element and the at least one second contact point of the second element are juxtaposed to each other. The card contact unit coupled to the at least one second contact point of the second element, detachably contacting the socket contact unit of the socket structure. When the card structure is disposed on the socket structure, the card contact unit of the card structure contacts the socket contact unit of the socket structures such that the socket structure and the card structure are coupled to each other.

One embodiment of the disclosure provides a card structure for a socket structure provided with a plurality of first elastic plates and a plurality of second elastic plates. The card structure comprises a body, a plurality of first pad portions and a plurality of second pad portions. The body comprises an outer surface. The plurality of first and second pad portions disposed on the outer surface of the body correspond to the plurality of first and second elastic plates of the socket structure, respectively. When the card structure is disposed on the socket structure, the plurality of first and second pad portions of the card structure respectively contact the plurality of first and second elastic plates of the socket structure.

One embodiment of the disclosure provides a socket structure for a card structure provided with a plurality of first pad portions and a plurality of second pad portions. The socket structure comprises a body, a plurality of first contact portions, and a plurality of second contact portions. The body comprises a slot comprising a sidewall surface and an opening. The plurality of first and second contact portions disposed on the sidewall surface of the slot of the body correspond to the plurality of first and second pad portions of the card structure, respectively. When the card structure is disposed on the body of the socket structure though the opening of the slot of the body of the socket structure, the plurality of first and second pad portions of the card structure respectively contact the plurality of first and second contact portions of the socket structure.

One embodiment of the disclosure provides a card structure, comprising a first substrate, a second substrate and a connector. The first substrate comprises a base surface, at least one electronic part region disposed on the base surface, and a terminal region disposed on the base surface. The second substrate is disposed on the base surface of the first substrate and coupled to the terminal region of the first substrate. The connector, disposed on the base surface of the first substrate to juxtapose the second substrate, comprises a connecting surface, a contact unit, and a plurality of contact regions disposed on the connecting surface and coupled to the contact unit. When the connecting surface of the connector is connected to the base surface of the first substrate, the connector covers the at least one electronic part region of the first substrate and the plurality of contact regions of the connector are coupled to the terminal region of the first substrate, such that the plurality of contact regions of the connector are coupled to the second substrate via the terminal region of the first substrate.

One embodiment of the disclosure provides a card structure, comprising a first substrate, a second substrate, an intermediate unit and a connector. The first substrate comprises a base surface. The second substrate, disposed on the base surface of the first substrate, is coupled to the first substrate. The connector, disposed on the base surface of the first substrate to juxtapose the second substrate via the intermediate unit, is coupled to the first substrate.

One embodiment of the disclosure provides an assembly structure, comprising an outer shell structure and a card structure. The outer shell structure comprises a shell body comprising a first access portion and a second access portion connected to the first access portion. The card structure, detachably disposed on the shell body of the outer shell structure via the first access portion or the second access portion of the shell body of the outer shell structure, comprises a first element, a second element and a card contact unit. The first element comprises a first peripheral portion and at least one first contact point exposed by the first peripheral portion. The second element comprises a second peripheral portion and at least one second contact point corresponding to the at least one first contact point of the first element and exposed by the second peripheral portion. The card contact unit, disposed on the second element, is coupled to the at least one second contact point of the second element. When the card structure is disposed on the shell body of the outer shell structure via the first access portion or the second access portion of the shell body of the outer shell structure, a compartment is formed between the card structure and the shell body of the outer shell structure and the card contact unit of the card structure faces the compartment.

One embodiment of the disclosure provides an assembly structure, comprising an outer shell structure and a card structure. The outer shell structure comprises a shell body comprising a first access portion and a second access portion connected to the first access portion. The card structure, detachably disposed on the shell body of the outer shell structure via the first access portion or the second access portion of the shell body of the outer shell structure, comprises a body, a plurality of first pad portions and a plurality of second pad portions. The body comprises an outer surface. The plurality of first and second pad portions are disposed on the outer surface of the body. When the card structure is disposed on the shell body of the outer shell structure via the first access portion or the second access portion of the shell body of the outer shell structure, a compartment is formed between the card structure and the shell body of the outer shell structure and the plurality of first and second pad portions of the card structure faces the compartment.

A detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings, wherein:

FIG. 16D1 is a sectional view of the card structure along line (z41-z41) of FIG. 16C;

FIG. 16D2 is a sectional view of the card structure along line (z42-z42) of FIG. 16C;

FIG. 17D1 is a sectional view of the card structure along line (z51-z51) of FIG. 17C;

FIG. 17D2 is a sectional view of the card structure along line (z52-z52) of FIG. 17C;

DETAILED DESCRIPTION OF THE DISCLOSURE

The following description is of the better-contemplated mode of carrying out the disclosure. This description is made for the purpose of illustrating the general principles of the disclosure and should not be taken in a limiting sense. The scope of the disclosure is determined by reference to the appended claims.

Figure 1A:
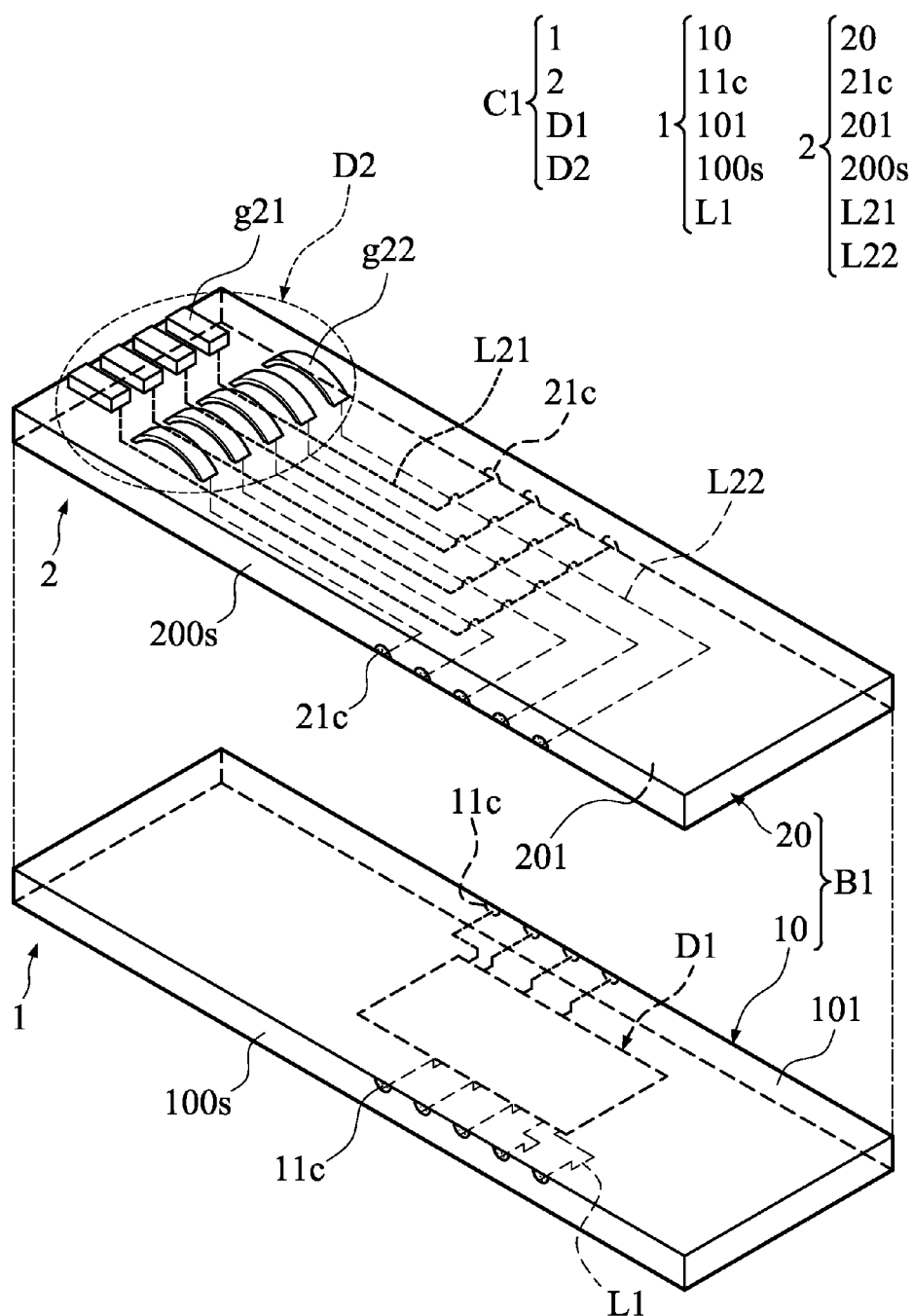
FIG. 1A is an exploded view of a card structure of a first embodiment of the disclosure.
Figure 1B:
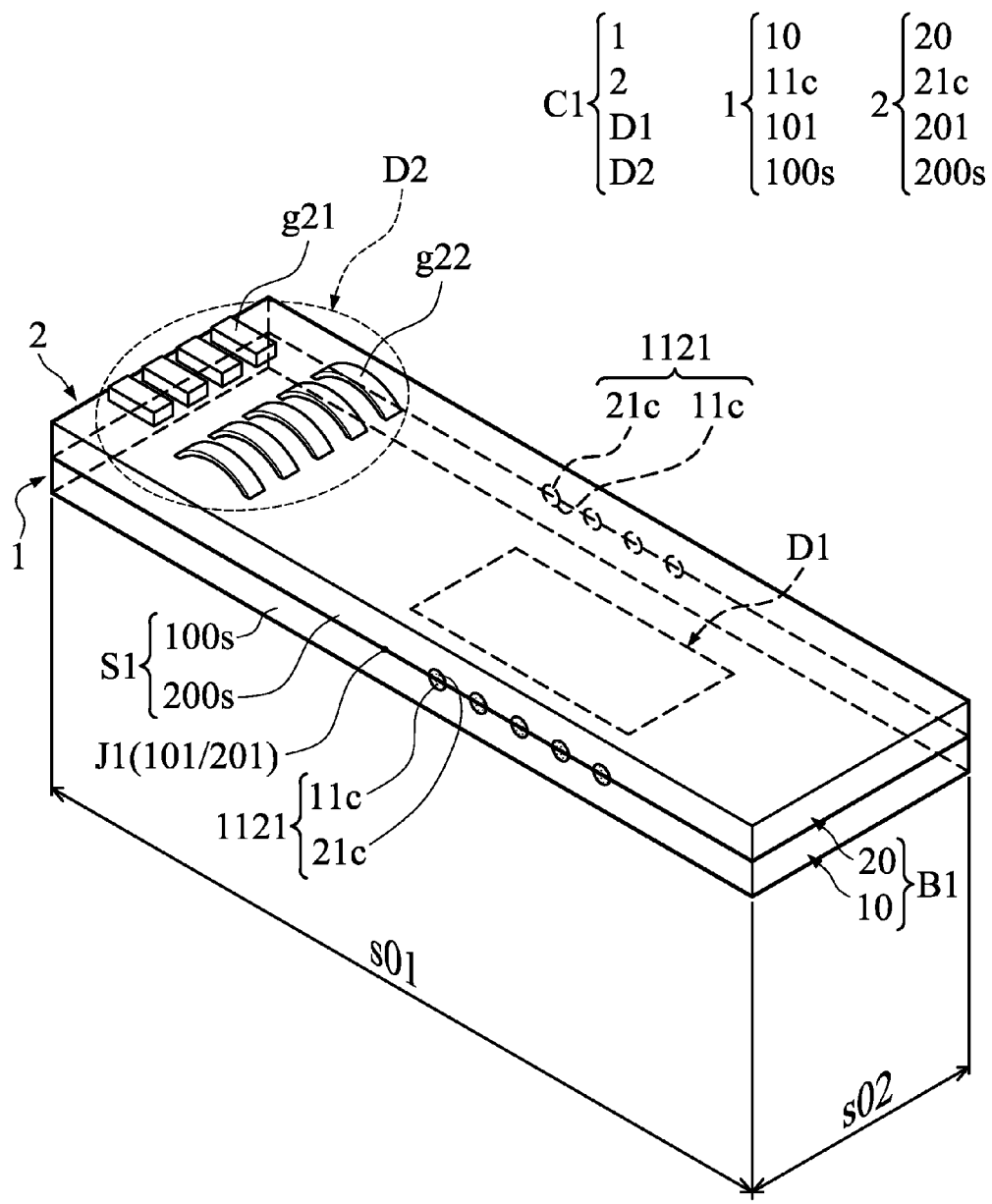
FIG. 1B is an assembled view of the card structure of FIG. 1A.

FIG. 1A is an exploded view of a card structure C1 of a first embodiment, and FIG. 1B is an assembled view of the card structure C1 of FIG. 1A. In this embodiment, the card structure C1 is a slim memory card structure for USB 3.0 specifications.

In FIG. 1A, the card structure C1 comprises a first element 1, a second element 2, a circuit unit D1 and a card contact unit D2. The first and second elements 1 and 2 are rectangular member. In this embodiment, the first element 1 and the circuit unit D1 form a chip on board (COB) device.

The first element 1 comprises a first body 10, a plurality of first contact points 11c, a first join portion 101, a first peripheral portion 100s and a plurality of first lead wires L1. The first join portion 101 is a surface of the first body 10, and the first peripheral portion 100s is a peripheral surface of the first body 10 which is located at an outer circumference of the first join portion 101. The circuit unit D1 can be disposed on or inside of the first body 10 of the first element 1. The plurality of first contact points 11c exposed by the first peripheral portion 100s are coupled or electrically connected to the circuit unit D1.

The second element 2 comprises a second body 20, a plurality of second contact points 21c, a second join portion 201, a second peripheral portion 200s, and a plurality of second lead wires L21 and L22. The second join portion 201 is a surface of the second body 20 to join the first join portion 101 of the first element 1, and the second peripheral portion 200s is a peripheral surface of the second body 20 which is located an outer circumference of the second join portion 201. The plurality of second contact points 21c of the second element 2, corresponding to the plurality of first contact points 11c of the first element 1, are exposed by the second peripheral portion 200s thereof. The first body 10 of the first element 1 and the second body 20 of the second element 2 form a card body B1 of the card structure C1.

The card contact unit D2 comprises a plurality of first contact portions g21 and a plurality of second contact portions g22 which are outwardly exposed by the second body 20 of the second element 2 and coupled to the plurality of second contact points 21c of the second element 2 via a plurality of second lead wires L21 and L22. In this embodiment, the plurality of first contact portions g21 of the card contact unit D2 are conductive pad portions, and the plurality of second contact portions g22 of the card contact unit D2 are conductive elastic plates or reeds. To briefly describe the structure of the card structure C1, the plurality of first and second lead wires L1 and L21/L22 are omitted in the following accompanying drawings.

In FIG. 1B, when the first join portion 101 of the first element 1 and the second join portion 201 of the second element 2 are joined with each other, the first peripheral portion 100s of the first element 1 and the second peripheral portion 200s of the second element 2 are connectively adjacent to each other to form a common region J1 therebetween and a combined peripheral portion S1, and the plurality of first contact points 11c of the first element 1 and the plurality of second contact points 21c of the second element 2 are juxtaposed to each other at the common region J1, i.e., the plurality of first contact points 11*c* of the first element 1 and the plurality of second contact points 21*c* of the second element 2 are juxtaposed to each other to form a plurality of juxtaposed contact points 1121.

Figure 1C:
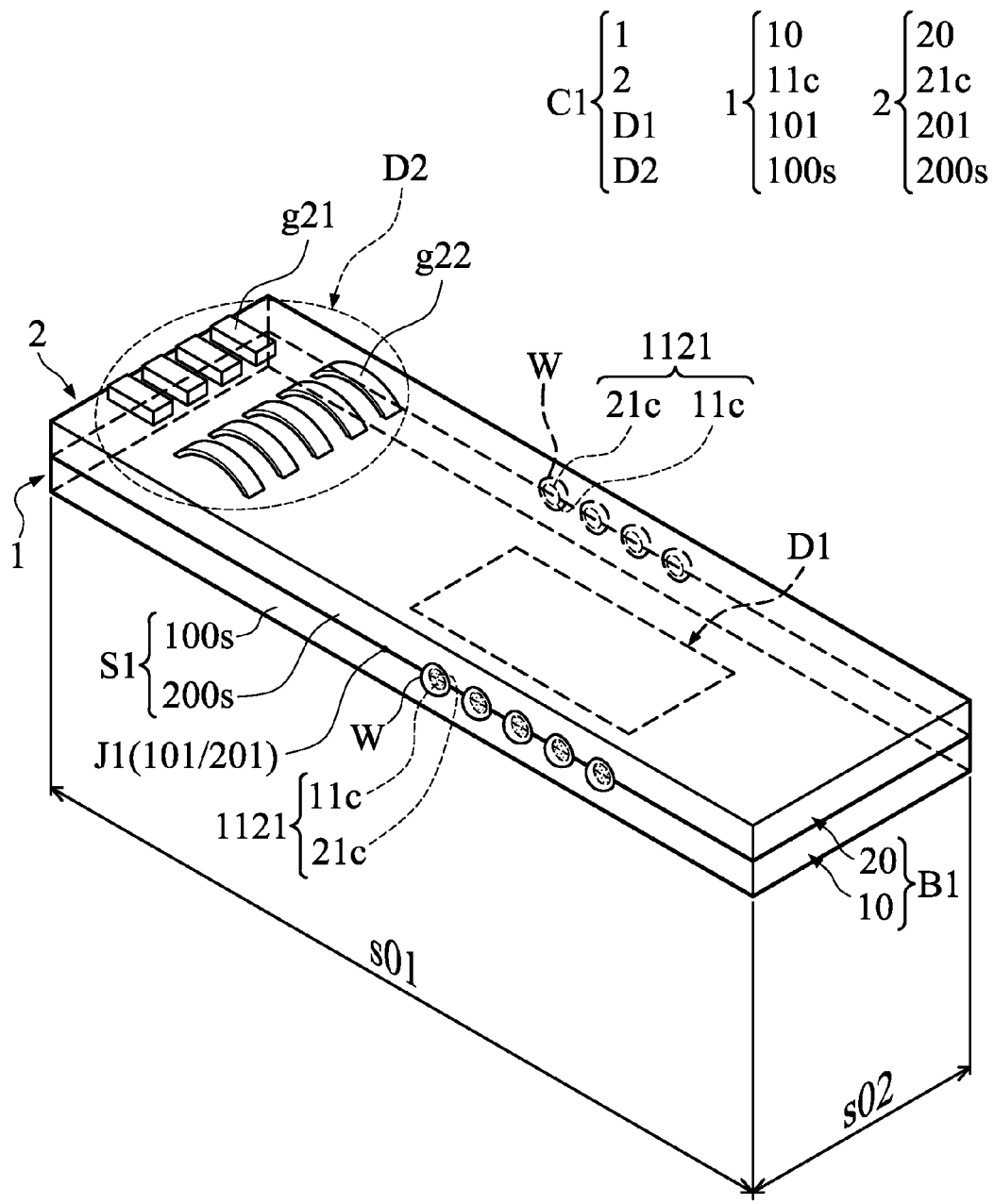
FIG. 1C is a schematic view of the card structure of FIG. 1B after welding.

FIG. 1C is a schematic view of the card structure C1 of FIG. 1B after welding. After the first join portion 101 of the first element 1 and the second join portion 201 of the second element 2 are joined with each other to juxtapose the plurality of first contact points 11*c* of the first element 1 and the plurality of second contact points 21*c* of the second element 2, i.e., to form the plurality of juxtaposed contact points 1121, the joined first and second elements 1 and 2 is treated by a welding process (e.g., tinning furnace) to apply a welding portion W onto each of the juxtaposed first and second contact points 11*c* and 21*c*, such that electrical connections of the juxtaposed first and second contact points 11*c* and 21*c* are built.

As to the combined peripheral portion S1 formed by the first peripheral portion 100*s* of the first element 1 and the second peripheral portion 200*s* of the second element 2, the combined peripheral portion S1 comprises a pair of longer sections (long side) s01 and a pair of shorter sections (short side) s02. The length of shorter section s02 of the combined peripheral portion S1 is minimized according to the arrangement of the plurality of first and second contact portions g21 and g22 of the card contact unit D2. In this embodiment, the length of the longer section s01 is at least twice as the length of shorter section s02, the amount of the juxtaposed contact points 1121 configured at one longer section s01 is five, and the amount of the juxtaposed contact points 1121 configured at one shorter section s02 is four.

Because the welding process is merely applied onto the juxtaposed first and second contact points 11*c* and 21*c* which are located at one side of the combined peripheral portion S1 of the first and second elements 1 and 2, electronic parts (not shown in FIGs.) located inside the first element 1 are not thermally affected by heat flux generated during the welding process, i.e., dislocation or damage on the electronic parts of the first element 1 can be eliminated, such that yield of products can be increased.

Figure 2:
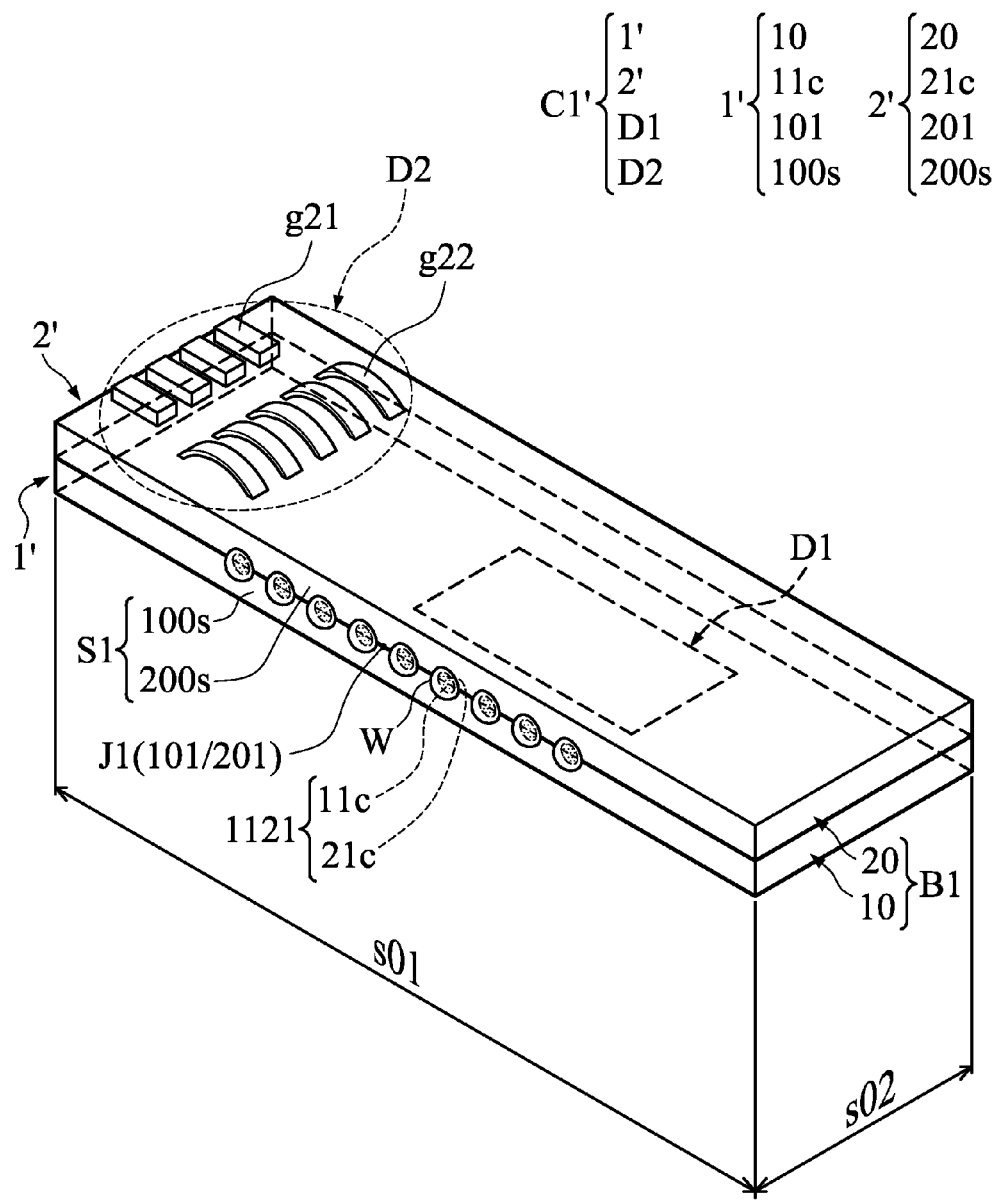
FIG. 2 is a schematic view of a variation example according to the card structure of the first embodiment of the disclosure.

FIG. 2 is a schematic view of a variation example according to the card structure C1 of the first embodiment. A card structure C1' of the variation example comprises a first element 1', a second element 2', a circuit unit D1 and a card contact unit D2. The first and second elements 1' and 2' are substantially the same as the first and second elements 1 and 2 of the card structure C1 of the first embodiment. The card structure C1' differs from the card structure C1 in that the plurality of juxtaposed contact points 1121 are all located at the same longer section s01. In this variation embodiment, the amount of the juxtaposed contact points 1121 located at the longer section s01 is nine.

Figure 3A:
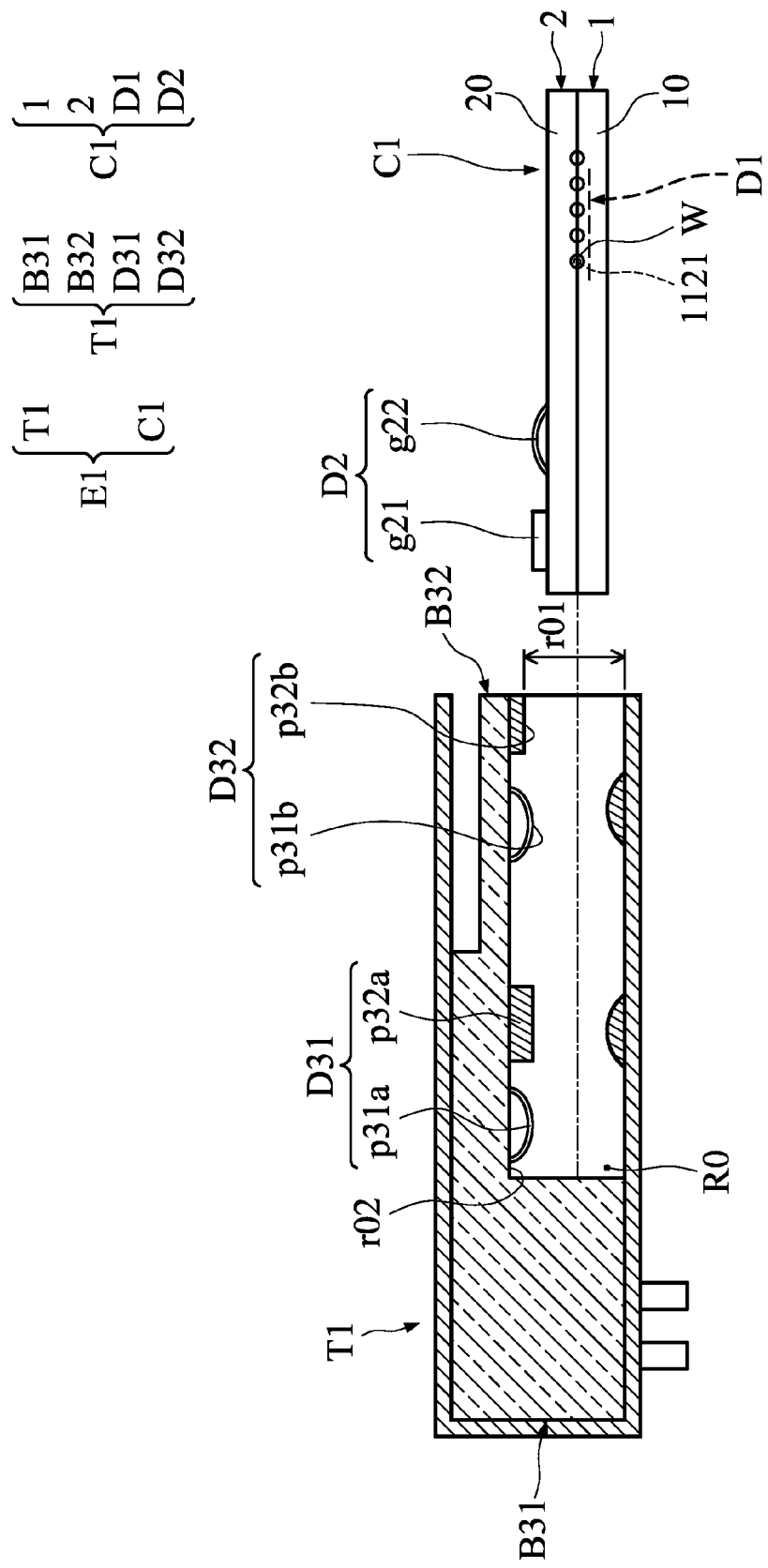
FIG. 3A is an exploded view of a card structure of a second embodiment of the disclosure.
Figure 3B:
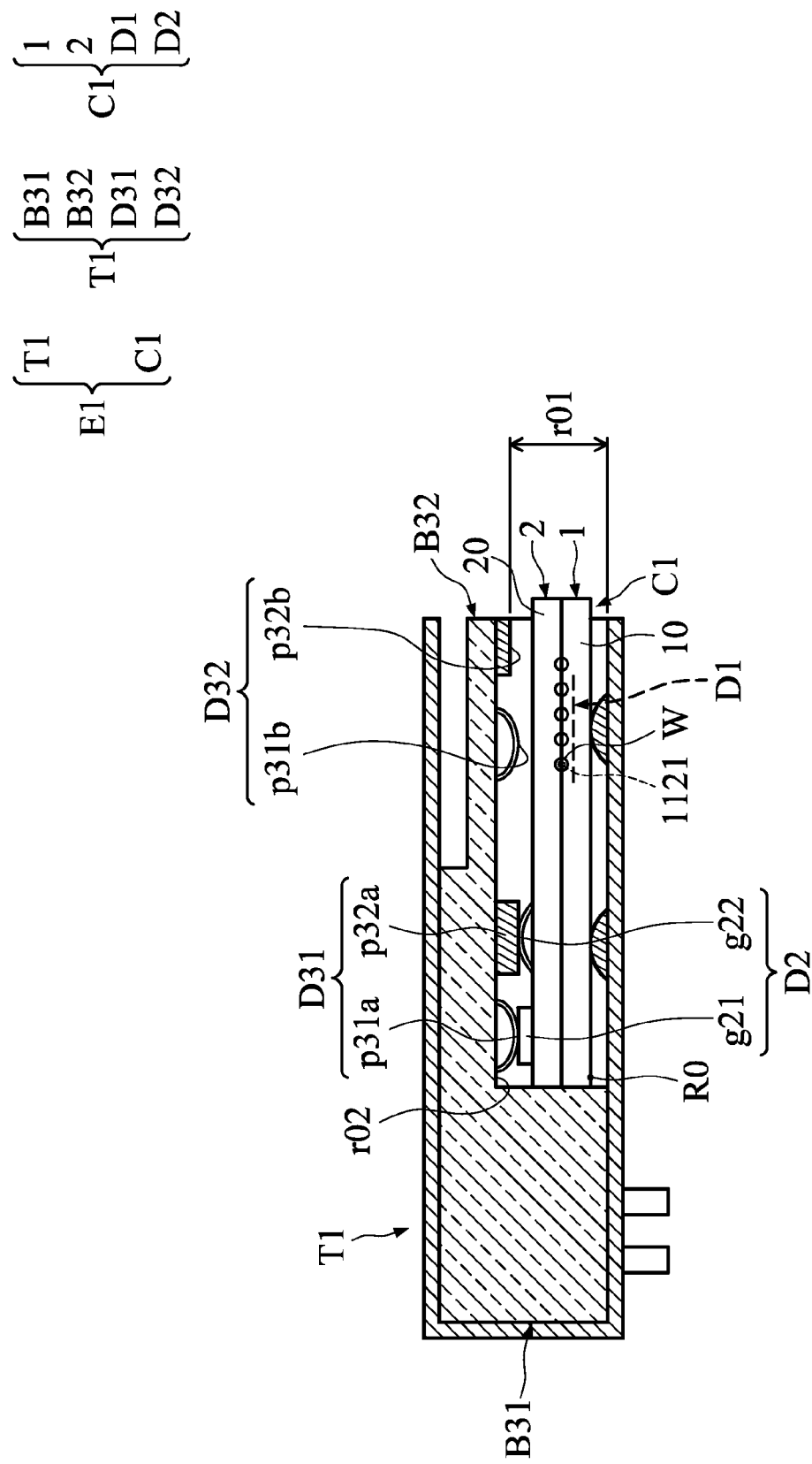
FIG. 3B is an assembled view of the card structure of FIG. 3A.

FIG. 3A is an exploded view of a card structure E1 of a second embodiment, and FIG. 3B is an assembled view of the card structure E1 of FIG. 3A.

In FIG. 3A, the card structure E1 comprises a socket structure T1 and the card structure C1 mentioned above. The detail description of the card structure C1 is therefore omitted hereinafter.

The socket structure T1 comprises a socket body B31, a positioning portion B32 and two socket contact units D31 and D32. Two socket contact units D31 and D32 are referred to a first contact unit and a second contact unit, respectively. The first contact unit D31 comprises a plurality of first contact portions p31*a* and a plurality of second contact portions p32*a*, and the second contact unit D32 comprises a plurality of third contact portions p31*b* and a plurality of fourth contact portions p32*b*. In this embodiment, the plurality of first contact portions p31*a* of the first contact unit D31 and the plurality of third contact portions p31*b* of the second contact unit D32 are conductive elastic plates or reeds, and the plurality of second contact portions p32*a* of the first contact unit D31 and the plurality of fourth contact portions p32*b* of the second contact unit D32 are conductive pad portions.

The socket body B31 of the socket structure T1 comprises a slot R0 having an opening r01 and a sidewall surface r02 connected to the opening r01. The positioning portion B32 is extended from the socket body B31 to form the opening r01 and the sidewall surface r02 of the slot R0 of the socket body B31. In this embodiment, the positioning portion B32 is a cantilevered portion. The plurality of first and second contact portions p31*a* and p32*a* of the first contact unit D31 as well as the plurality of third and fourth contact portions p31*b* and p32*b* of the second contact unit D32 are protruded from the sidewall surface r02 of the slot R0 of the socket body B31, wherein the plurality of third contact portions p31*b* of the second contact unit D32 are closer to the opening r01 of the slot R0 of the socket body B31 than the plurality of first and second contact portions p31*a* and p32*a* of the first contact unit D31, and the plurality of fourth contact portions p32*b* of the second contact unit D32 are closer to the opening r01 of the slot R0 of the socket body B31 than the plurality of third contact portions p31*b* of the second contact unit D32.

In FIG. 3B, when the card structure C1 is inserted into the slot R0 of the socket body B31 of the socket structure T1 via the opening r01 thereof, the plurality of first and second contact portions g21 and g22 of the card structure C1 are contacted by the plurality of first and second contact portions p31*a* and p32*a* of the first contact unit D31 of the socket structure T1, respectively, such that electrical connections of the card structure C1 and the socket structure T1 are built.

The plurality of third and fourth contact portions p31*b* and p32*b* of the second contact unit D32 of the socket structure T1 are provided for the use of conventional plugs (not shown in FIGs.) for USB 2.0 specification. That is, when the conventional USB 2.0 plug is inserted into the slot R0 of the socket body B31 of the socket structure T1 via the opening r01 thereof, the conventional USB 2.0 plug is contacted by and electrically connected to the plurality of third and fourth contact portions p31*b* and p32*b* of the second contact unit D32 of the socket structure T1, and the conventional USB 2.0 plug therefore can be positioned by the socket body B31 and the positioning portion B32 of the socket structure T1.

Figure 4:
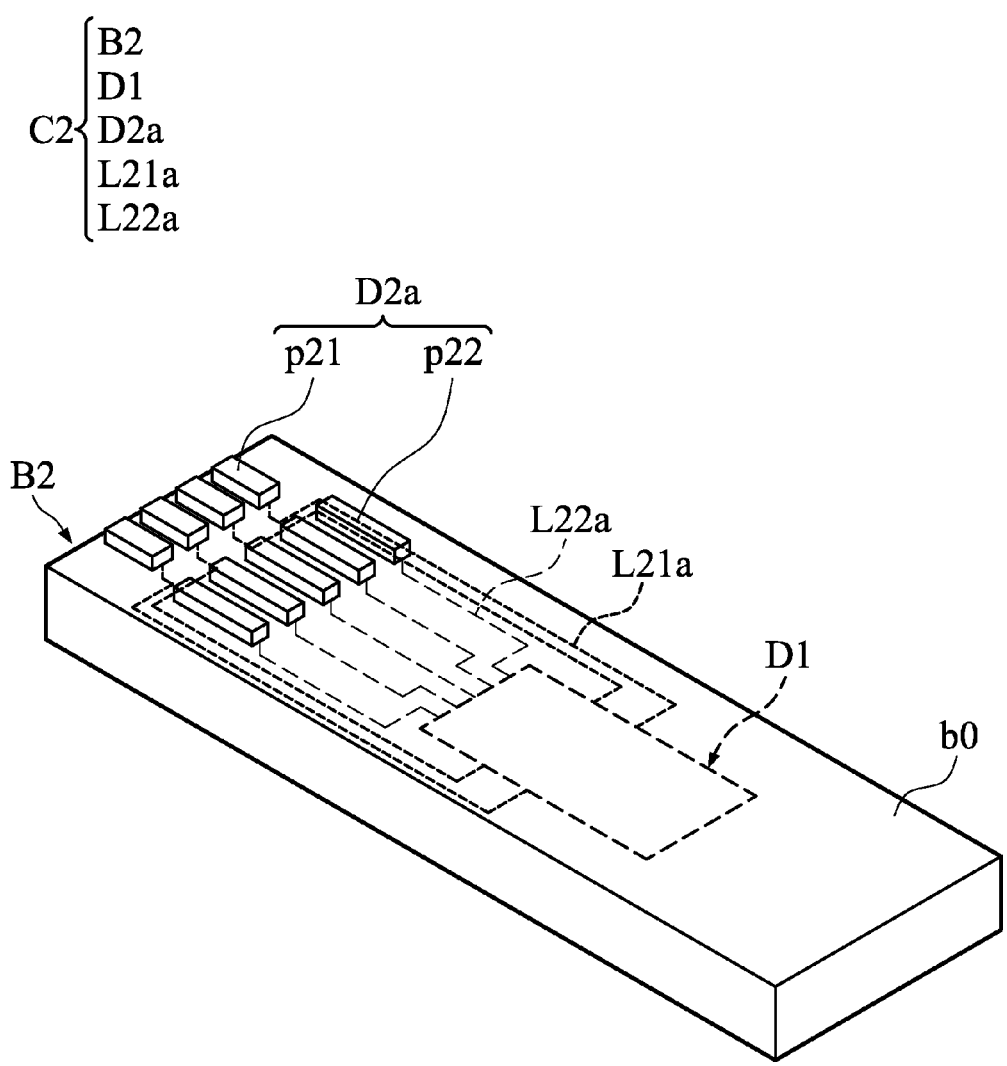
FIG. 4 is a perspective view of a card structure of a third embodiment of the disclosure.

FIG. 4 is a perspective view of a card structure C2 of a third embodiment. In this embodiment, the card structure C2 is a slim memory card structure for USB 3.0 specifications.

The card structure C2 comprises a card body B2 having an outer surface b0, a circuit unit D1, a plurality of first pad portions p21, a plurality of second pad portions p22, a plurality of first lead wires L21*a* and a plurality of second lead wires L22*a*. The plurality of first and second pad portions p21 and p22 and the plurality of first and second lead wires L21*a* and L22*a* form a card contact unit D2*a*.

The circuit unit D1 is disposed on the card body B2. The plurality of first pad portions p21 disposed on the outer surface b0 of the card body B2 are coupled to the circuit unit D1 via the plurality of first lead wires L21*a*. The plurality of second pad portions p22 disposed next to the plurality of first pad portions p21 are coupled to the circuit unit D1 via the plurality of second lead wires L22*a*. In this embodiment, the amount of the plurality of first pad portions p21 is four, the amount of the plurality of second pad portions p22 is five, the plurality of first and second lead wires L21*a* and L22*a* are made of conductive material, and the circuit unit D1 is a chip.

Figure 5A:
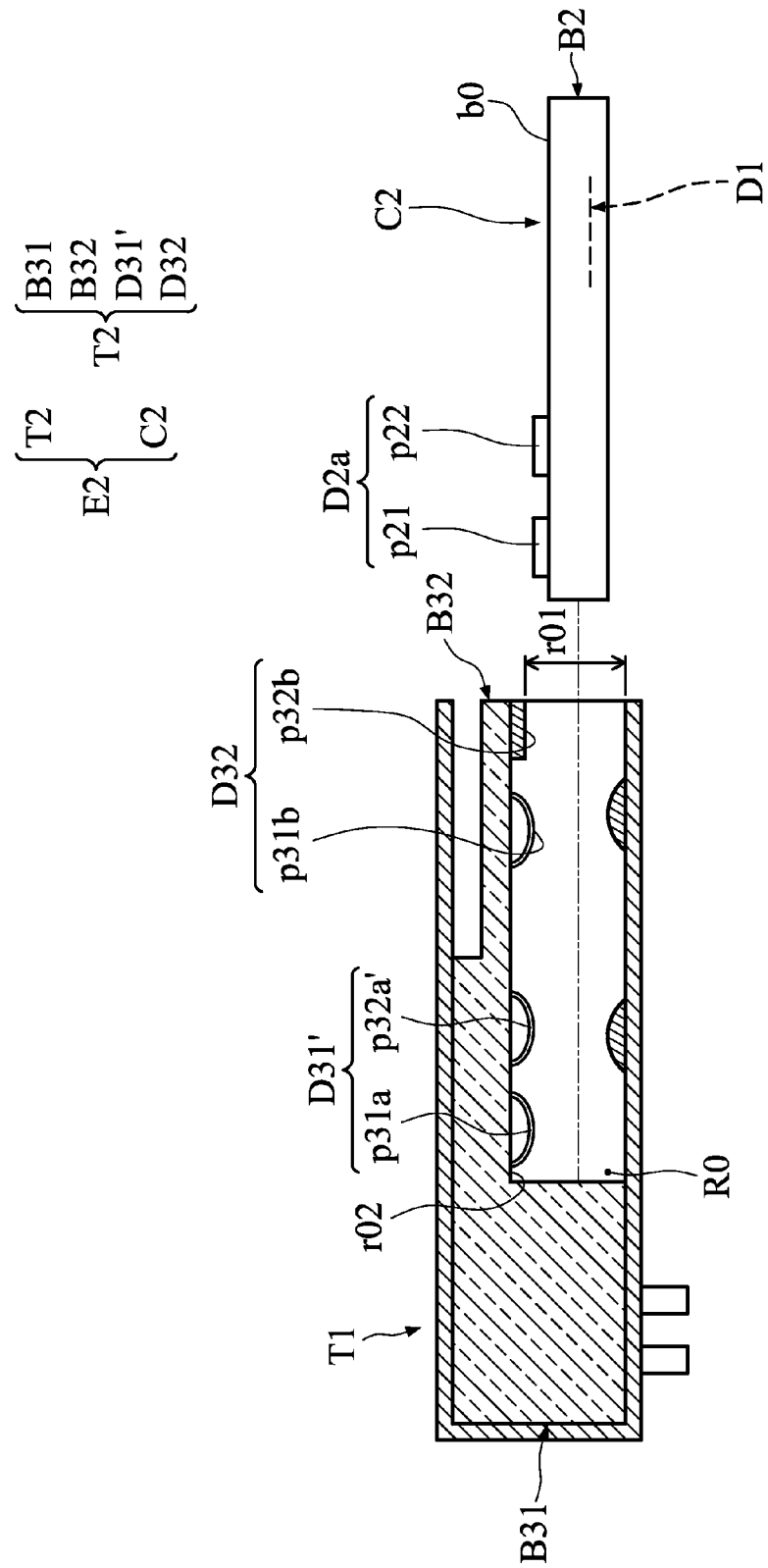
FIG. 5A is an exploded view of an assembly structure of a fourth embodiment of the disclosure.
Figure 5B:
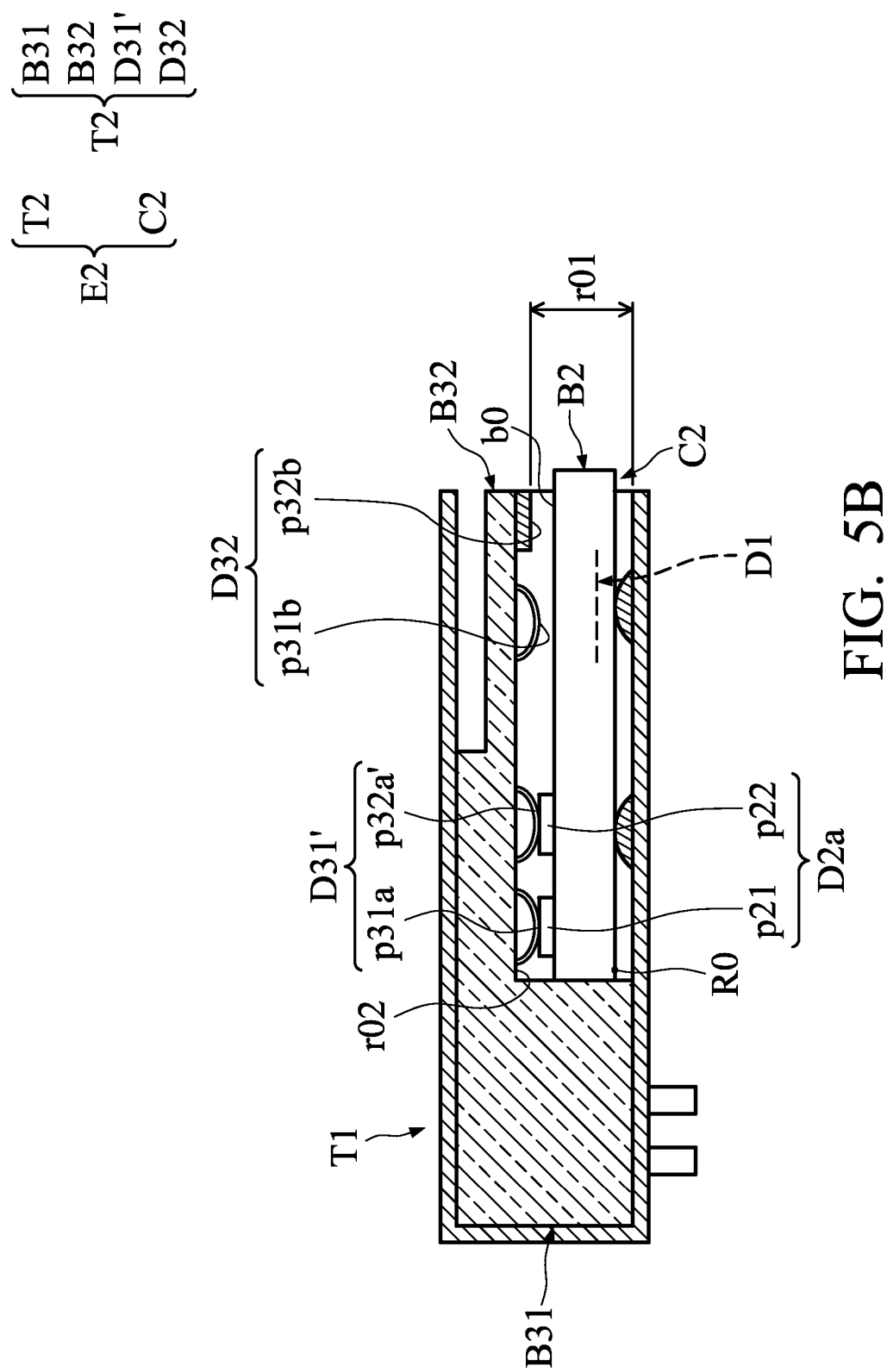
FIG. 5B is an assembled view of the assembly structure of FIG. 5A.

FIG. 5A is an exploded view of an assembly structure E2 of a fourth embodiment, and FIG. 5B is an assembled view of the assembly structure E2 of FIG. 5A.

In FIG. 5A, the assembly structure E2 comprises a socket structure T2 and the card structure C2 mentioned above. The detail description of the card structure C2 is therefore omitted hereinafter.

The socket structure T2 comprises a socket body B31, a positioning portion B32, a first socket contact units D31' and a second socket contact unit D32. Two socket contact units D31' and D32 are referred to a first contact unit and a second contact unit, respectively.

The socket body B31 of the socket structure T1 comprises a slot R0 having an opening r01 and a sidewall surface r02 connected to the opening r01. The positioning portion B32 is extended from the socket body B31 to form the opening r01 and the sidewall surface r02 of the slot R0 of the socket body B31. In this embodiment, the positioning portion B32 is a cantilevered portion.

The first contact unit D31' comprises a plurality of first contact portions p31a and a plurality of second contact portions p32a', and the second contact unit D32 comprises a plurality of third contact portions p31b and a plurality of fourth contact portions p32b. The plurality of first and second contact portions p31a and p32a' of the first contact unit D31' as well as the plurality of third and fourth contact portions p31b and p32b of the second contact unit D32 are protruded from the sidewall surface r02 of the slot R0 of the socket body B31, wherein the plurality of third contact portions p31b of the second contact unit D32 are closer to the opening r01 of the slot R0 of the socket body B31 than the plurality of first and second contact portions p31a and p32a' of the first contact unit D31', and the plurality of fourth contact portions p32b of the second contact unit D32 are closer to the opening r01 of the slot R0 of the socket body B31 than the plurality of third contact portions p31b of the second contact unit D32. In this embodiment, the plurality of first and second contact portions p31a and p32a' of the first contact unit D31' and the plurality of third contact portions p31b of the second contact unit D32 are conductive elastic plates or reeds, and the plurality of fourth contact portions p32b of the second contact unit D32 are conductive pad portions. To briefly describe the structure of the assembly structure E2, the plurality of first and second contact portions p31a and p32a' of the first contact unit D31' are referred as a plurality of first and second elastic plates.

In FIG. 5B, when the card structure C2 is inserted into the slot R0 of the socket body B31 of the socket structure T2 via the opening r01 thereof, the plurality of first and second pad portions p21 and p22 of the card structure C2 are contacted by the plurality of first and second elastic plates p31a and p32a' of the first contact unit D31' of the socket structure T2, respectively, such that electrical connections of the card structure C2 and the socket structure T2 are built.

The plurality of third and fourth contact portions p31b and p32b of the second contact unit D32 of the socket structure T2 are provided for the use of conventional plugs (not shown in FIGs.) for USB 2.0 specification. That is, when the conventional USB 2.0 plug is inserted into the slot R0 of the socket body B31 of the socket structure T2 via the opening r01 thereof, the conventional USB 2.0 plug is contacted by and electrically connected to the plurality of third and fourth contact portions p31b and p32b of the second contact unit D32 of the socket structure T2, and the conventional USB 2.0 plug therefore can be positioned by the socket body B31 and the positioning portion B32 of the socket structure T2.

Figure 6A:
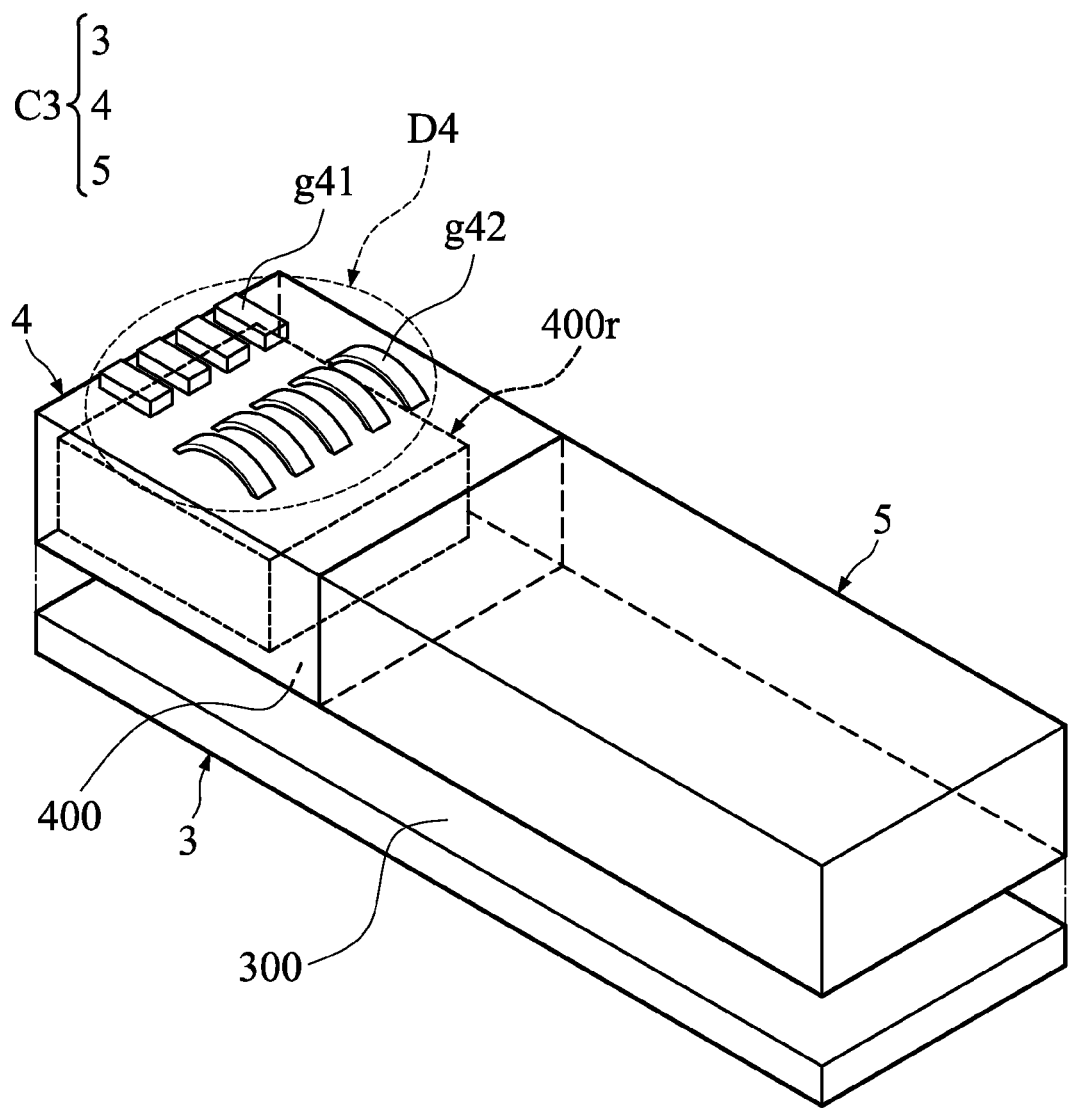
FIG. 6A is an exploded view of a card structure of a fifth embodiment of the disclosure.
Figure 6B:
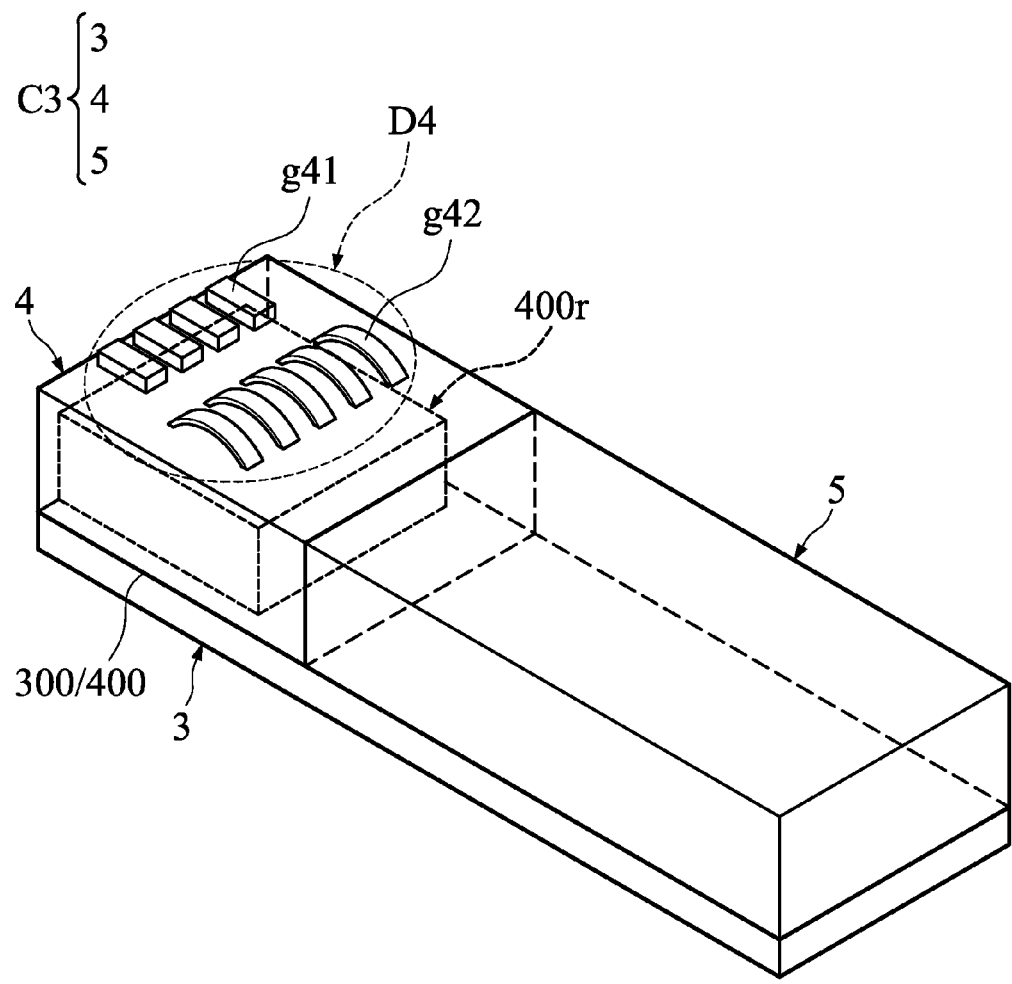
FIG. 6B is an assembled view of the card structure of FIG. 6A.
Figure 7A:
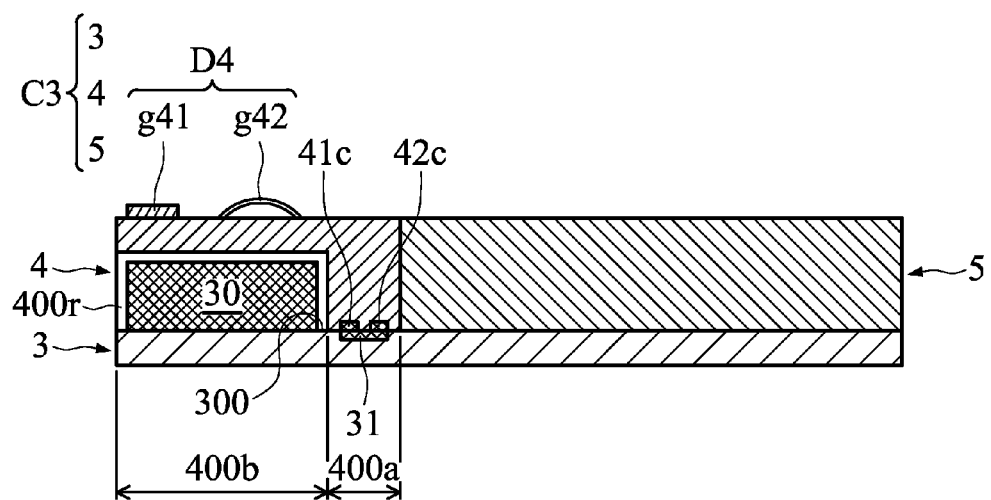
FIG. 7A is a side view of the card structure of FIG. 6B.
Figure 7B:
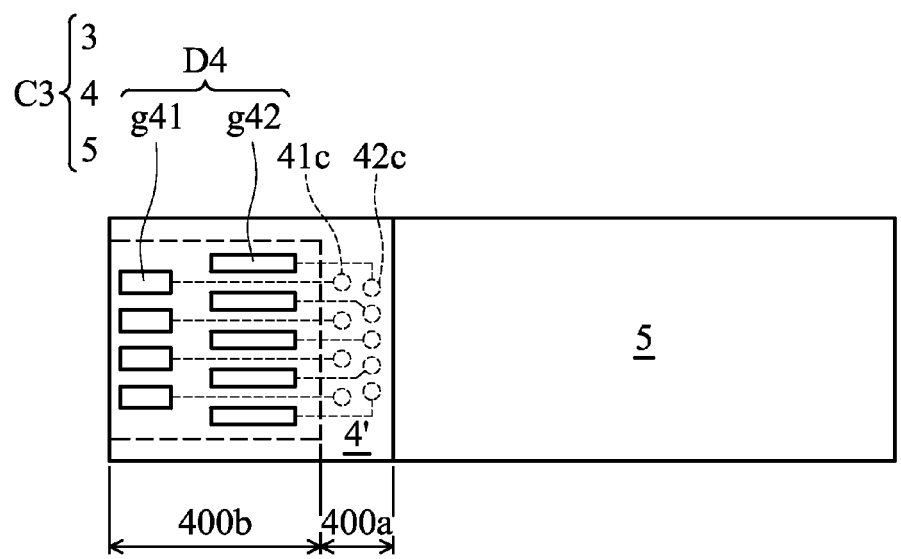
FIG. 7B is a top view of the card structure of FIG. 6B.

FIG. 6A is an exploded view of a card structure C3 of a fifth embodiment, and FIG. 6B is an assembled view of the card structure C3 of FIG. 6A. FIG. 7A is a side view of the card structure C3 of FIG. 6B, and FIG. 7B is a top view of the card structure C3 of FIG. 6B. In this embodiment, the card structure C3 is a slim memory card structure for USB 3.0 specifications.

As shown in FIGS. 6A-6B and 7A-7B, the card structure C3 comprises a first substrate 3, a connector 4 and a second substrate 5.

The first substrate 3 comprises a base surface 300, an electronic part region 30 disposed on the base surface 300 (shown in FIG. 7A), and a terminal region 31 disposed on the base surface 300 (shown in FIG. 7A). In this embodiment, the first substrate 3 is a circuit unit.

The second substrate 5 disposed on the base surface 300 of the first substrate 3 is coupled to the terminal region 31 of the first substrate 3. In this embodiment, the second substrate 5 is a chip on board (COB) device.

The connector 4 juxtaposed to the second substrate 5 is disposed on the base surface 300 of the first substrate 3. The connector 4 comprises a connecting surface 400, a contact unit D4, a plurality of contact regions 41c and 42c disposed on the connecting surface 400 and coupled to the contact unit D4, and a receiving portion 400r disposed on the connecting surface 400. The contact unit D4 comprises a plurality of first contact portions g41 and a plurality of second contact portions g42 which are coupled to the plurality of contact regions 41c and 42c.

The connecting surface 400 of the connector 4 is substantially a similar U-shaped connecting surface formed by a first segment 400a and two second segments 400b, wherein the two second segments 400b are parallel to each other and joined with the first segment 400a, the first segment 400a is substantially located between the two second segments 400b and the second substrate 5 (shown in FIG. 7B) (or a U-shaped opening of the similar U-shaped first segment 400a) is faced backward the second substrate 5, and the plurality of contact regions 41c and 42c are disposed on the similar U-shaped first segment 400a of the connecting surface 400. In this embodiment, the receiving portion 400r is a recessed portion, the plurality of first contact portions g41 of the contact unit D4 are pad portions made of conductive material, and the plurality of second contact portions g42 of the contact unit D4 are conductive elastic plates or reeds.

When the connecting surface 400 of the connector 4 is connected to the base surface 300 of the first substrate 3, the connector 4 covers and receives the electronic part region 30 disposed on the base surface 300 of the first substrate 3 therein by the receiving portion 400r thereof, and the plurality of contact regions 41c and 42c of the connector 4 are coupled to the terminal region 31 of the first substrate 3, such that the plurality of contact regions 41c and 42c of the connector 4 can be coupled to the second substrate 5 via the terminal region 31 of the first substrate 3.

Figure 8A:
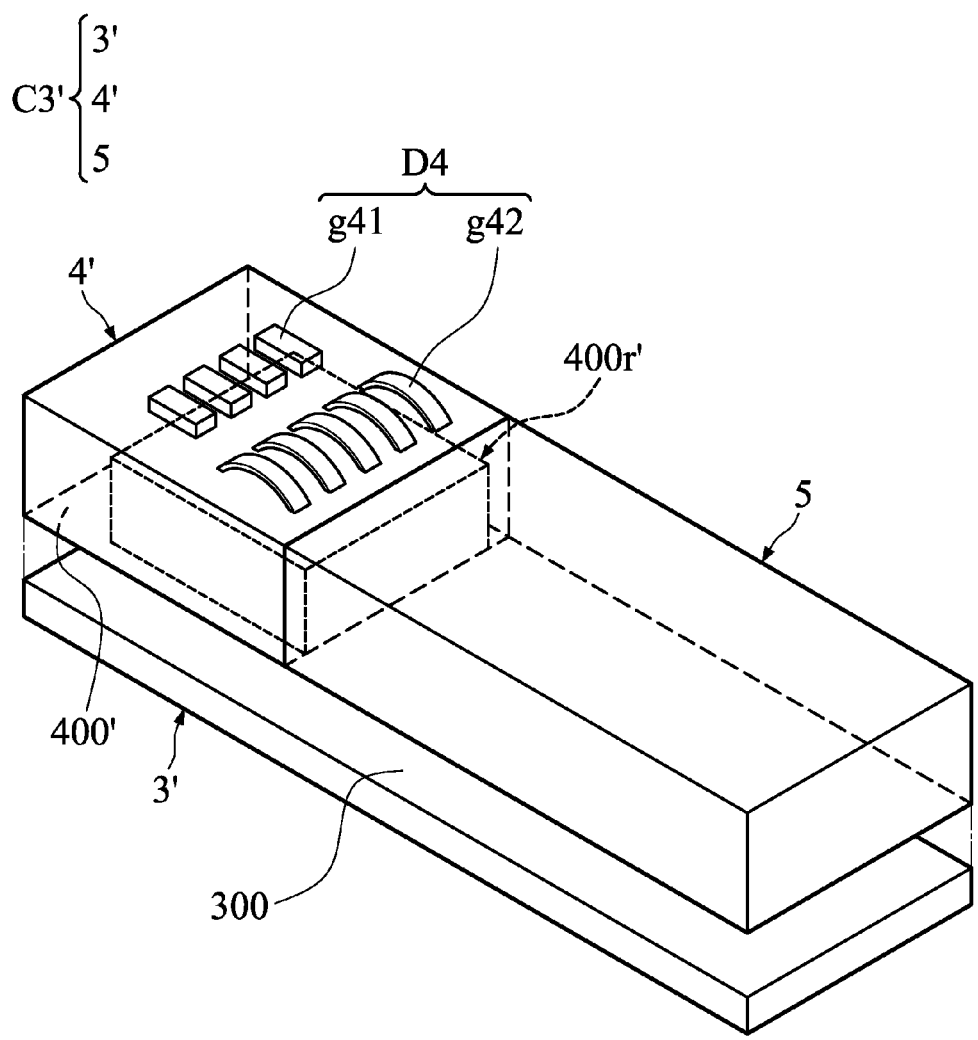
FIG. 8A is an exploded view of a card structure of a sixth embodiment of the disclosure.
Figure 8B:
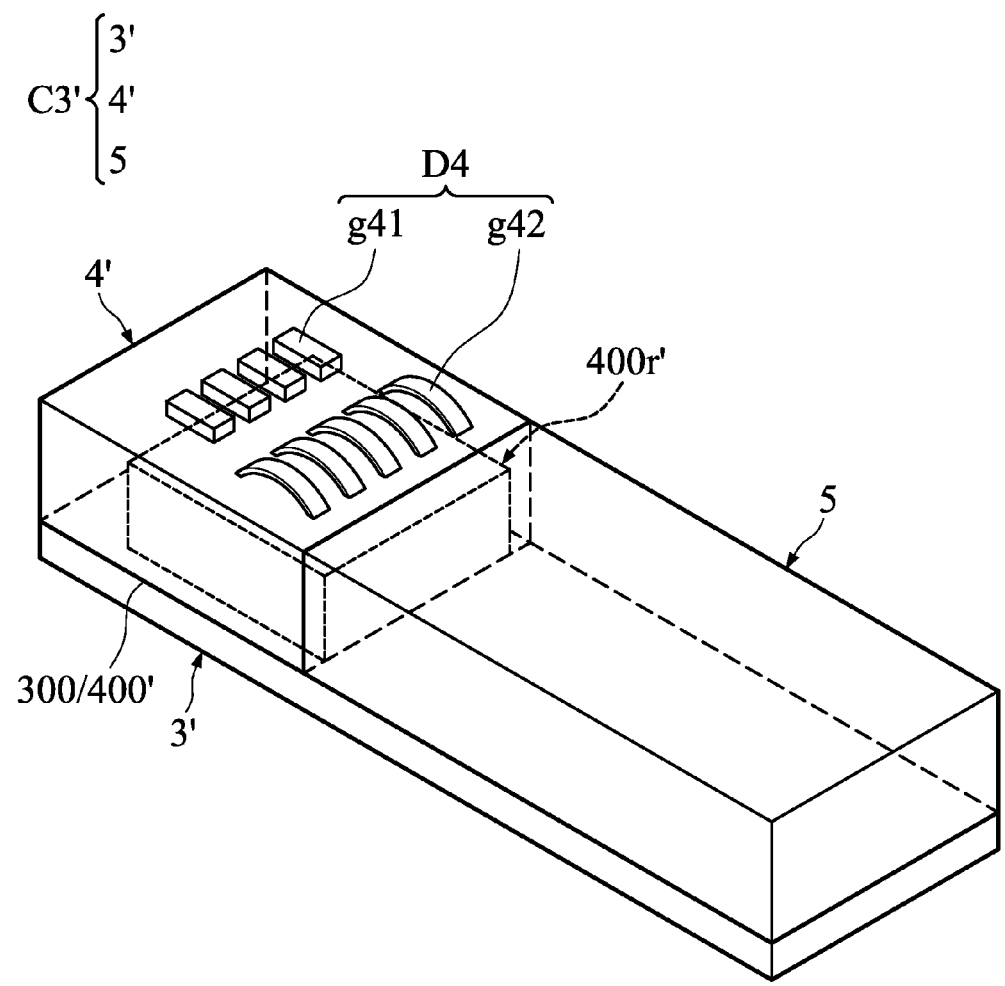
FIG. 8B is an assembled view of the card structure of FIG. 8A.
Figure 9A:
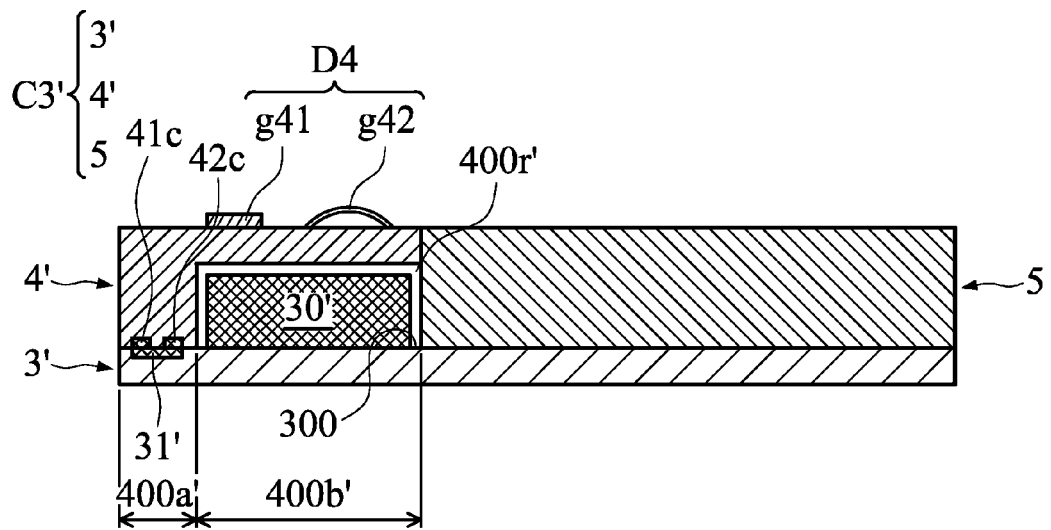
FIG. 9A is a side view of the card structure of FIG. 8B.
Figure 9B:
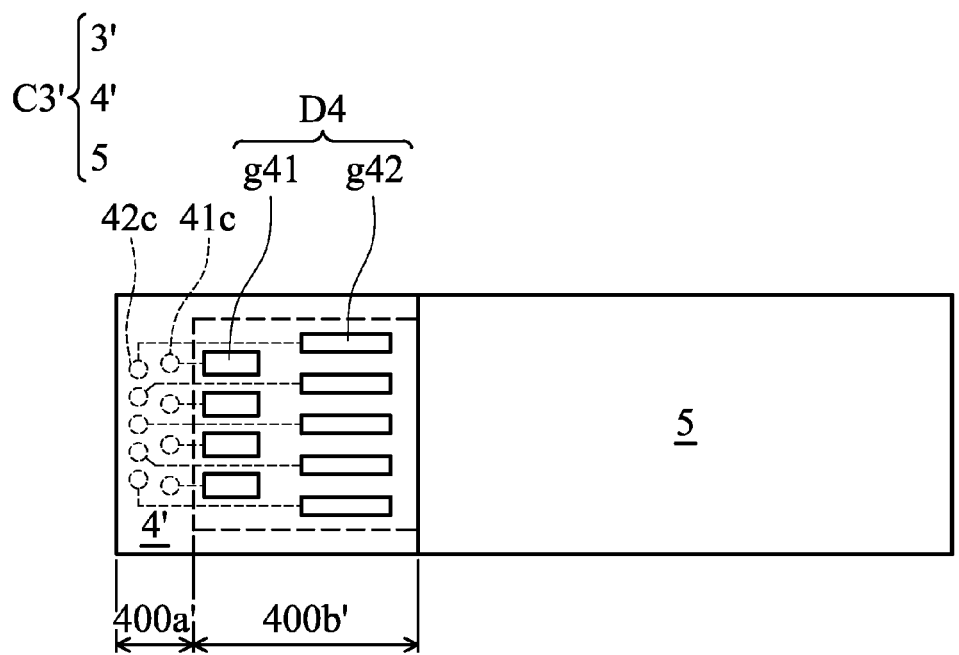
FIG. 9B is a top view of the card structure of FIG. 8B.

FIG. 8A is an exploded view of a card structure C3' of a sixth embodiment, and FIG. 8B is an assembled view of the card structure C3' of FIG. 8A. FIG. 9A is a side view of the card structure C3' of FIG. 8B, and FIG. 9B is a top view of the card structure C3' of FIG. 8B. In this embodiment, the card structure C3' is a slim memory card structure for USB 3.0 specifications.

In FIGS. 8A-8B and 9A-9B, the card structure C3' of the sixth embodiment comprises a first substrate 3', a connector 4', and the second substrate 5 mentioned above. The major difference between the card structure C3' of the sixth embodiment and the card structure C3 of the fifth embodiment is that the connector 4' provides a receiving portion 400r' with a structure different from that of the receiving portion 400r of the connector 4. The detail description of the second substrate 5 is therefore omitted hereinafter.

The first substrate 3' comprises a base surface 300, an electronic part region 30' disposed on the base surface 300' (shown in FIG. 9A), and a terminal region 31' disposed on the base surface 300' (shown in FIG. 9A).

The connector 4' comprises a connecting surface 400', a contact unit D4, a plurality of contact regions 41c and 42c disposed on the connecting surface 400' and coupled to the contact unit D4, and a receiving portion 400r' disposed on the connecting surface 400. The contact unit D4 comprises a plurality of first contact portions g41 and a plurality of second contact portions g42 which are coupled to the plurality of contact regions 41c and 42c.

The connecting surface 400' of the connector 4' is substantially a similar U-shaped connecting surface formed by a first segment 400a' and two second segments 400b', wherein the two second segments 400b' are parallel to each other and joined with the first segment 400a', two second segments 400b' are substantially located between the first segment 400a' and the second substrate 5 (shown in FIG. 9B) (or a U-shaped opening of the similar U-shaped first segment 400a' is faced toward the second substrate 5), and the plurality of contact regions 41c and 42c are disposed on the similar U-shaped first segment 400a' of the connecting surface 400'.

When the connecting surface 400' of the connector 4' is connected to the base surface 300 of the first substrate 3', the connector 4' covers and receives the electronic part region 30' disposed on the base surface 300' of the first substrate 3' therein by the receiving portion 400r' thereof, and the plurality of contact regions 41c and 42c of the connector 4' are coupled to the terminal region 31' of the first substrate 3', such that the plurality of contact regions 41c and 42c of the connector 4' can be coupled to the second substrate 5 via the terminal region 31' of the first substrate 3'.

Figure 10A:
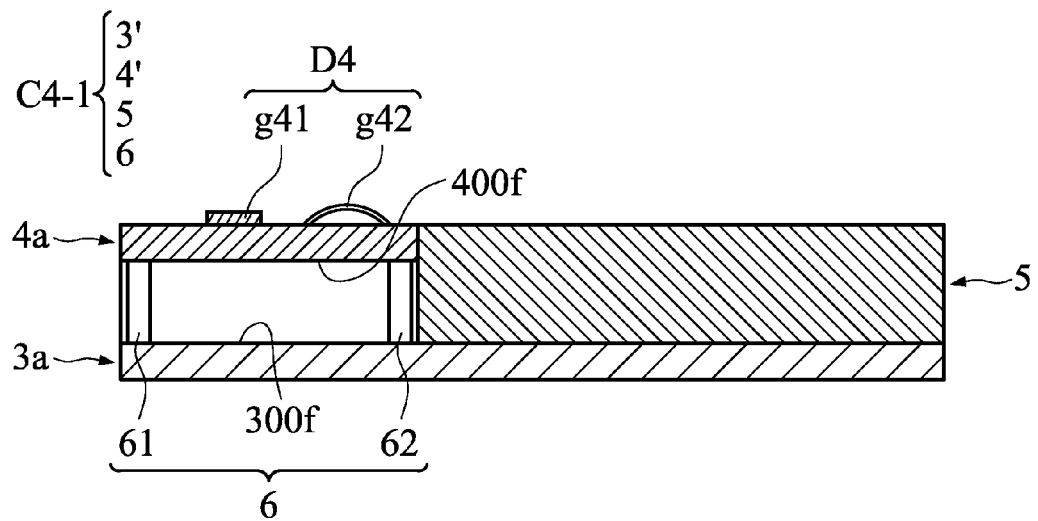
FIG. 10A is a schematic view of a card structure of a seventh embodiment of the disclosure.
Figure 10B:
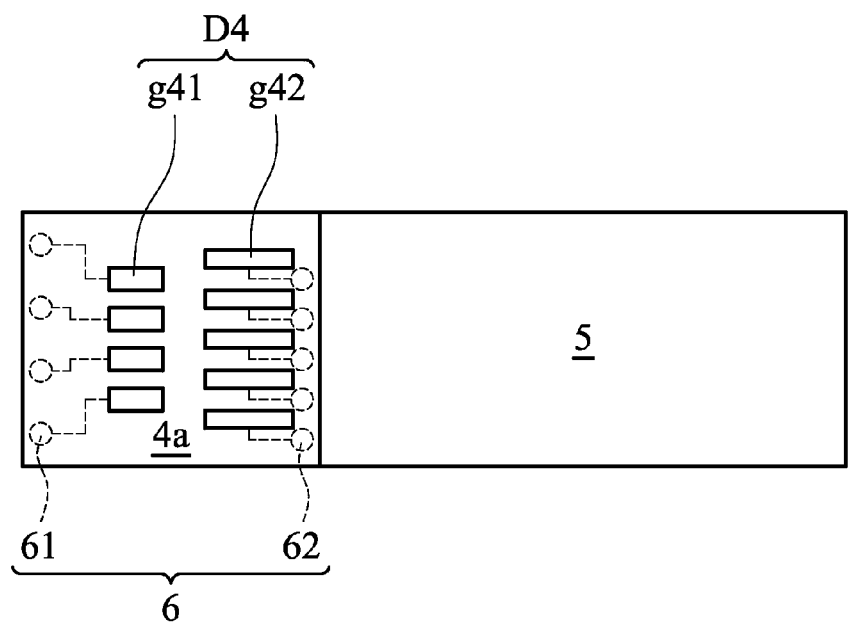
FIG. 10B is a top view of the card structure of FIG. 10A.

FIG. 10A is a schematic view of a card structure C4-1 of a seventh embodiment, and FIG. 10B is a top view of the card structure C4-1 of FIG. 10A. In this embodiment, the card structure C4-1 is a slim memory card structure for USB 3.0 specifications.

In FIGS. 10A and 10B, the card structure C4-1 comprises a first substrate 3a having a base surface 300f, a connector 4a, a second substrate 5, and an intermediate unit 6 having a plurality of connecting portions 61 and 62. In this embodiment, the first substrate 3a is a circuit unit.

The second substrate 5 disposed on the base surface 300f of the first substrate 3a is coupled to the first substrate 3a. In this embodiment, the second substrate 5 is a chip on board (COB) device.

The connector 4a comprises a connecting surface 400f and a contact unit D4. The contact unit D4 comprises a plurality of first contact portions g41 and a plurality of second contact portions g42. The connector 4a, juxtaposed to the second substrate 5 and disposed on the base surface 300f of the first substrate 3a, is supported by the plurality of connecting portions 61 and 62 of the intermediate unit 6, and the plurality of first and second contact portions g41 and g42 of the contact unit D4 of the connector 4a are coupled to the first substrate 3a via the plurality of connecting portions 61 and 62 of the intermediate unit 6. In this embodiment, the plurality of first contact portions g41 of the contact unit D4 are pad portions made of conductive material, the plurality of second contact portions g42 of the contact unit D4 are conductive elastic plates or reeds, and the plurality of connecting portions 61 and 62 of the intermediate unit 6 are conductive cylindrical structures.

Figure 11A:
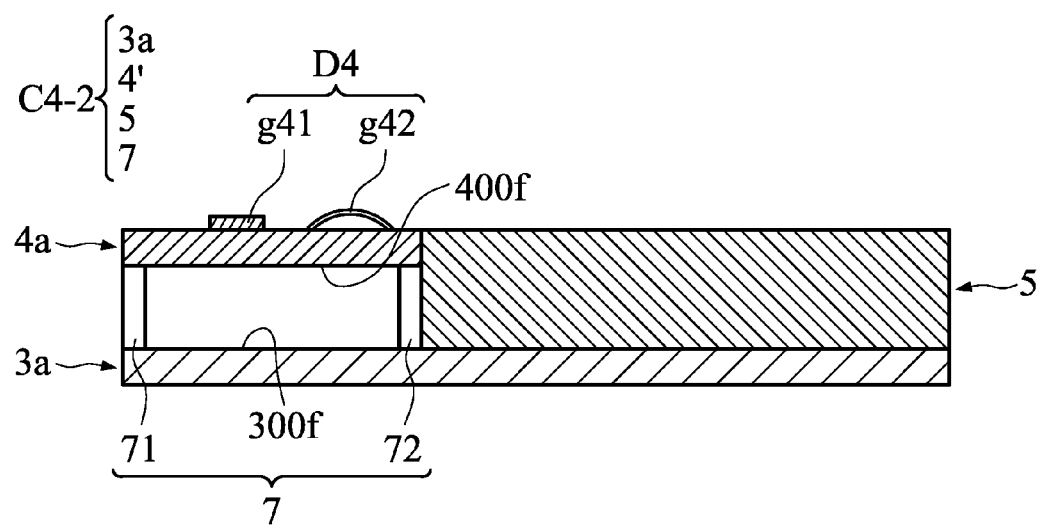
FIG. 11A is a schematic view of a card structure of an eighth embodiment of the disclosure.
Figure 11B:
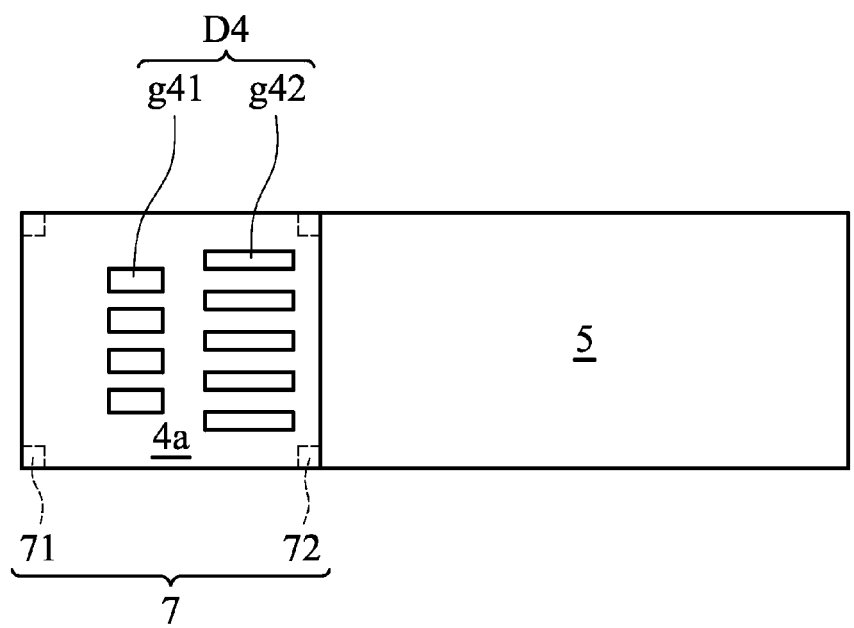
FIG. 11B is a top view of the card structure of FIG. 11A.

FIG. 11A is a schematic view of a card structure C4-2 of an eighth embodiment, and FIG. 11B is a top view of the card structure C4-2 of FIG. 11A. In this embodiment, the card structure C4-2 is a slim memory card structure for USB 3.0 specifications.

In FIGS. 11A and 11B, the card structure C4-2 comprises a first substrate 3a, a connector 4a, a second substrate 5, and an intermediate unit 7 having a plurality of connecting portions 71 and 72. The first substrate 3a, the connector 4a and the second substrate 5 are the same as the elements of the card structure C4-1 of the seventh embodiment, and therefore the detail description for these elements are omitted hereinafter.

The major difference between the card structure C4-2 of the eighth embodiment and the card structure C4-1 of the seventh embodiment in that the plurality of connecting portions 71 and 72 of the intermediate unit 7 are only utilized as non-conductive supporting structures disposed between the first substrate 3a and the connector 4a, and the first substrate 3a and the connector 4a are electrically connected to each other by the same method as that applied to the card structure C3 of the fifth embodiment of FIG. 7A or the card structure C3' of the sixth embodiment of FIG. 9A (not shown in FIGS. 11A and 11B).

Figure 12A:
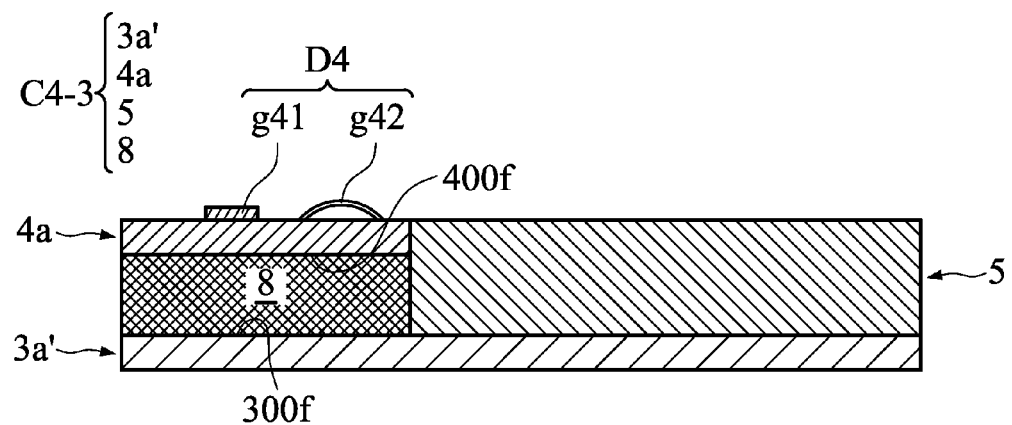
FIG. 12A is a schematic view of a card structure of a ninth embodiment of the disclosure.
Figure 12B:
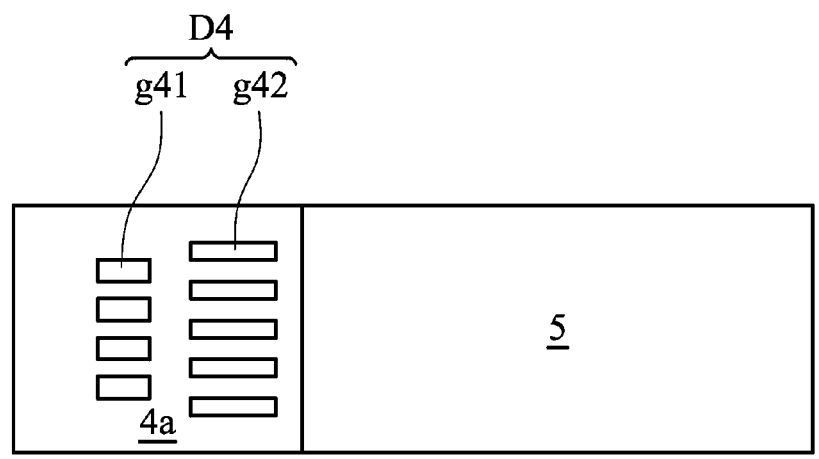
FIG. 12B is a top view of the card structure of FIG. 12A.

FIG. 12A is a schematic view of a card structure C4-3 of a ninth embodiment, and FIG. 12B is a top view of the card structure C4-3 of FIG. 12A. In this embodiment, the card structure C4-3 is a slim memory card structure for USB 3.0 specifications.

In FIGS. 12A and 12B, the card structure C4-3 comprises a first substrate 3a' having a base surface 300f, a connector 4a, a second substrate 5, and an intermediate unit 8. The connector 4a and the second substrate 5 are the same as the elements of the card structure C4-2 of the eighth embodiment, and therefore the detail description for these elements are omitted hereinafter.

The major difference between the card structure C4-3 of the ninth embodiment and the card structure C4-2 of the eighth embodiment in that the intermediate unit 8 of the card structure C4-3 is integrally formed with the first substrate 3a' and protruded from the base surface 300f of the first substrate 3a', the connector 4a juxtaposed to the second substrate 5 and disposed on the first substrate 3a' is directly supported by the intermediate unit 8, and the connector 4a is selectively coupled to the first substrate 3a' via the intermediate unit 8. In this embodiment, the intermediate unit 8 is an electrical part integrally formed with the first substrate 3a'. In other possible embodiments (not shown in FIGs.), with the different sizes of the intermediate units 8, the first substrate 3a' and the connector 4a are electrically connected to each other by the same method as that applied to the card structure C3 of the fifth embodiment of FIG. 7A or the card structure C3' of the sixth embodiment of FIG. 9A.

Figure 13A:
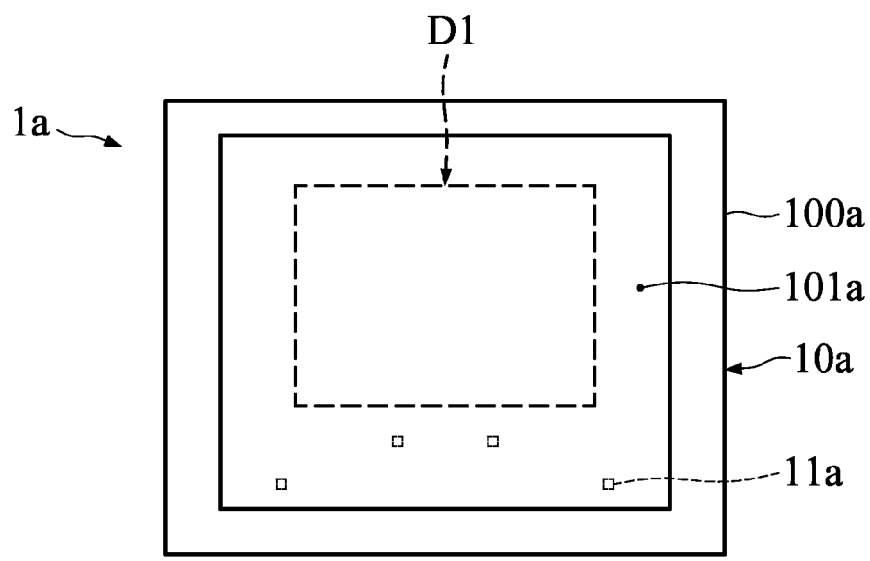
FIG. 13A is a schematic view of a first element of a card structure of a tenth embodiment of the disclosure.
Figure 13B:
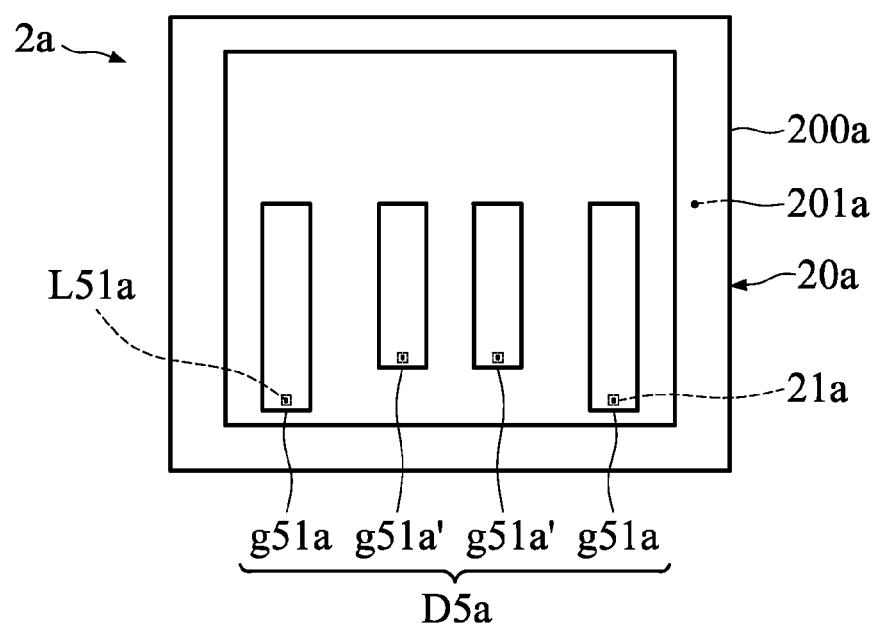
FIG. 13B is a schematic view of a second element of the card structure of the tenth embodiment of the disclosure.
Figure 13C:
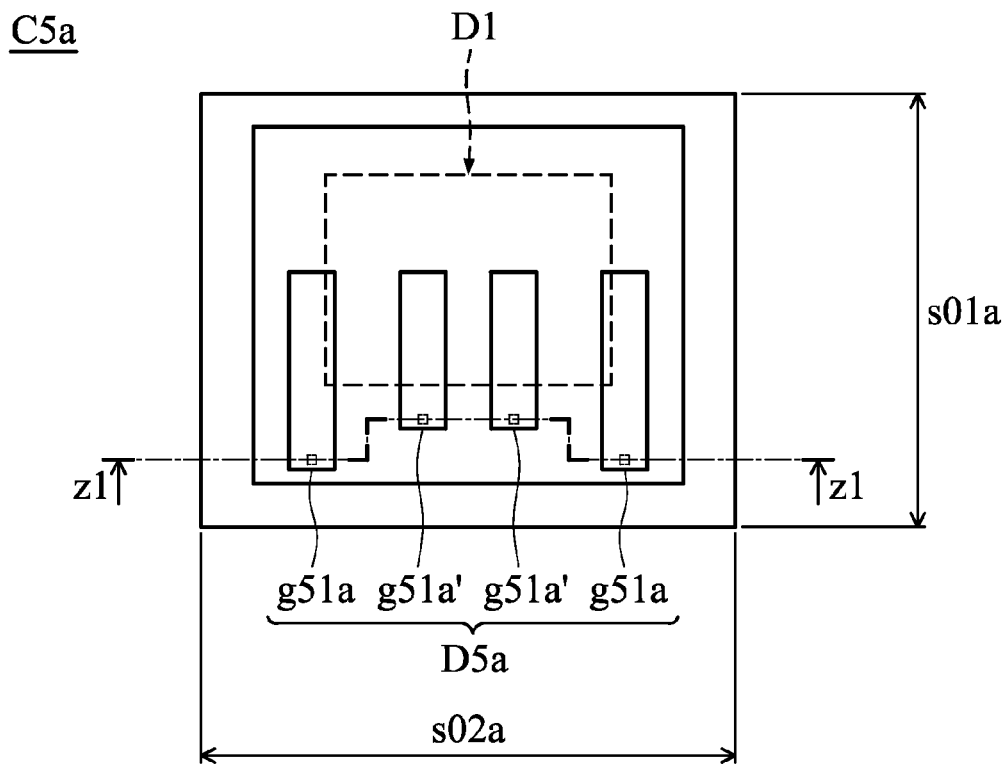
FIG. 13C is a schematic view of the assembled first and second elements of the card structure of the tenth embodiment of the disclosure.
Figure 13D:
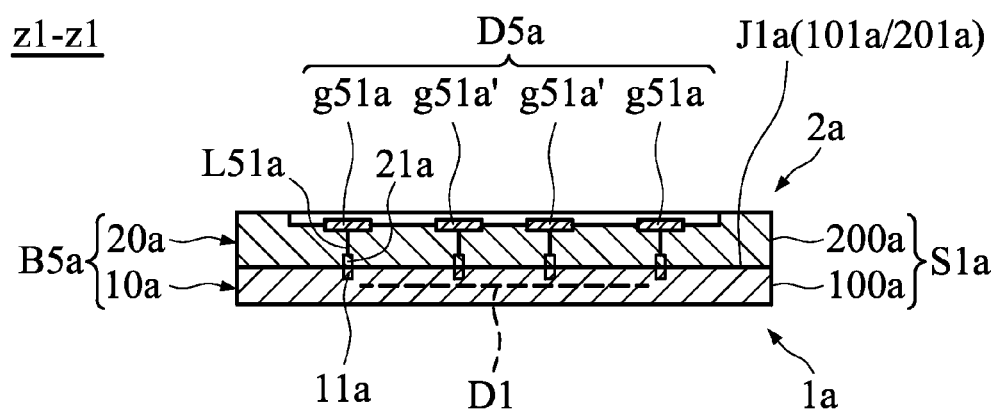
FIG. 13D is a sectional view of the card structure along line (z1-z1) of FIG. 13C.

FIG. 13A is a schematic view of a first element 1a of a card structure C5a of a tenth embodiment, FIG. 13B is a schematic view of a second element 2a of the card structure C5a of the tenth embodiment, FIG. 13C is a schematic view of the assembled first and second element 1a and 2a of the card structure C5a of the tenth embodiment, and FIG. 13D is a sectional view of the card structure C5a along line z1-z1 of FIG. 13C. In this embodiment, the card structure C5a is a 4-pin slim memory card structure for USB 2.0 specifications.

In FIGS. 13A, 13B, 13C and 13D, the card structure C5a comprises the first element 1a, the second element 2a, a circuit unit D1 and a card contact unit D5a. In this embodiment, the first element 1a and the circuit unit D1 form a chip on board (COB) device or an electronic circuit, and the second element 2a and the card contact unit D5a form a connector.

In FIG. 13A, the first element 1a has a rectangular structure comprising a first body 10a, a plurality of first contact points 11a, a first join portion 101a and a first peripheral portion 100a. The first join portion 101a is a surface of the first body 10a, and the first peripheral portion 100a is a peripheral surface of the first body 10a which is located at an outer circumference of the first join portion 101a. The circuit unit D1 can be disposed on or inside of the first body 10a of the first element 1a. The plurality of first contact points 11a exposed by the first join portion 101a are coupled to the circuit unit D1 via lead wires (not shown in FIGs.).

In FIG. 13B, the second element 2a has a rectangular structure comprising a second body 20a, a plurality of second contact points 21a, a second join portion 201a and a second peripheral portion 200a. The second join portion 201a is a surface of the second body 20a to join the first join portion 101a of the first element 1a, and the second peripheral portion 200a is a peripheral surface of the second body 20a which is located an outer circumference of the second join portion 201a. The plurality of second contact points 21a of the second element 2a, corresponding to the plurality of first contact points 11a of the first element 1a, are exposed by the second join portion 201a thereof. The first body 10a of the first element 1a and the second body 20a of the second element 2a form a card body B5a of the card structure C5a.

In FIGS. 13B, 13C and 13D, the card contact unit D5a comprises a plurality of contact portions g51a and g51a' and a plurality of lead wires L51a (shown in FIG. 13D). The plurality of contact portions g51a and g51a' exposed by the second body 20a of the second element 2a are coupled to the plurality of second contact points 21a of the second element 2a via the plurality of lead wires L51a. In this embodiment, the amount of the plurality of contact portions g51a is two, the amount of the plurality of contact portions g51a' is two, the plurality of contact portions g51a and g51a' are rectangular conductive pad portions, and the length of the plurality of contact portions g51a is greater than that of the plurality of contact portions g51a'.

In FIGS. 13C and 13D, when the first join portion 101a of the first element 1a and the second join portion 201a of the second element 2a are joined with each other, the first peripheral portion 100a of the first element 1a and the second peripheral portion 200a of the second element 2a are connectively adjacent to each other to form a common region J1a therebetween and a combined peripheral portion S1a, and the plurality of first contact points 11a of the first element 1a are respectively coupled to the plurality of second contact points 21a of the second element 2a, thereby forming the card structure C5a.

With respect to the combined peripheral portion S1a formed by the adjacency of the first peripheral portion 100a of the first element 1a and the second peripheral portion 200a of the second element 2a, it is noted that the combined peripheral portion S1a comprises a pair of first sections s01a and a pair of second sections s02a, and the length of the pair of second sections s02a is minimized according to the arrangement of the plurality of contact portions g51a and g51a' of the card contact unit D5a. In this embodiment, the length of the first sections s01a is approximately equal to or less than that of the second sections s02a.

Figure 13E:
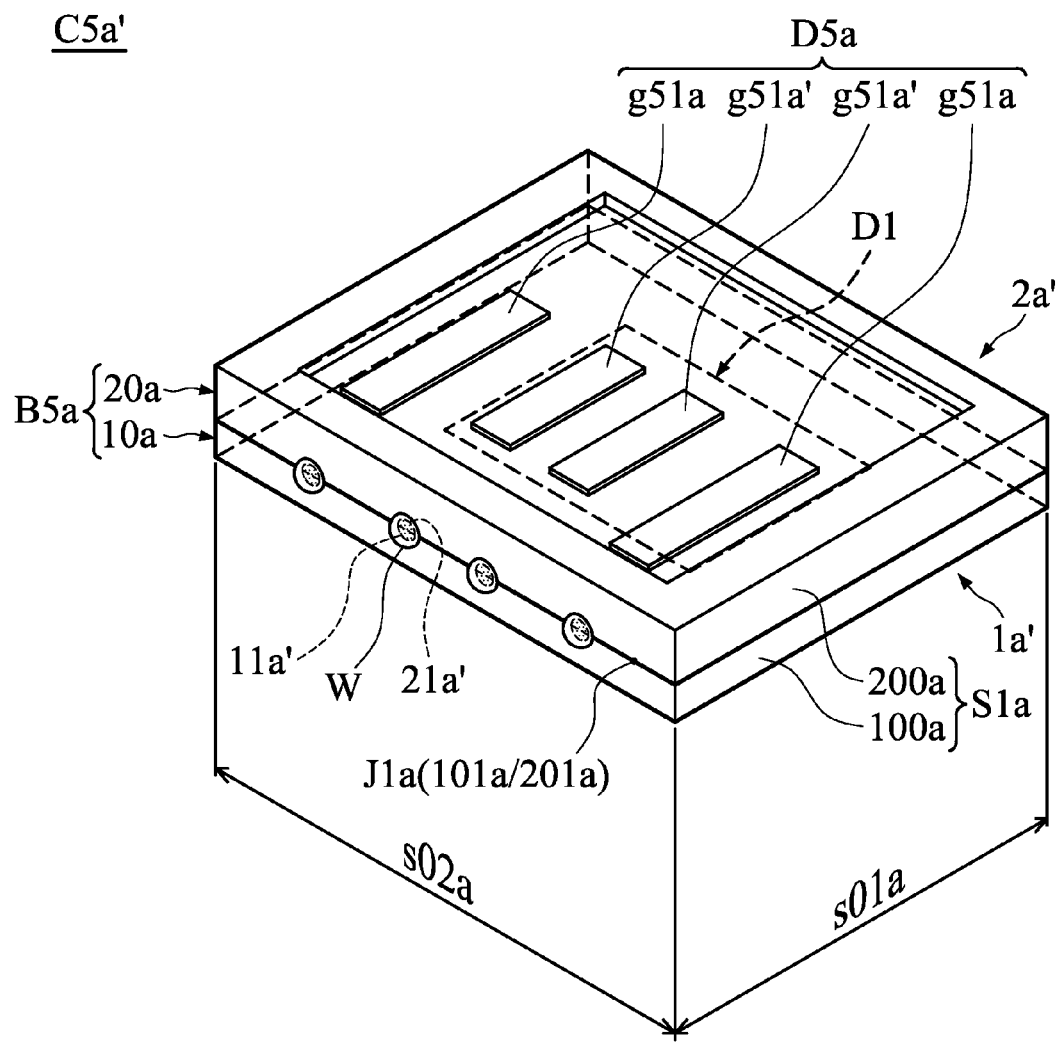
FIG. 13E is a schematic view of a variation example according to the card structure of the tenth embodiment of the disclosure.

FIG. 13E is a schematic view of a variation example according to the card structure C5a of the tenth embodiment. A card structure C5a' of the variation example differs from the card structure C5a of the tenth embodiment in that the plurality of first contact points 11a' of the first element 1a' and the plurality of second contact points 21a' of the second element 2a' are corresponded to each other and respectively exposed by the first peripheral portion 100a of the first element 1a' and the second peripheral portion 200a of the second element 2a'. When the first join portion 101a of the first element 1a' and the second join portion 201a of the second element 2a' are joined with each other, a common region J1a is formed therebetween, and the plurality of first contact points 11a' of the first element 1a' and the plurality of second contact points 21a' of the second element 2a' are juxtaposed to each other to be located at the common region J1a. Then, a metallic welding portion W is applied onto each of the juxtaposed first and second contact points 11a' and 21a' of the first and second elements 1a' and 2a', such that electrical connections of the juxtaposed first and second contact points 11a' and 21a' of the first and second elements 1a' and 2a' are built.

Figure 14A:
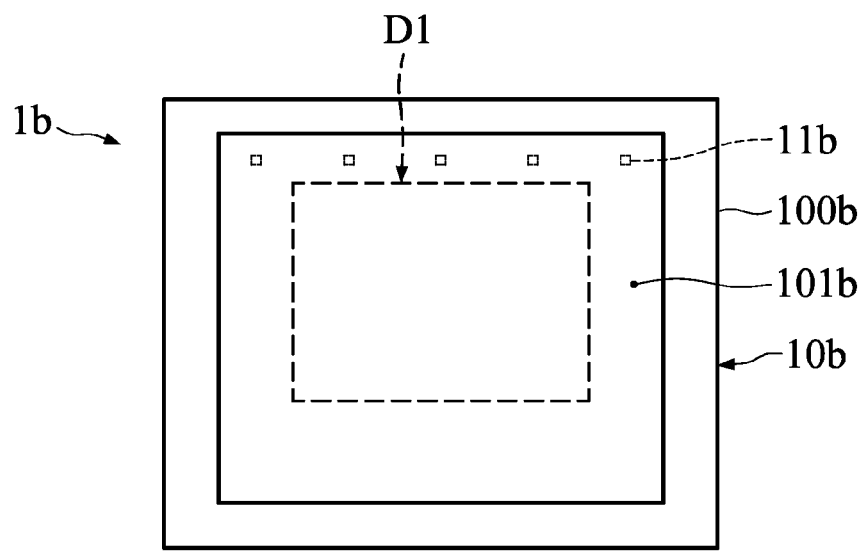
FIG. 14A is a schematic view of a first element of a card structure of an eleventh embodiment of the disclosure.
Figure 14B:
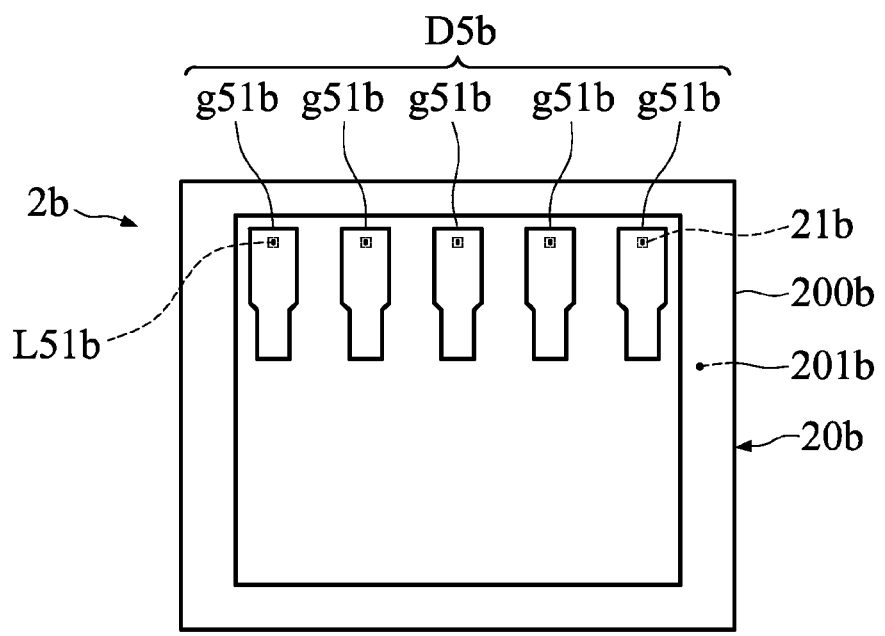
FIG. 14B is a schematic view of a second element of the card structure of the eleventh embodiment of the disclosure.
Figure 14C:
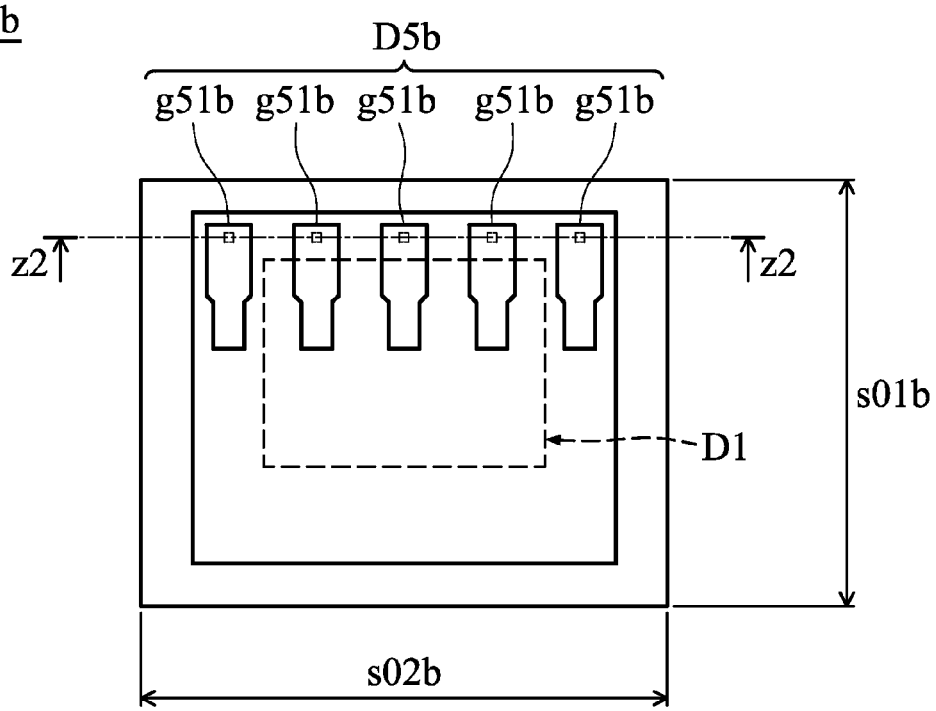
FIG. 14C is a schematic view of the assembled first and second elements of the card structure of the eleventh embodiment of the disclosure.
Figure 14D:
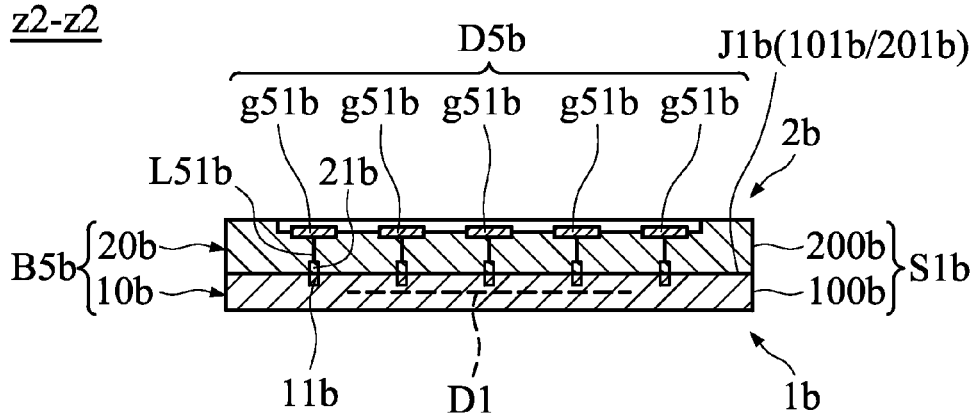
FIG. 14D is a sectional view of the card structure along line (z2-z2) of FIG. 14C.

FIG. 14A is a schematic view of a first element 1b of a card structure C5b of an eleventh embodiment, FIG. 14B is a schematic view of a second element 2b of the card structure C5b of the eleventh embodiment, FIG. 14C is a schematic view of the assembled first and second elements of the card structure C5b of the eleventh embodiment, and FIG. 14D is a sectional view of the card structure C5b along line z2-z2 of FIG. 14C. In this embodiment, the card structure C5b is a 5-pin slim memory card structure for USB 3.0 specifications.

In FIGS. 14A, 14B, 14C and 14D, the card structure C5b comprises the first element 1b, the second element 2b, a circuit unit D1 and a card contact unit D5b. In this embodiment, the first element 1b and the circuit unit D1 form a chip on board COB) device or an electronic circuit, and the second element 2b and the card contact unit D5b form a connector.

In FIG. 14A, the first element 1b has a rectangular structure comprising a first body 10b, a plurality of first contact points 11b, a first join portion 101b and a first peripheral portion 100b. The first join portion 101b is a surface of the first body 10b, and the first peripheral portion 100b is a peripheral surface of the first body 10b which is located at an outer circumference of the first join portion 101b. The circuit unit D1 can be disposed on or inside of the first body 10b of the first element 1b. The plurality of first contact points 11b exposed by the first join portion 101b are coupled to the circuit unit D1 via lead wires (not shown in FIGs.).

In FIG. 14B, the second element 2b has a rectangular structure comprising a second body 20b, a plurality of second contact points 21b, a second join portion 201b and a second peripheral portion 200b. The second join portion 201b is a surface of the second body 20b to join the first join portion 101b of the first element 1b, and the second peripheral portion 200b is a peripheral surface of the second body 20b which is located an outer circumference of the second join portion 201b. The plurality of second contact points 21b of the second element 2b, corresponding to the plurality of first contact points 11b of the first element 1b, are exposed by the second join portion 201b thereof. The first body 10b of the first element 1b and the second body 20b of the second element 2b form a card body B5b of the card structure C5b.

In FIGS. 14B, 14C and 14D, the card contact unit D5b comprises a plurality of contact portions g51b and a plurality of lead wires L51b (shown in FIG. 14D). The plurality of contact portions g51b exposed by the second body 20b of the second element 2b are coupled to the plurality of second contact points 21b of the second element 2b via the plurality of lead wires L51b. In this embodiment, the amount of the plurality of contact portions g51b is five, and the plurality of contact portions g51b are T-shaped conductive pad portions.

In FIGS. 14C and 14D, when the first join portion 101b of the first element 1b and the second join portion 201b of the second element 2b are joined with each other, the first peripheral portion 100b of the first element 1b and the second peripheral portion 200b of the second element 2b are connectively adjacent to each other to form a common region J1b therebetween and a combined peripheral portion S1b, and the plurality of first contact points 11b of the first element 1b are respectively coupled to the plurality of second contact points 21b of the second element 2b, thereby forming the card structure C5b.

With respect to the combined peripheral portion S1b formed by the adjacency of the first peripheral portion 100b of the first element 1b and the second peripheral portion 200b of the second element 2b, it is noted that the combined peripheral portion S1b comprises a pair of first sections s01b and a pair of second sections s02b, and the length of the pair of second sections s02b is minimized according to the arrangement of the plurality of contact portions g51b of the card contact unit D5b. In this embodiment, the length of the first sections s01b is approximately equal to or less than that of the second sections s02b.

Figure 14E:
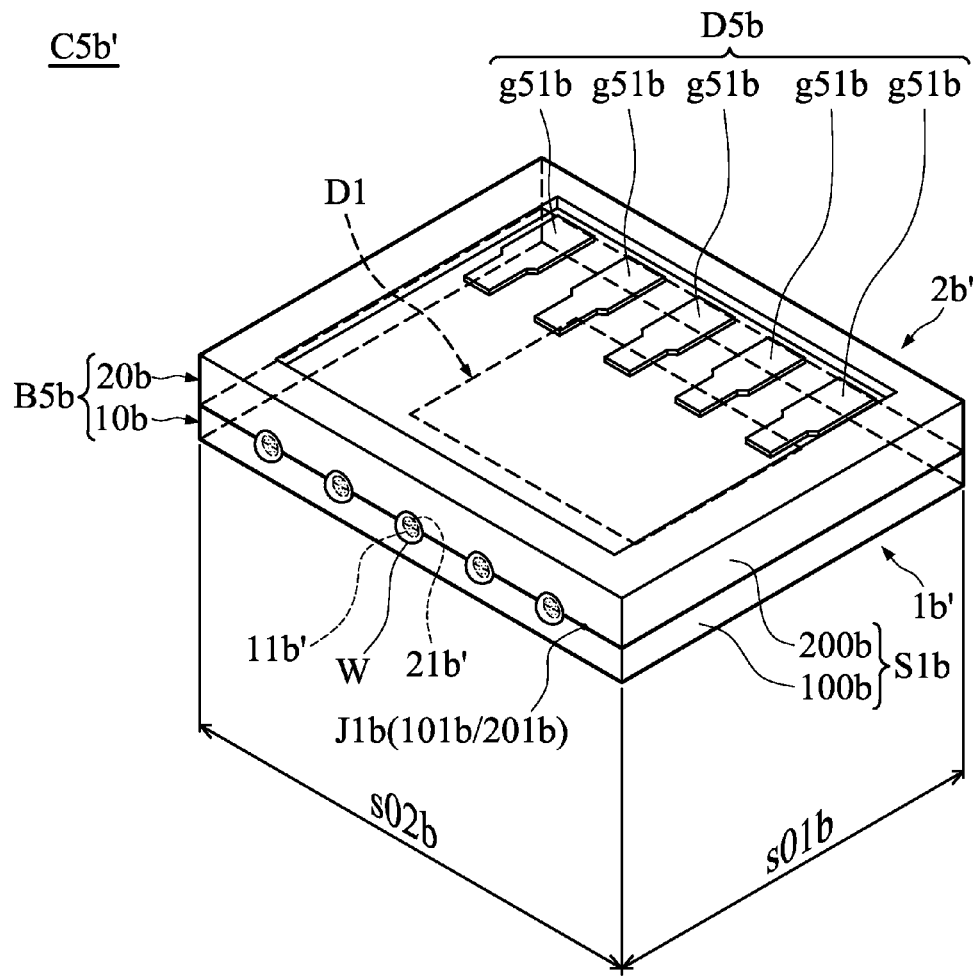
FIG. 14E is a schematic view of a variation example according to the card structure of the eleventh embodiment of the disclosure.

FIG. 14E is a schematic view of a variation example according to the card structure C5b of the eleventh embodiment. A card structure C5b' of the variation example differs from the card structure C5b of the eleventh embodiment in that the plurality of first contact points 11b' of the first element 1b' and the plurality of second contact points 21b' of the second element 2b' are corresponded to each other and respectively exposed by the first peripheral portion 100b of the first element 1b' and the second peripheral portion 200b of the second element 2b'. When the first join portion 101b of the first element 1b' and the second join portion 201b of the second element 2b' are joined with each other, a common region J1b is formed therebetween, and the plurality of first contact points 11b' of the first element 1b' and the plurality of second contact points 21b' of the second element 2b' are juxtaposed to each other to be located at the common region J1b. Then, a metallic welding portion W is applied onto each of the juxtaposed first and second contact points 11b' and 21b' of the first and second elements 1b' and 2b', such that electrical connections of the juxtaposed first and second contact points 11b' and 21b' of the first and second elements 1b' and 2b' are built.

Figure 15A:
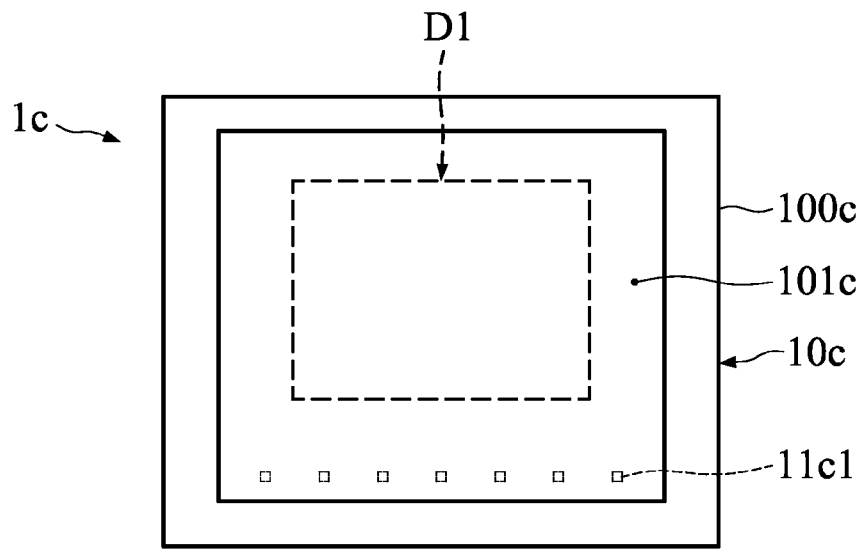
FIG. 15A is a schematic view of a first element of a card structure of a twelfth embodiment of the disclosure.
Figure 15B:
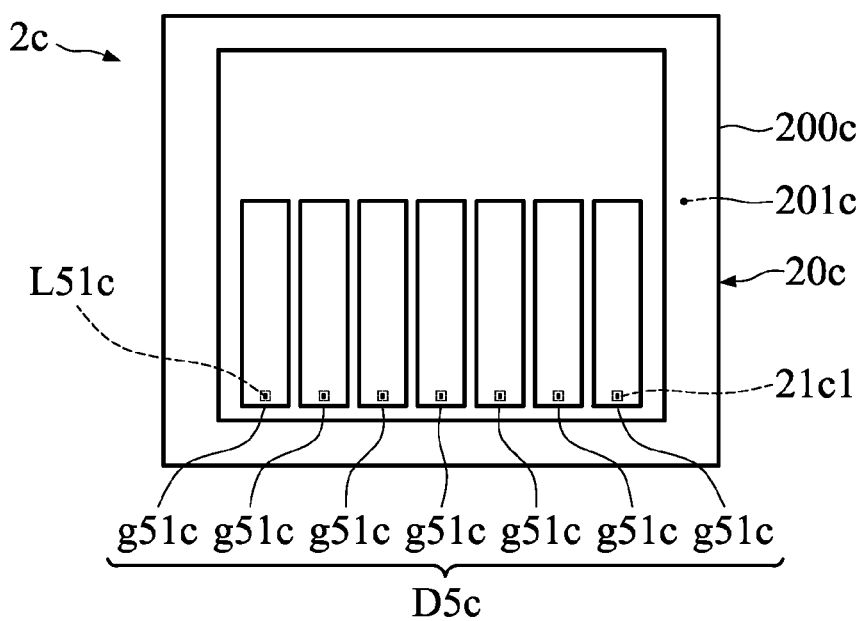
FIG. 15B is a schematic view of a second element of the card structure of the twelfth embodiment of the disclosure.
Figure 15C:
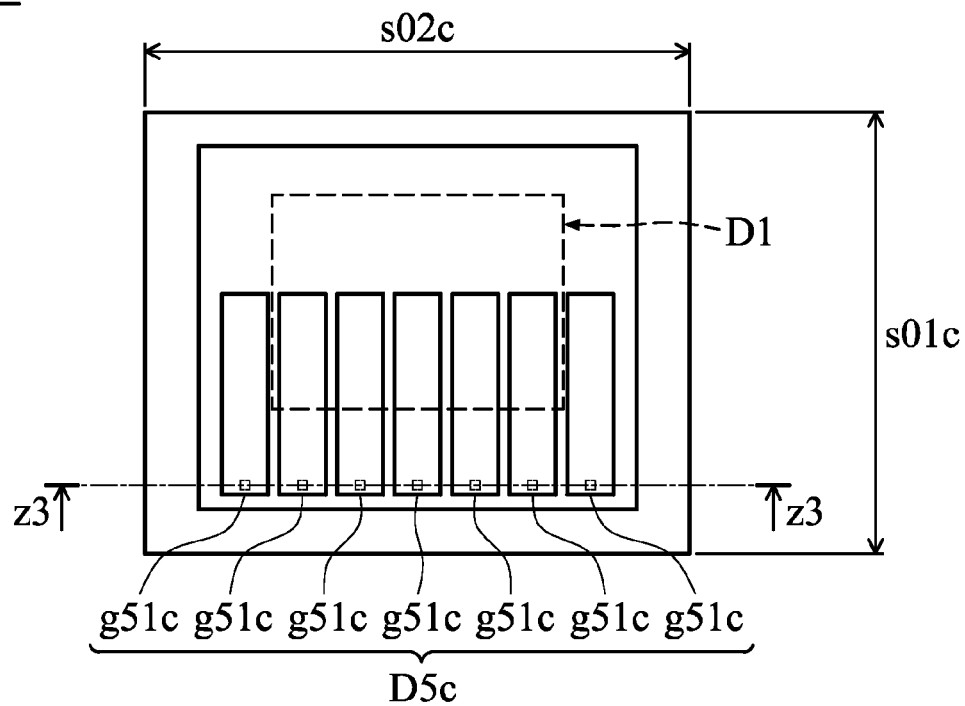
FIG. 15C is a schematic view of the assembled first and second elements of the card structure of the twelfth embodiment of the disclosure.
Figure 15D:
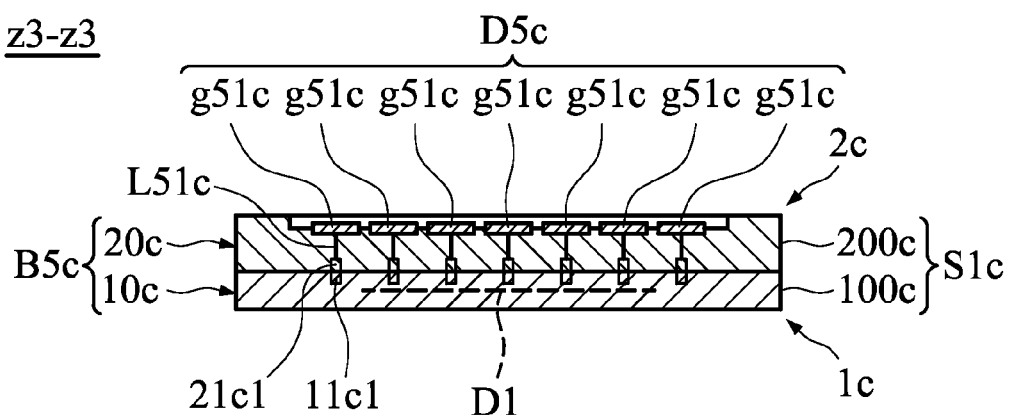
FIG. 15D is a sectional view of the card structure along line (z3-z3) of FIG. 15C.

FIG. 15A is a schematic view of a first element 1c of a card structure C5c of a twelfth embodiment, FIG. 15B is a schematic view of a second element 2c of the card structure C5c of the twelfth embodiment, FIG. 15C is a schematic view of the assembled first and second elements element 1c and 2c of the card structure C5c of the twelfth embodiment, and FIG. 15D is a sectional view of the card structure C5c along line z3-z3 of FIG. 15C. In this embodiment, the card structure C5c is a 7-pin slim memory card structure for eSATA specifications.

In FIG. 15A, the first element 1c has a rectangular structure comprising a first body 10c, a plurality of first contact points 11c, a first join portion 101c and a first peripheral portion 100c. The first join portion 101c is a surface of the first body 10c, and the first peripheral portion 100c is a peripheral surface of the first body 10c which is located at an outer circumference of the first join portion 101c. The circuit unit D1 can be disposed on or inside of the first body 10c of the first element 1c. The plurality of first contact points 11c exposed by the first join portion 101c are coupled to the circuit unit D1 via lead wires (not shown in FIGs.).

In FIG. 15B, the second element 2c has a rectangular structure comprising a second body 20c, a plurality of second contact points 21c, a second join portion 201c and a second peripheral portion 200c. The second join portion 201c is a surface of the second body 20c to join the first join portion 101c of the first element 1c, and the second peripheral portion 200c is a peripheral surface of the second body 20c which is located an outer circumference of the second join portion 201c. The plurality of second contact points 21c of the second element 2c, corresponding to the plurality of first contact points 11c of the first element 1c, are exposed by the second join portion 201c thereof. The first body 10c of the first element 1c and the second body 20c of the second element 2c form a card body B5c of the card structure C5c.

In FIGS. 15B, 15C and 15D, the card contact unit D5c comprises a plurality of contact portions g51c and a plurality of lead wires L51c (shown in FIG. 15D). The plurality of contact portions g51c exposed by the second body 20c of the second element 2c are coupled to the plurality of second contact points 21c of the second element 2c via the plurality of lead wires L51c. In this embodiment, the amount of the plurality of contact portions g51c is seven, and the plurality of contact portions g51c are rectangular conductive pad portions.

In FIGS. 15C and 15D, when the first join portion 101c of the first element 1c and the second join portion 201c of the second element 2c are joined with each other, the first peripheral portion 100c of the first element 1c and the second peripheral portion 200c of the second element 2c are connectively adjacent to each other to form a common region J1c therebetween and a combined peripheral portion S1c, and the plurality of first contact points 11c of the first element 1c are respectively coupled to the plurality of second contact points 21c of the second element 2c, thereby forming the card structure C5c.

With respect to the combined peripheral portion S1c formed by the adjacency of the first peripheral portion 100c of the first element 1c and the second peripheral portion 200c of the second element 2c, it is noted that the combined peripheral portion S1c comprises a pair of first sections s01c and a pair of second sections s02c, and the length of the pair of second sections s02c is minimized according to the arrangement of the plurality of contact portions g51c of the card contact unit D5c. In this embodiment, the length of the first sections s01c is approximately equal to or less than that of the second sections s02c.

Figure 15E:
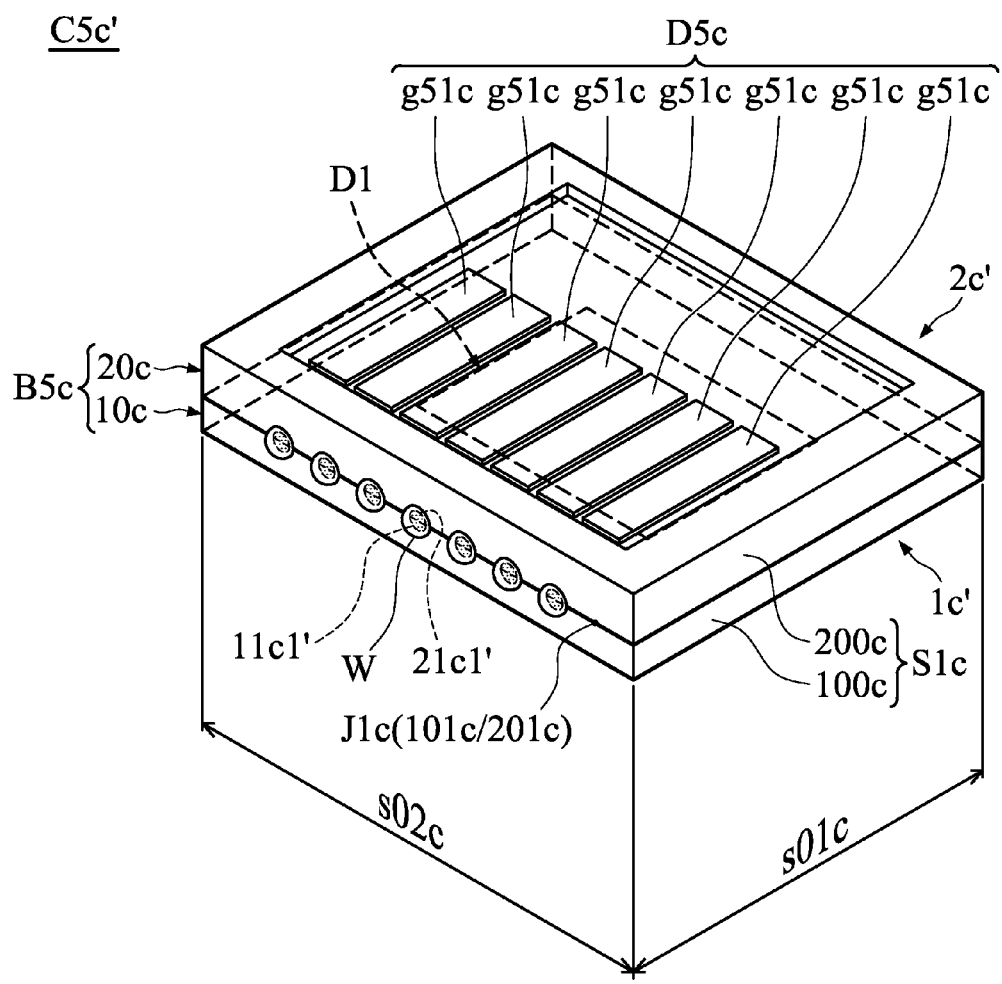
FIG. 15E is a schematic view of a variation example according to the card structure of the twelfth embodiment of the disclosure.

FIG. 15E is a schematic view of a variation example according to the card structure C5c of the twelfth embodiment. A card structure C5c' of the variation example differs from the card structure C5c of the twelfth embodiment in that the plurality of first contact points 11c' of the first element 1c' and the plurality of second contact points 21c' of the second element 2c' are corresponded to each other and respectively exposed by the first peripheral portion 100c of the first element 1c' and the second peripheral portion 200c of the second element 2c'. When the first join portion 101c of the first element 1c' and the second join portion 201c of the second element 2c' are joined with each other, a common region J1c is formed therebetween, and the plurality of first contact points 11c' of the first element 1c' and the plurality of second contact points 21c' of the second element 2c' are juxtaposed to each other to be located at the common region J1c. Then, a metallic welding portion W is applied onto each of the juxtaposed first and second contact points 11c' and 21c' of the first and second elements 1c' and 2c', such that electrical connections of the juxtaposed first and second contact points 11c' and 21c' of the first and second elements 1c' and 2c' are built.

Figure 16A:
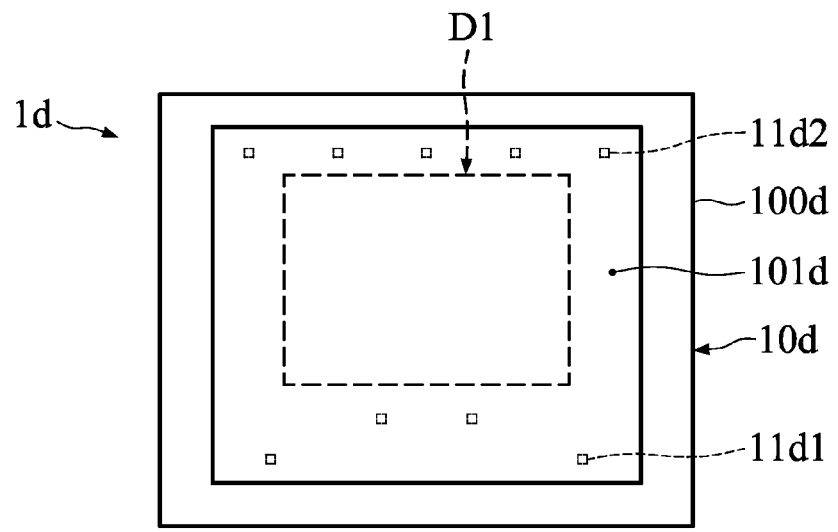
FIG. 16A is a schematic view of a first element of a card structure of a thirteenth embodiment of the disclosure.
Figure 16B:
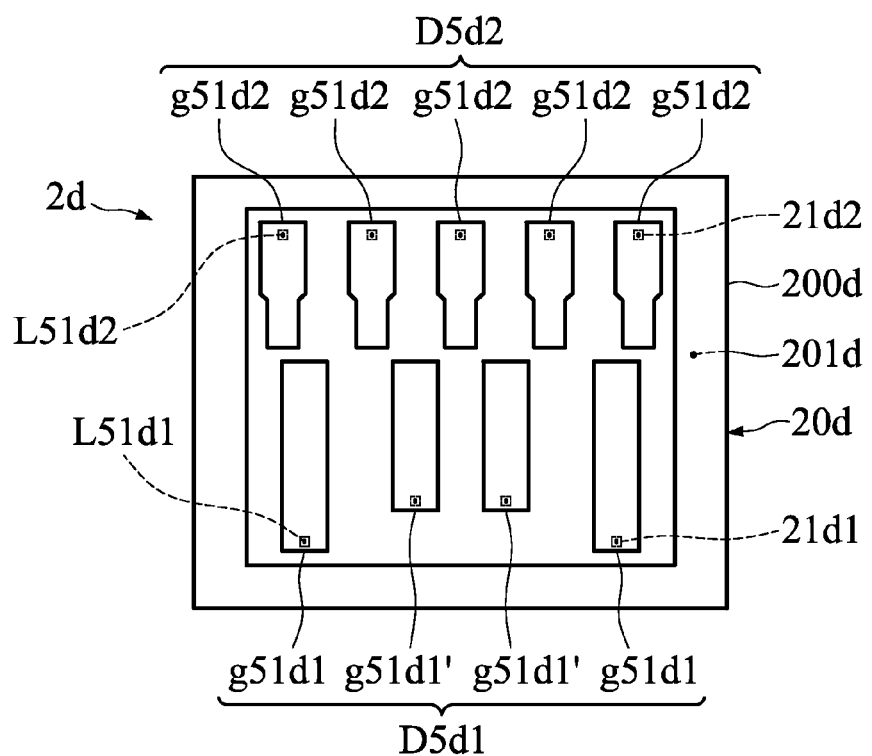
FIG. 16B is a schematic view of a second element of the card structure of the thirteenth embodiment of the disclosure.
Figure 16C:
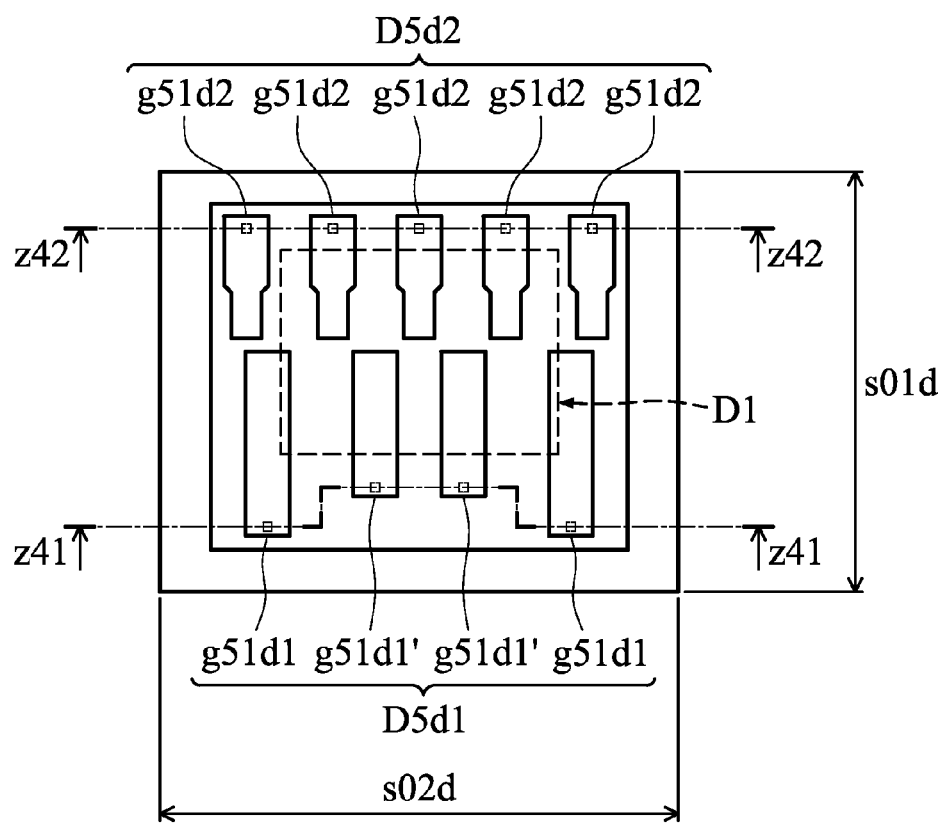
FIG. 16C is a schematic view of the assembled first and second elements of the card structure of the thirteenth embodiment of the disclosure.

FIG. 16A is a schematic view of a first element 1d of a card structure C5d of a thirteenth embodiment, FIG. 16B is a schematic view of a second element 2d of the card structure C5d of the thirteenth embodiment, FIG. 16C is a schematic view of the assembled first and second elements 1d and 2d of the card structure C5d of the thirteenth embodiment, FIG. 16D1 is a sectional view of the card structure C5d along line z41-z41 of FIG. 16C, and FIG. 16D2 is a sectional view of the card structure C5d along line z42-z42 of FIG. 16C. In this embodiment, the card structure C5d is a slim memory card structure with multiple interfaces for USB 2.0/3.0 specifications.

In FIGS. 16A, 16B, 16C, 16D1 and 16D2, the card structure C5d comprises the first element 1d, the second element 2d, a circuit unit D1 and a card contact unit D5d. In this embodiment, the first element 1d and the circuit unit D1 form a chip on board (COB) device or an electronic circuit, and the second element 2d and the card contact unit D5d form a connector.

In FIG. 16A, the first element 1d has a rectangular structure comprising a first body 10d, a plurality of first contact points 11d1/11d2, a first join portion 101d and a first peripheral portion 100d. The first join portion 101d is a surface of the first body 10d, and the first peripheral portion 100d is a peripheral surface of the first body 10d which is located at an outer circumference of the first join portion 101d. The circuit unit D1 can be disposed on or inside of the first body 10d of the first element 1d. The plurality of first contact points 11d1/11d2 exposed by the first join portion 101d are coupled to the circuit unit D1 via lead wires (not shown in FIGs.).

In FIG. 16B, the second element 2d has a rectangular structure comprising a second body 20d, a plurality of second contact points 21d1/21d2, a second join portion 201d and a second peripheral portion 200d. The second join portion 201d is a surface of the second body 20d to join the first join portion 101d of the first element 1d, and the second peripheral portion 200d is a peripheral surface of the second body 20d which is located an outer circumference of the second join portion 201d. The plurality of second contact points 21d1/21d2 of the second element 2d, corresponding to the plurality of first contact points 11d1/11d2 of the first element 1d, are exposed by the second join portion 201d thereof. The first body 10d of the first element 1d and the second body 20d of the second element 2d form a card body B5d of the card structure C5d.

In FIGS. 16B, 16C, 16D1 and 16D2, the card contact unit D5d comprises a plurality of contact portions g51d1/g51d1' and g51d2 and a plurality of lead wires L51d1 and L51d2 shown in FIGS. 16D1 and 16D2. The plurality of contact portions g51d1/g51d1' and g51d2 exposed by the second body 20d of the second element 2d are coupled to the plurality of second contact points 21d1/21d2 of the second element 2d via the plurality of lead wires L51d1 and L51d2. In this embodiment, the amount of the plurality of contact portions g51d1 is two, the amount of the plurality of contact portions g51d1' is two, the amount of the plurality of contact portions g51d2 is five, the plurality of contact portions g51d1 and g51d1' are rectangular conductive pad portions, the plurality of contact portions g51d2 are T-shaped conductive pad portions, and the length of the plurality of contact portions g51d1 is greater than that of the plurality of contact portions g51d1'.

In FIGS. 16C, 16D1 and 16D2, when the first join portion 101d of the first element 1d and the second join portion 201d of the second element 2d are joined with each other, the first peripheral portion 100d of the first element 1d and the second peripheral portion 200d of the second element 2d are connectively adjacent to each other to form a common region J1d therebetween and a combined peripheral portion S1d, and the plurality of first contact points 11d1/11d2 of the first element 1d are respectively coupled to the plurality of second contact points 21d1/21d2 of the second element 2d, thereby forming the card structure C5d.

With respect to the combined peripheral portion S1d formed by the adjacency of the first peripheral portion 100d of the first element 1d and the second peripheral portion 200d of the second element 2d, it is noted that the combined peripheral portion S1d comprises a pair of first sections s01d and a pair of second sections s02d, and the length of the pair of second sections s02d is minimized according to the arrangement of the plurality of contact portions g51d1/g51d1' and g51d2 of the card contact unit D5d. In this embodiment, the length of the first sections s01d is approximately equal to or less than that of the second sections s02d.

Figure 16E:
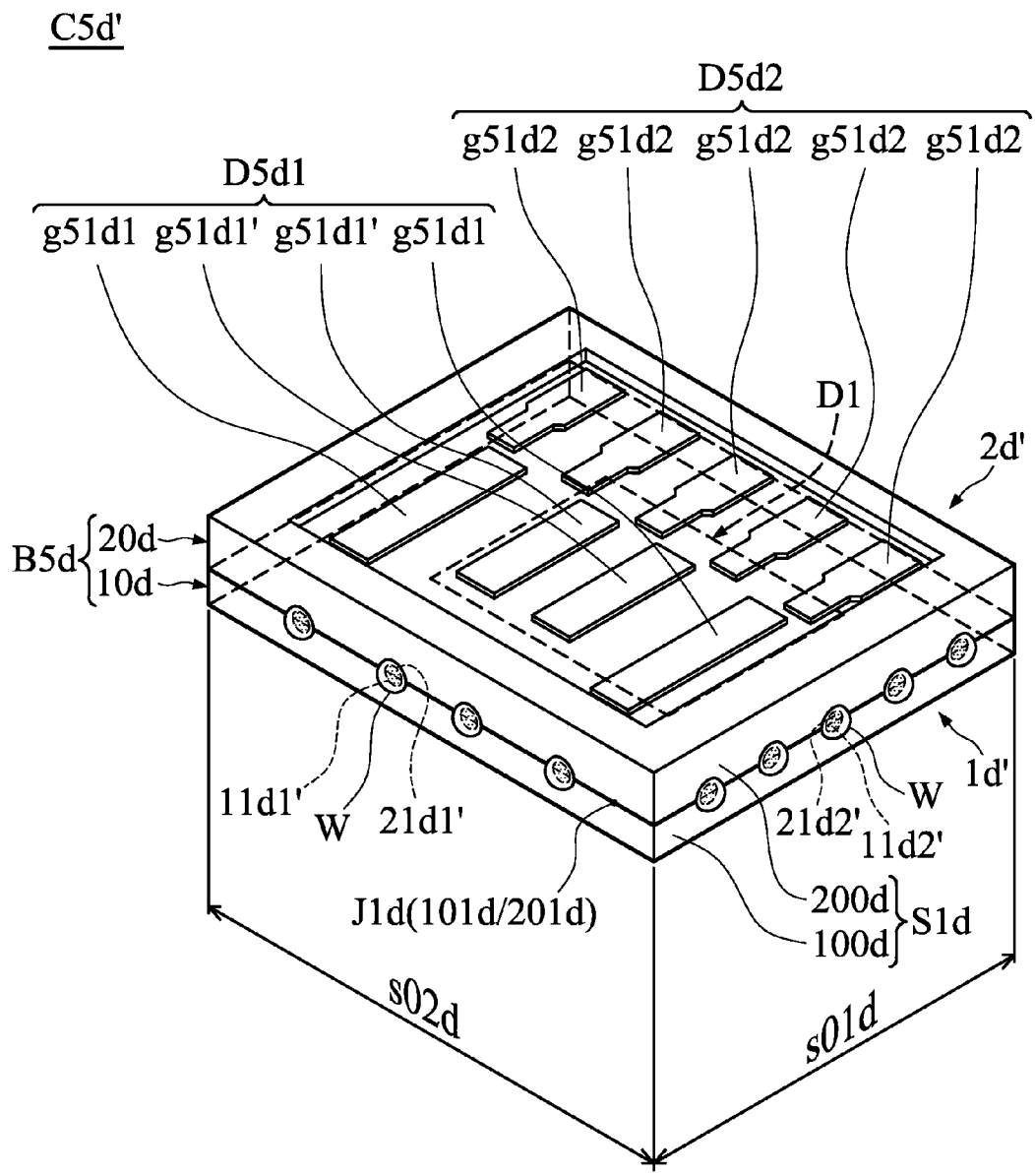
FIG. 16E is a schematic view of a variation example according to the card structure of the thirteenth embodiment of the disclosure.

FIG. 16E is a schematic view of a variation example according to the card structure C5d of the thirteenth embodiment. A card structure C5d' of the variation example differs from the card structure C5d of the thirteenth embodiment in that the plurality of first contact points 11d1'/11d2' of the first element 1d' and the plurality of second contact points 21d1'/21d2' of the second element 2d' are corresponded to each other and respectively exposed by the first peripheral portion 100d of the first element 1d' and the second peripheral portion 200d of the second element 2d'.

When the first join portion 101d of the first element 1d' and the second join portion 201d of the second element 2d' are joined with each other, a common region J1d is formed therebetween, and the plurality of first contact points 11d1'/11d2' of the first element 1d' and the plurality of second contact points 21d1'/21d2' of the second element 2d' are juxtaposed to each other to be located at the common region J1d. Then, a metallic welding portion W is applied onto each of the juxtaposed first and second contact points 11d1' and 21d1'/11d2' and 21d2' of the first and second elements 1d' and 2d', such that electrical connections of the juxtaposed first and second contact points 11d1'/11d2' and 21d1'/21d2' of the first and second elements 1d' and 2d' are built.

Figure 17A:
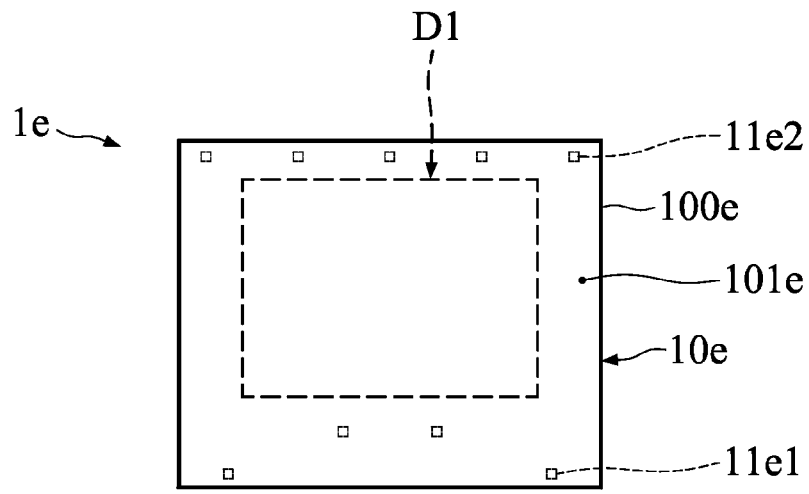
FIG. 17A is a schematic view of a first element of a card structure of a fourteenth embodiment of the disclosure.
Figure 17B:
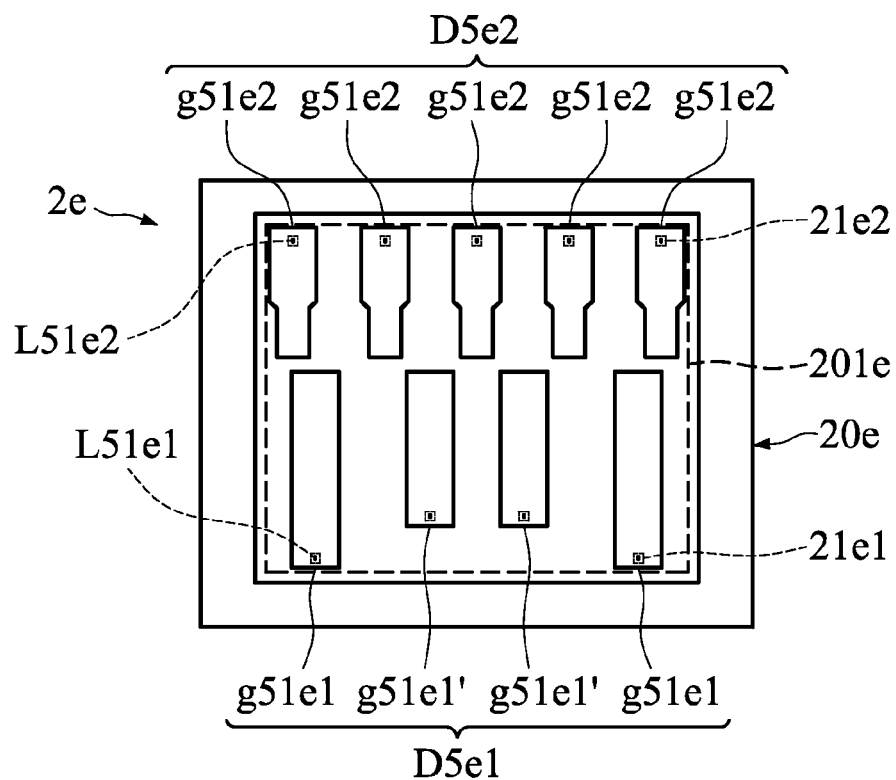
FIG. 17B is a schematic view of a second element of the card structure of the fourteenth embodiment of the disclosure.
Figure 17C:
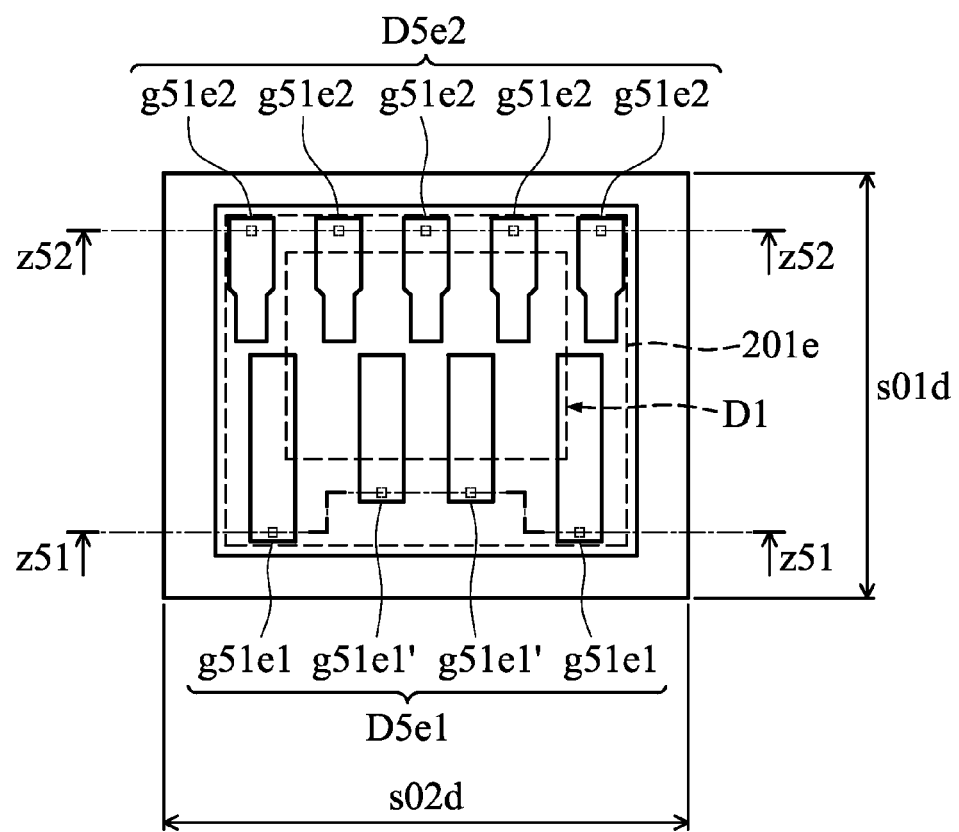
FIG. 17C is a schematic view of the assembled first and second elements of the card structure of the fourteenth embodiment of the disclosure.

FIG. 17A is a schematic view of a first element 1e of a card structure C5e of a fourteenth embodiment, FIG. 17B is a schematic view of a second element 2e of the card structure C5e of the fourteenth embodiment, FIG. 17C is a schematic view of the assembled first and second elements 1d and 2e of the card structure C5e of the fourteenth embodiment, FIG. 17D1 is a sectional view of the card structure C5e along line z51-z51 of FIG. 17C, and FIG. 17D2 is a sectional view of the card structure C5e along line z52-z52 of FIG. 17C. In this embodiment, the card structure C5e is a slim memory card structure with multiple interfaces for USB 2.0/3.0 specifications.

In FIGS. 17A, 17B, 17C and 17D, the card structure C5e comprises the first element 1e, the second element 2e, a circuit unit D1 and a card contact unit D5e. In this embodiment, the first element 1e and the circuit unit D1 form a chip on board (COB) device or an electronic circuit, and the second element 2e and the card contact unit D5e form a connector.

In FIG. 17A, the first element 1e has a rectangular structure comprising a first body 10e, a plurality of first contact points 11e1/11e2, a first join portion 101e and a first peripheral portion 100e. The first join portion 101e is a surface of the first body 10e, and the first peripheral portion 100e is a peripheral surface of the first body 10e which is located at an outer circumference of the first join portion 101e. The circuit unit D1 can be disposed on or inside of the first body 10e of the first element 1e. The plurality of first contact points 11e1/11e2 exposed by the first join portion 101e are coupled to the circuit unit D1 via lead wires (not shown in FIGs.).

In FIG. 17B, the second element 2e has a rectangular structure comprising a second body 20e, a plurality of second contact points 21e1/21e2, a second join portion 201e, and a second peripheral portion 200e1. The second join portion 201e is formed on the second body 20e to join the first join portion 101e of the first element 1e. The plurality of second contact points 21e1/21e2 of the second element 2e, corresponding to the plurality of first contact points 11e1/11e2 of the first element 1e, are exposed by the second join portion 201e thereof. In this embodiment, the second join portion 201e is a recess which is formed on the second body 20e and provided with a bottom surface 200e2 relative to the first body 10e of the first element 1e, the second peripheral portion 200e1 is an inner sidewall of the recess, and the plurality of second contact points 21e1/21e2 are disposed on the bottom surface 200e2 of the recess. The first body 10e of the first element 1e and the second body 20e of the second element 2e form a card body B5e of the card structure C5e.

In FIGS. 17B, 17C, 17D1 and 17D2, the card contact unit D5e comprises a plurality of contact portions g51e1/g51e1' and g51e2 and a plurality of lead wires L51e1 and L51e2 (shown in FIGS. 17D1 and 17D2). The plurality of contact portions g51e1/g51e1' and g51e2 exposed by the second body 20e of the second element 2e are coupled to the plurality of second contact points 21e1/21e2 of the second element 2e via the plurality of lead wires L51e1 and L51e2. In this embodiment, the amount of the plurality of contact portions g51e1 is two, the amount of the plurality of contact portions g51e1' is two, the amount of the plurality of contact portions g51e2 is five, the plurality of contact portions g51e1 and g51e1' are rectangular conductive pad portions, the plurality of contact portions g51e2 are T-shaped conductive pad portions, and the length of the plurality of contact portions g51e1 is greater than that of the plurality of contact portions g51e1'.

In FIGS. 17C, 17D1 and 17D2, when the first join portion 101e of the first element 1e and the second join portion 201e of the second element 2e are joined with each other, i.e., when the first body 10e of the first element 1e is fitted into the second join portion 201e of the second join portion 201e of the second element 2e, the first peripheral portion 100e of the first element 1e and the second peripheral portion 200e1 of the second element 2e are connectively adjacent to each other to form a common region J1e therebetween, and the plurality of first contact points 11e1/11e2 of the first element 1e are respectively coupled to the plurality of second contact points 21e1/21e2 of the second element 2e, thereby forming the card structure C5e.

Figure 17E:
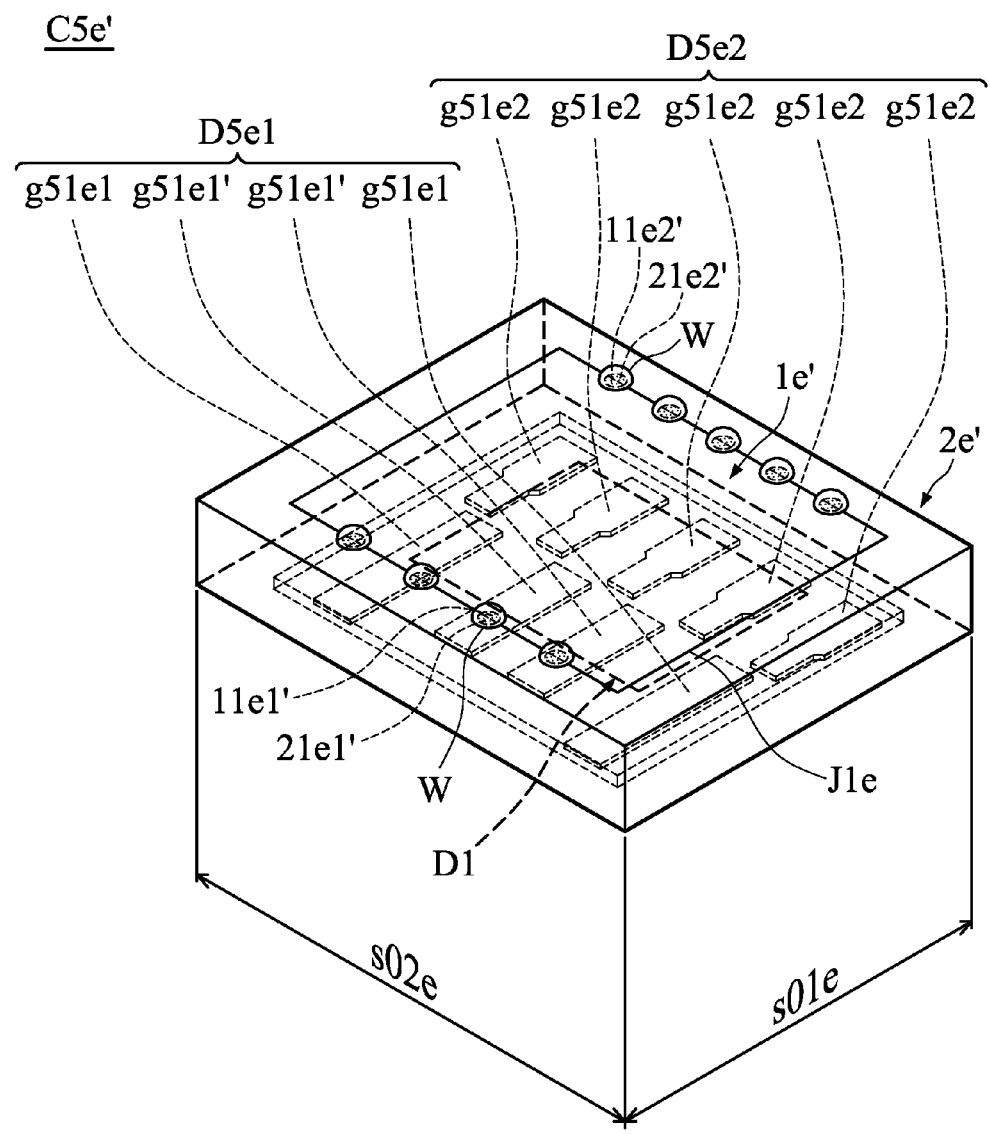
FIG. 17E is a schematic view of a variation example according to the card structure of the fourteenth embodiment of the disclosure.

FIG. 17E is a schematic view of a variation example according to the card structure C5e of the fourteenth embodiment. A card structure C5e' of the variation example differs from the card structure C5e of the fourteenth embodiment in that the plurality of first contact points 11e1'/11e2' of the first element 1e' and the plurality of second contact points 21e1'/21e2' of the second element 2e' are corresponded to each other and respectively exposed by two outer surfaces aside of the common region J1e. When the first join portion 101e of the first element 1e' and the second join portion 201e of the second element 2e' are joined with each other, the plurality of first contact points 11e1'/11e2' of the first element 1e' and the plurality of second contact points 21e1'/21e2' of the second element 2e' are juxtaposed to each other to be located at the common region J1e. Then, a metallic welding portion W is applied onto each of the juxtaposed first and second contact points 11e1'/11e2' and 21e1'/21e2' of the first and second elements 1e' and 2e', such that electrical connections of the juxtaposed first and second contact points 11e1' and 21e1'/11e2' and 21e2' of the first and second elements 1e' and 2e' are built.

Figure 18:
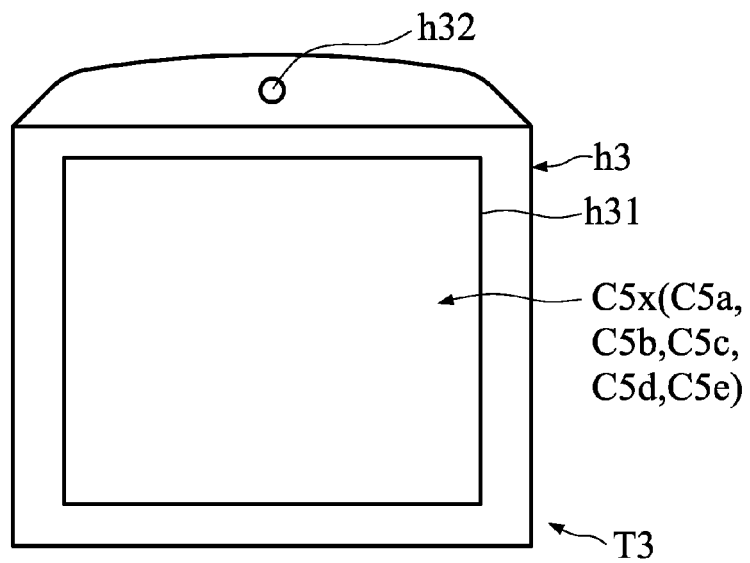
FIG. 18 is a schematic view of an assembly structure of a fifteenth embodiment of the disclosure.

FIG. 18 is a schematic view of an assembly structure E3 of a fifteenth embodiment. The assembly structure E3 mainly comprises a substrate structure T3 and a card structure C5x. The substrate structure T3 comprises a body h3 comprising a first positioning portion h31 and a second positioning portion h32. The card structure C5x is detachably disposed on the first positioning portion h31 of the body h3 of the substrate structure T3. In this embodiment, the card structure C5x can be any of the card structure C5a, C5b, C5c, Cyd and C5e in the embodiments mentioned above, the substrate structure T3 is a key chain structure, the first positioning portion h31 is a recess or slot corresponding to the card structure C5x, and the second positioning portion h32 is a hole for positioning a key or ring (not shown in FIGs.).

Figure 19:
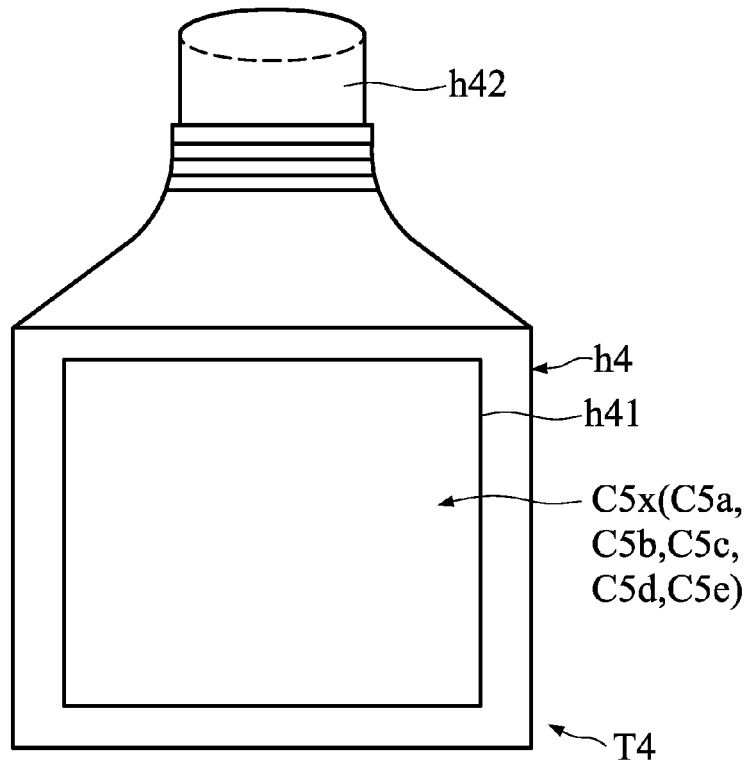
FIG. 19 is a schematic view of an assembly structure of a sixteenth embodiment of the disclosure.

FIG. 19 is a schematic view of an assembly structure E4 of a sixteenth embodiment. The assembly structure E4 mainly comprises a substrate structure T4 and a card structure C5x. The substrate structure T4 comprises a body h4 comprising a positioning portion h41 and a lead wire h42. The card structure C5x is detachably disposed on the positioning portion h41 of the body h4 of the substrate structure T4. In this embodiment, the card structure C5x can be any of the card structure C5a, C5b, C5c, C5d and C5e in the embodiments mentioned above, the substrate structure T4 is a cable or wire, and the positioning portion h41 is a recess or slot corresponding to the card structure C5x.

Figure 20A:
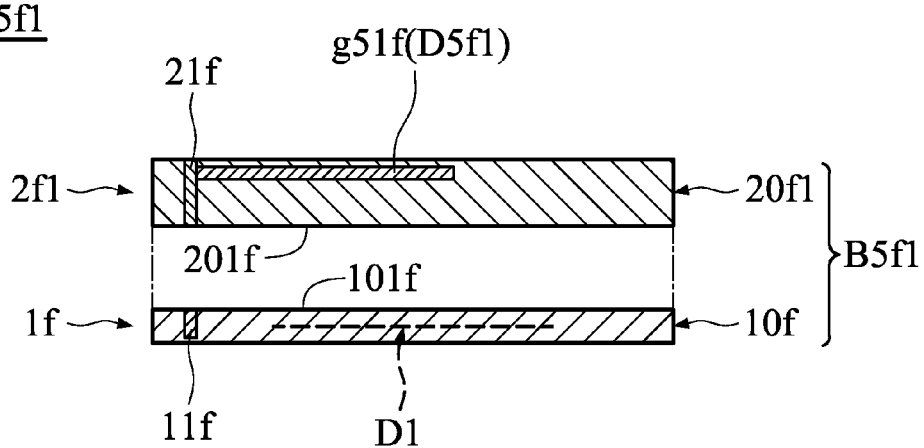
FIG. 20A is an exploded view of a card structure of a seventeenth embodiment of the disclosure.
Figure 20B:
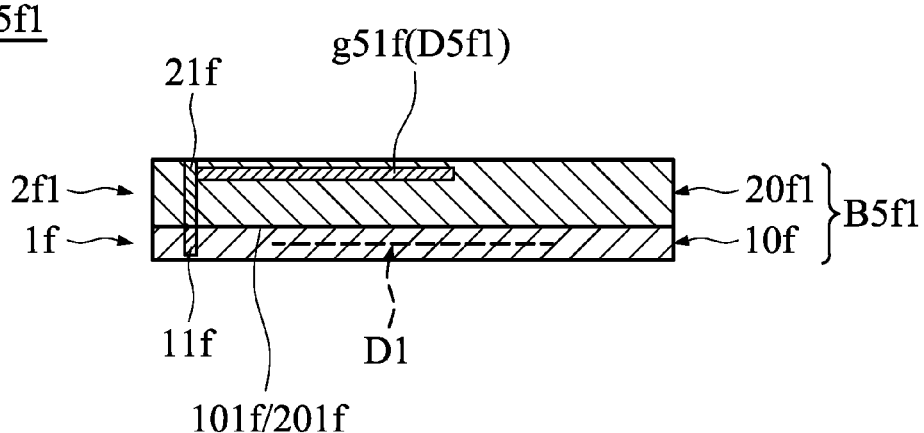
FIG. 20B is an assembled view of the card structure of the seventeenth embodiment of the disclosure.

FIG. 20A is an exploded view of a card structure C5/1 of a seventeenth embodiment, and FIG. 20B is an assembled view of the card structure C5/1 of the seventeenth embodiment.

In FIGS. 20A and 20B, the card structure C5/1 comprises a first element 1f, a second element 2/1, a circuit unit D1, and a card contact unit D5/1 having a plurality of contact portions g51f. In this embodiment, the first element 1f and the circuit unit D1 form a chip on board (COB) device or an electronic circuit, the second element 2/1 and the card contact unit D5/1 form a connector, and the plurality of contact portions g51f of the card contact unit D5/1 are flat pad portions.

In FIG. 20A, the first element 1f comprises a first body 10f, a plurality of first contact points 11f and a first join portion 101f. The first join portion 101f is a surface of the first body 10f. The circuit unit D1 can be disposed on or inside of the first body 10f of the first element 1f. The plurality of first contact points 11f exposed by the first join portion 101f are coupled to the circuit unit D1 via lead wires (not shown in FIGs.).

The second element 2/1 comprises a second body 20/1, a plurality of second contact points 21f and a second join portion 201f. The second join portion 201f is a surface of the second body 20/1 to join the first join portion 101f of the first element 1f. The plurality of second contact points 21f of the second element 2/1, corresponding to the plurality of first contact points 11f of the first element 1f, are exposed by the second join portion 201f thereof. The plurality of contact portions g51f of the card contact unit D5/1 disposed on the second body 20/1 are couple to the plurality of second contact points 21f of the second body 20/1 of the second element 2/1. The first body 10f of the first element 1f and the second body 20/1 of the second element 2/1 form a card body B5/1 of the card structure C5f.

In FIG. 20B, when the first join portion 101f of the first element 1f and the second join portion 201f of the second element 2/1 are joined with each other to couple the plurality of first contact points 11f of the first element 1f to the plurality of second contact points 21f of the second element 2/1, the assembly of the card structure C5/1 is completed.

Figure 21A:
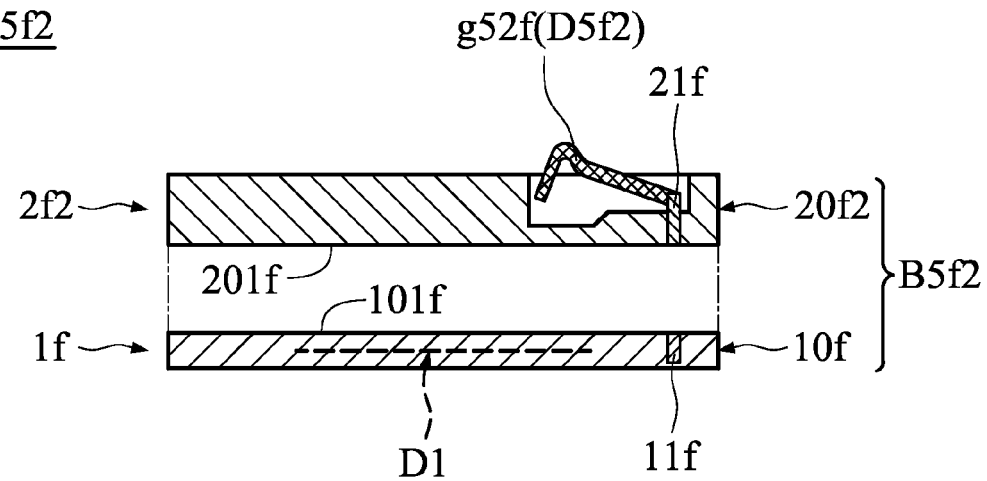
FIG. 21A is an exploded view of a card structure of an eighteenth embodiment of the disclosure.
Figure 21B:
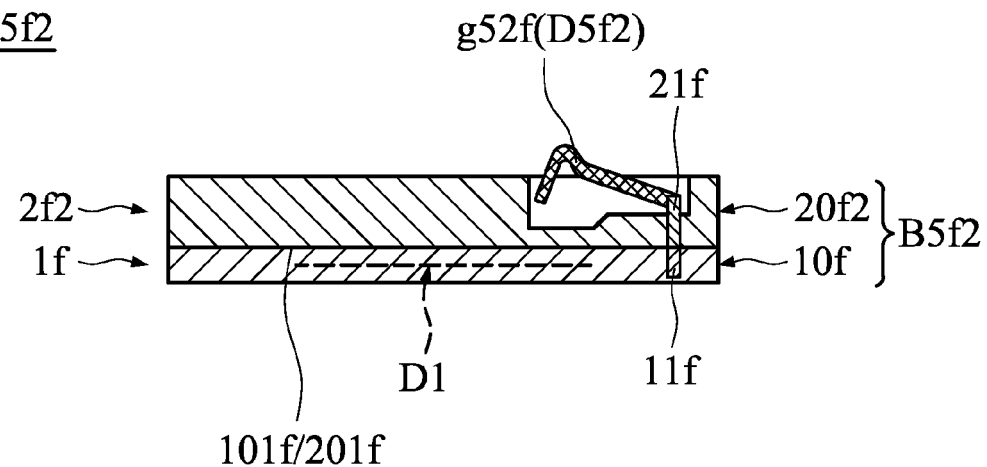
FIG. 21B is an assembled view of the card structure of the eighteenth embodiment of the disclosure.

FIG. 21A is an exploded view of a card structure C5/2 of an eighteenth embodiment, FIG. 21B is an assembled view of the card structure C5/2 of the eighteenth embodiment.

In FIGS. 21A and 21B, the card structure C5/2 comprises a first element 1f, a second element 2/2, a circuit unit D1, and a card contact unit D5/2 having a plurality of contact portions g52f. The card structure C5/2 of the eighteenth embodiment differs from the card structure C5/1 of the seventeenth embodiment in that the plurality of contact portions g51f of the card structure C5/1 are replaced by the plurality of contact portions g52f of the card structure C5/2, and the plurality of contact portions g52f of the card structure C5/2 are conductive elastic plates or reeds. The other elements such as the first element 1f and the circuit unit D1 are the same as those of the card structure C5/1 of the seventeenth embodiment, and therefore the description thereof are omitted.

Figure 22A:
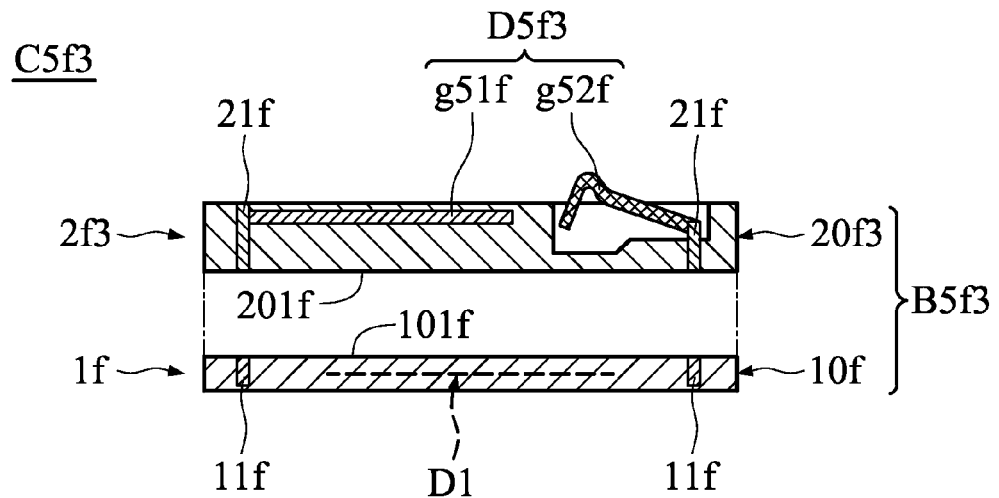
FIG. 22A is an exploded view of a card structure of a nineteenth embodiment of the disclosure.
Figure 22B:
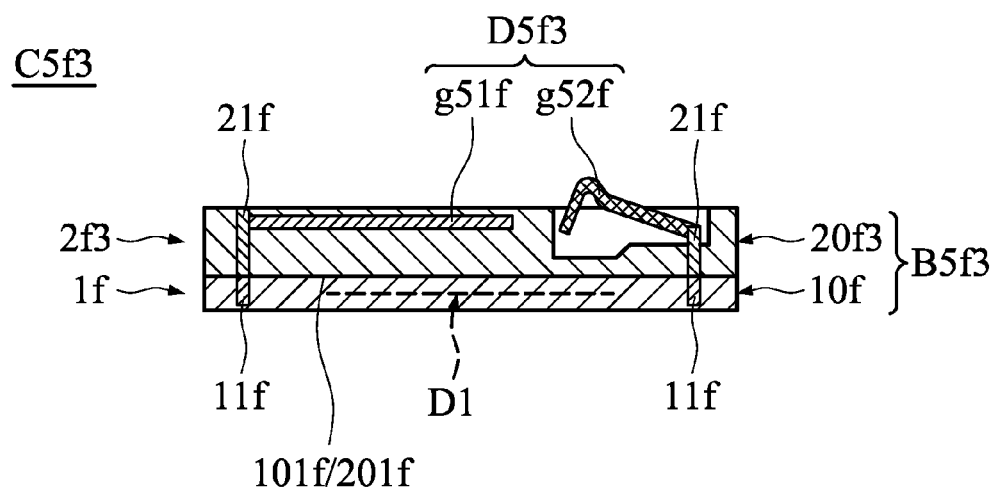
FIG. 22B is an assembled view of the card structure of the nineteenth embodiment of the disclosure.

FIG. 22A is an exploded view of a card structure C5/3 of a nineteenth embodiment, and FIG. 22B is an assembled view of the card structure C5/3 of the nineteenth embodiment.

In FIGS. 22A and 22B, the card structure C5/3 comprises a first element 1f, a second element 2/3, a circuit unit D1, and a card contact unit D5/3 having a plurality of contact portions g51f and g52f. The card structure C5/3 of the nineteenth embodiment differs from the card structure C5/1 of the seventeenth embodiment and the card structure C5/2 of the eighteenth embodiment in that the card contact unit D5/3 of the card structure C5/3 of the nineteenth embodiment is provided with the plurality of contact portions g51f (from the card structure C5/1 of the seventeenth embodiment) and the plurality of contact portions g52f (from the card structure C5/2 of the eighteenth embodiment), i.e., the plurality of contact portions g51f are flat pad portions and the plurality of contact portions g52f are conductive elastic plates or reeds. The other elements such as the first element 1f and the circuit unit D1 are the same as those of the card structure C5/1 of the seventeenth embodiment and the card structure C5/2 of the eighteenth embodiment, and therefore the description thereof are omitted.

Figure 23A:
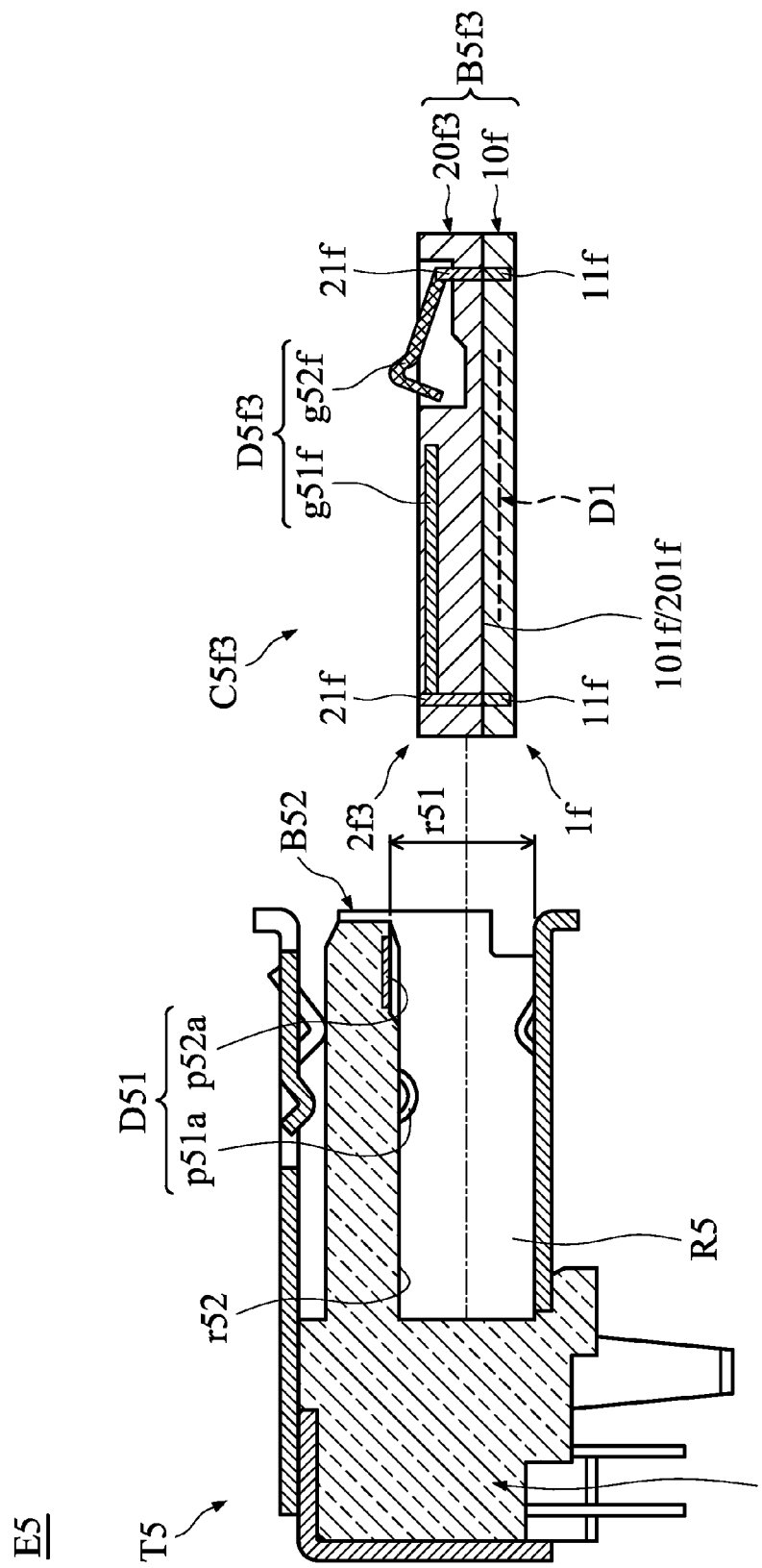
FIG. 23A is an exploded view of an assembly structure of a twentieth embodiment of the disclosure.
Figure 23B:
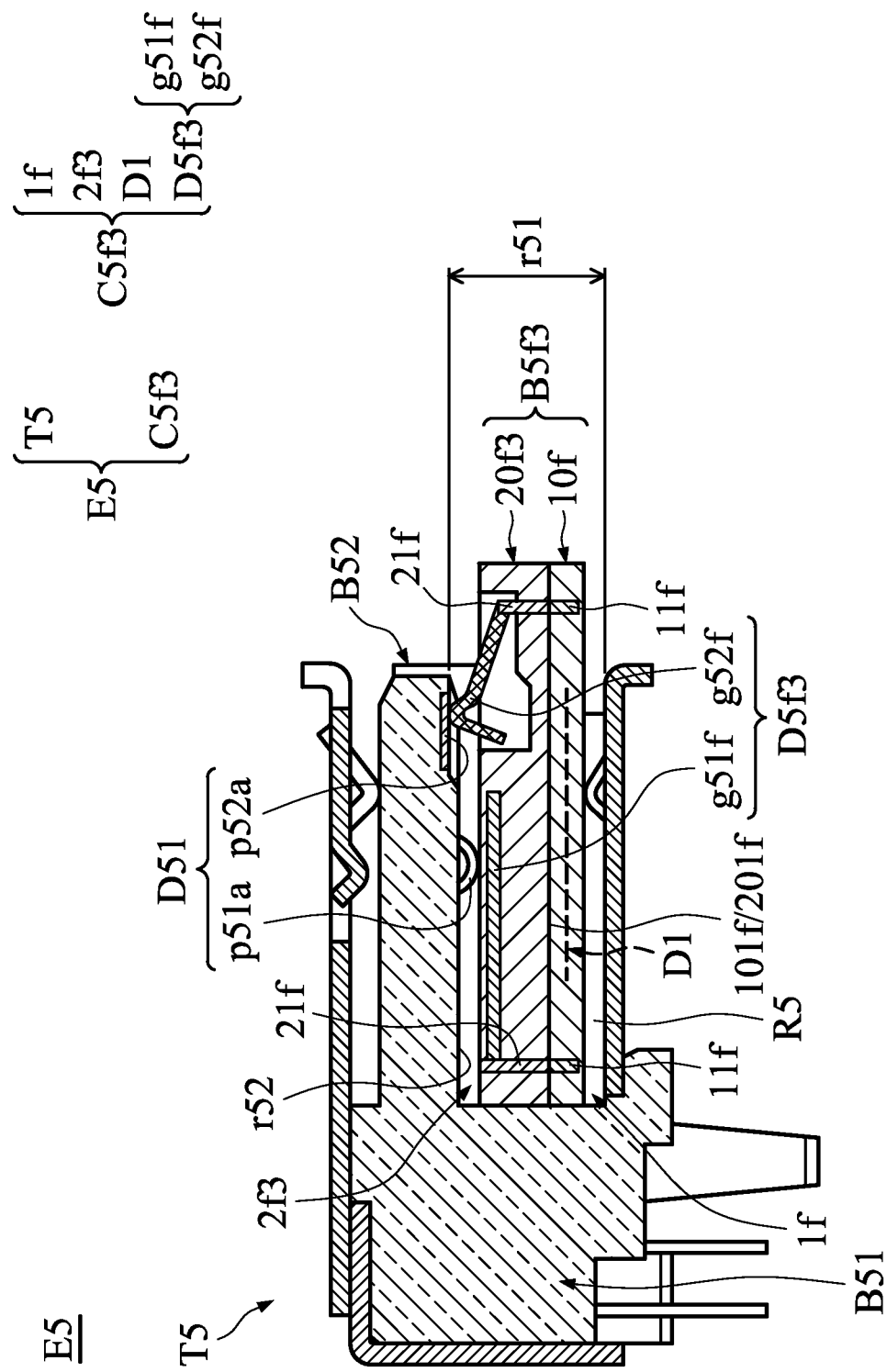
FIG. 23B is an assembled view of the assembly structure of the twentieth embodiment of the disclosure.

FIG. 23A is an exploded view of an assembly structure E5 of a twentieth embodiment, and FIG. 23B is an assembled view of the assembly structure E5 of the twentieth embodiment.

The assembly structure E5 comprises a socket structure T5 and the card structure C5/3 of the nineteenth embodiment.

The socket structure T5 comprises a socket body B51, a positioning portion B52 and a socket contact unit D51. The socket contact unit D51 comprises a plurality of first contact portions p51a and a plurality of second contact portions p52a. In this embodiment, the plurality of second contact portions p52a of the socket contact unit D51 are conductive elastic plates or reeds, and the plurality of first contact portions p51a of the socket contact unit D51 are conductive pad portions.

In FIG. 23A, the socket body B51 of the socket structure T5 comprises a slot R5 having an opening r51 and a sidewall surface r52 connected to the opening r51. The positioning portion B52 is extended from the socket body B51 to form the opening r51 and the sidewall surface r52 of the slot R5 of the socket body B51. In this embodiment, the positioning portion B52 is a cantilevered portion. The plurality of first and second contact portions p51a and p52a of the first contact unit D51 are protruded from the sidewall surface r52 of the slot R5 of the socket body B51, wherein the plurality of second contact portions p52a are closer to the opening r51 of the slot R5 of the socket body B51 than the plurality of first contact portions p51a.

In FIG. 23B, when the card structure C5/3 is inserted into the slot R5 of the socket body B51 of the socket structure T5 via the opening r51 thereof, the plurality of first and second contact portions g51 and g52 of the card structure C5/3 are contacted by the plurality of first and second contact portions p31a and p32a of the first contact unit D31 of the socket structure T5, respectively, such that electrical connections of the card structure C5/3 and the socket structure T5 are built.

Figure 24A:
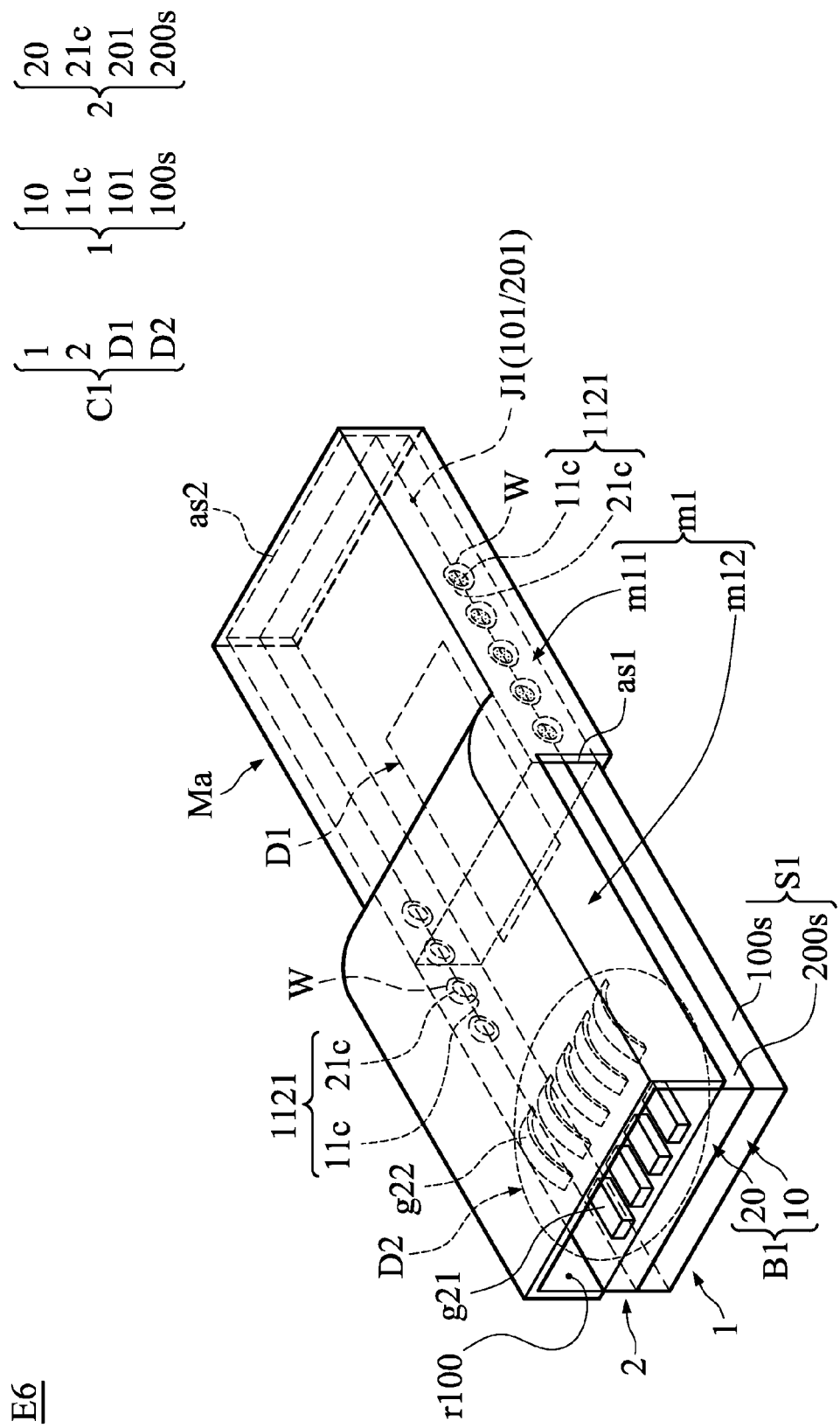
FIG. 24A is an exploded view of an assembly structure of a twenty-first embodiment of the disclosure.
Figure 24B:
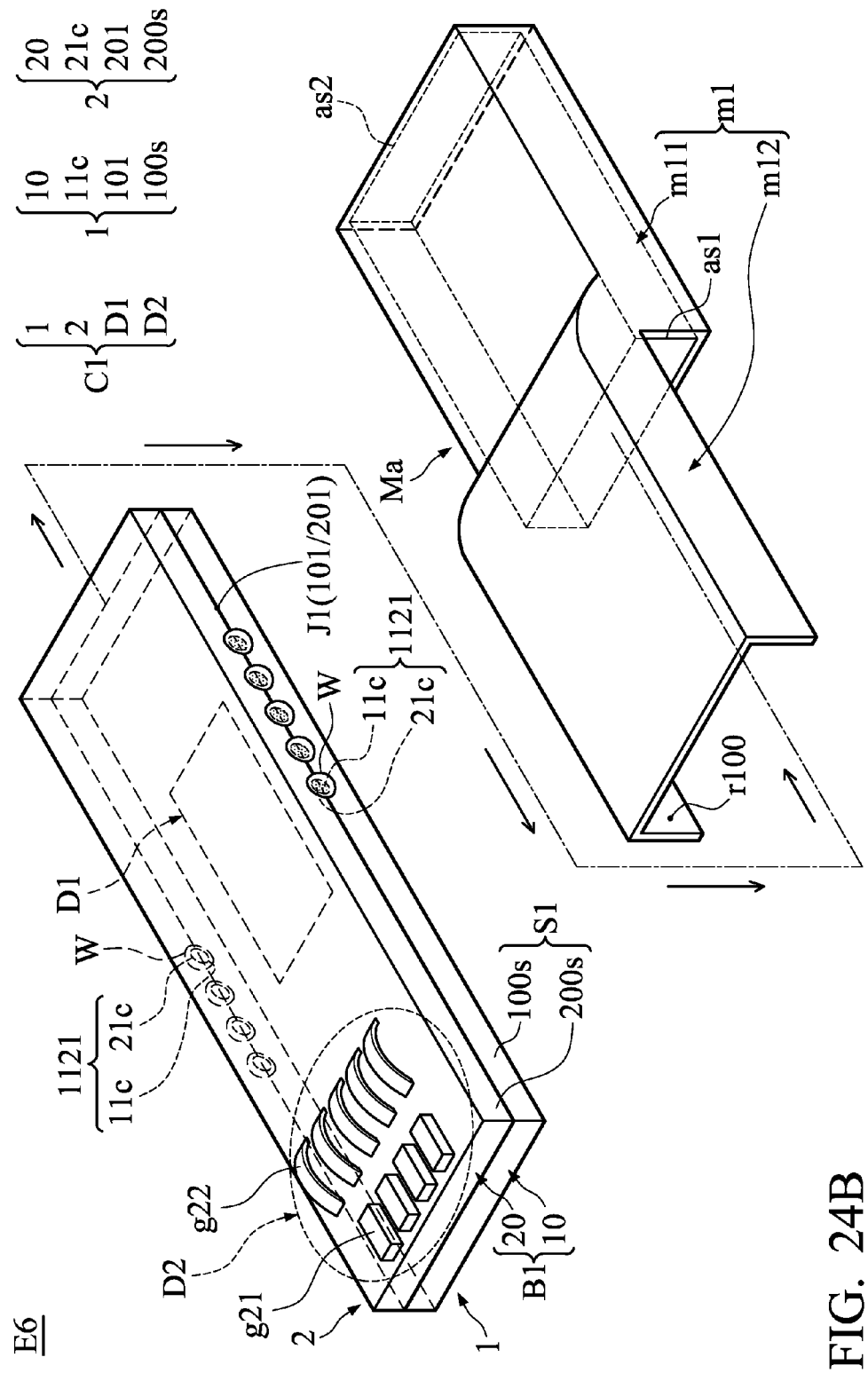
FIG. 24B is an assembled view of the assembly structure of the twenty-first embodiment of the disclosure.
Figure 24C:
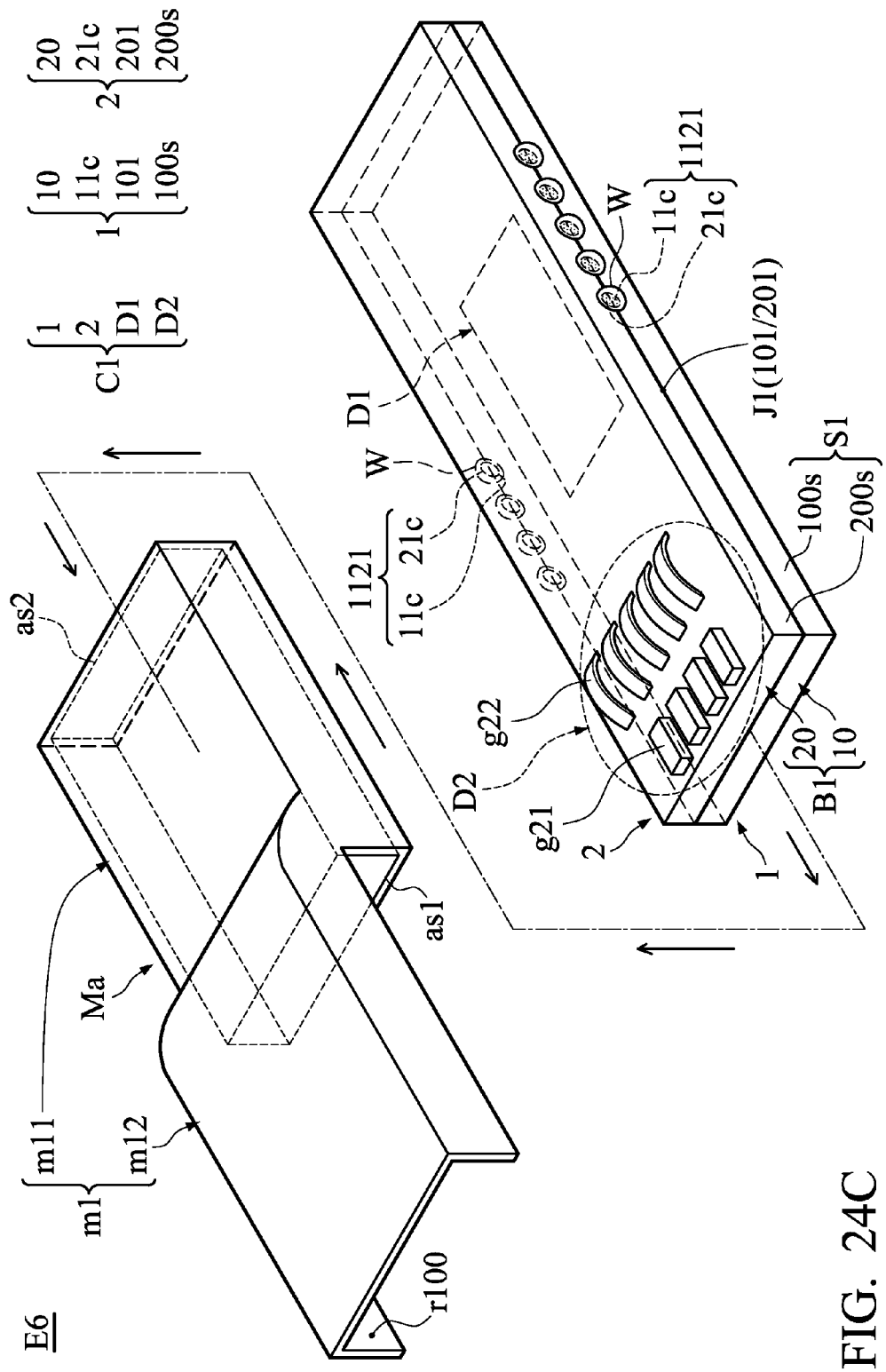
FIG. 24C is another exploded view of the assembly structure of the twenty-first embodiment of the disclosure.

FIG. 24A is an exploded view of an assembly structure E6 of a twenty-first embodiment, and FIGS. 24B and 24C are assembled views of the assembly structure E6 of the twenty-first embodiment in two different way, and FIG. 24C is another exploded view of the assembly structure E6 of the twenty-first embodiment.

In FIGS. 24A, 24B and 24C, the assembly structure E6 comprises a shell structure Ma and the card structure C1 mentioned in the first embodiment of FIGS. 1A to 1C. The detail description of the card structure C1 is therefore omitted hereinafter.

The shell structure Ma comprises a shell body m1 and a positioning device (e.g., springs or latches, but not shown in FIGs.) disposed in the shell body m1. The shell body m1 comprises a first portion m11 and a second portion m12 connected to the first portion m11. The first portion m11 is a hollow portion comprising a first access portion as1 and a second access portion as2 connected to the access portion as1, and the second portion m12 is a U-shaped portion comprising an inner sidewall r100 to which the first access portion as1 of the first portion m11 is faced. In this embodiment, the first and second access portions as1 and as2 of the first portion m11 are rectangular openings. The card structure C1 can be detachably inserted into the shell body m1 of the shell structure Ma via the first access portion as1 or the second access portion as2 thereof.

When the card structure C1 is inserted into the shell body m1 of the shell structure Ma via the first access portion as1 or the second access portion as2 thereof and positioned by the positioning device, a compartment is formed between the card structure C1 and the shell body m1 of the outer shell structure Ma, and thus the card contact unit D2 of the card structure C1 faces the compartment.

Figure 25A:
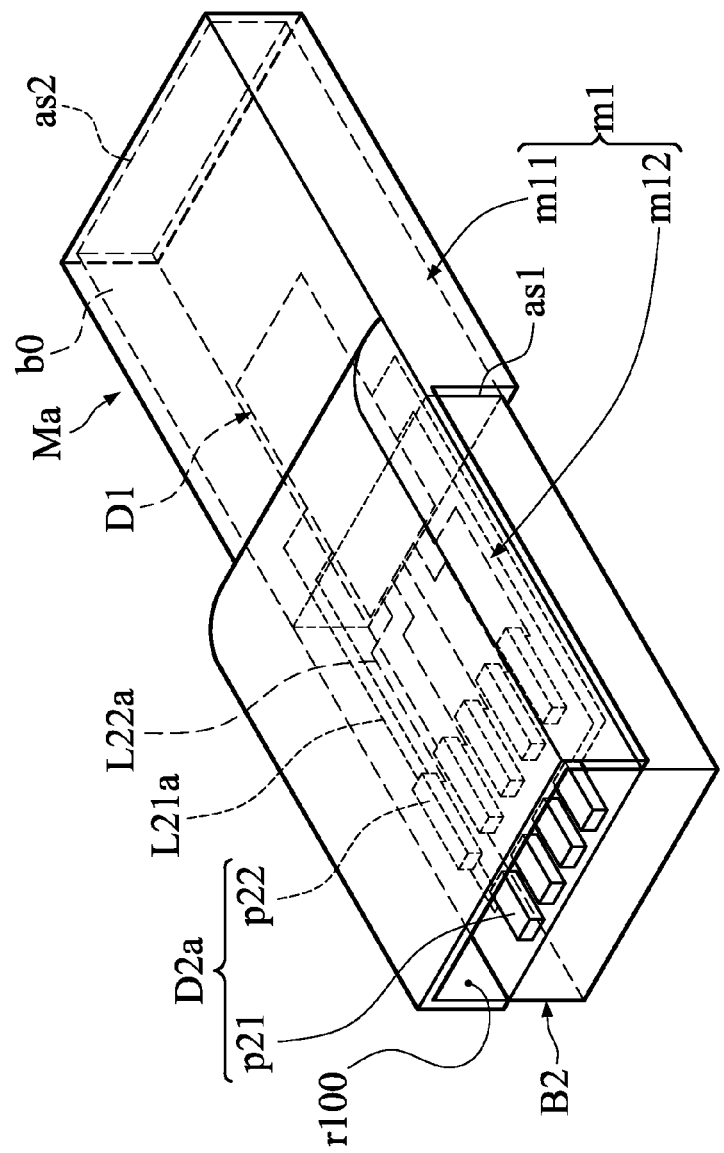
FIG. 25A is an exploded view of an assembly structure of a twenty-second embodiment of the disclosure.
Figure 25B:
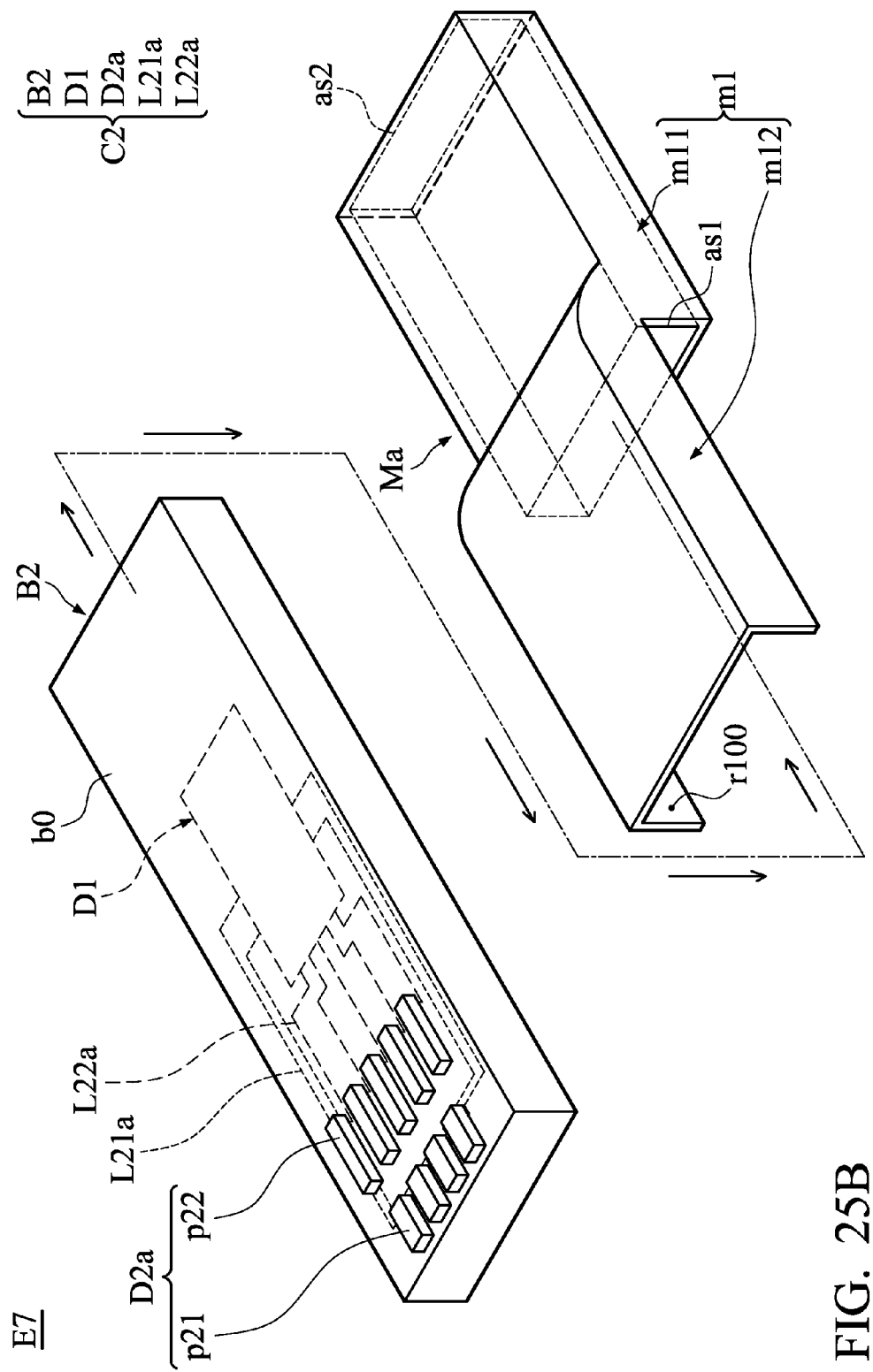
FIG. 25B is an assembled view of the assembly structure of the twenty-second embodiment of the disclosure.
Figure 25C:
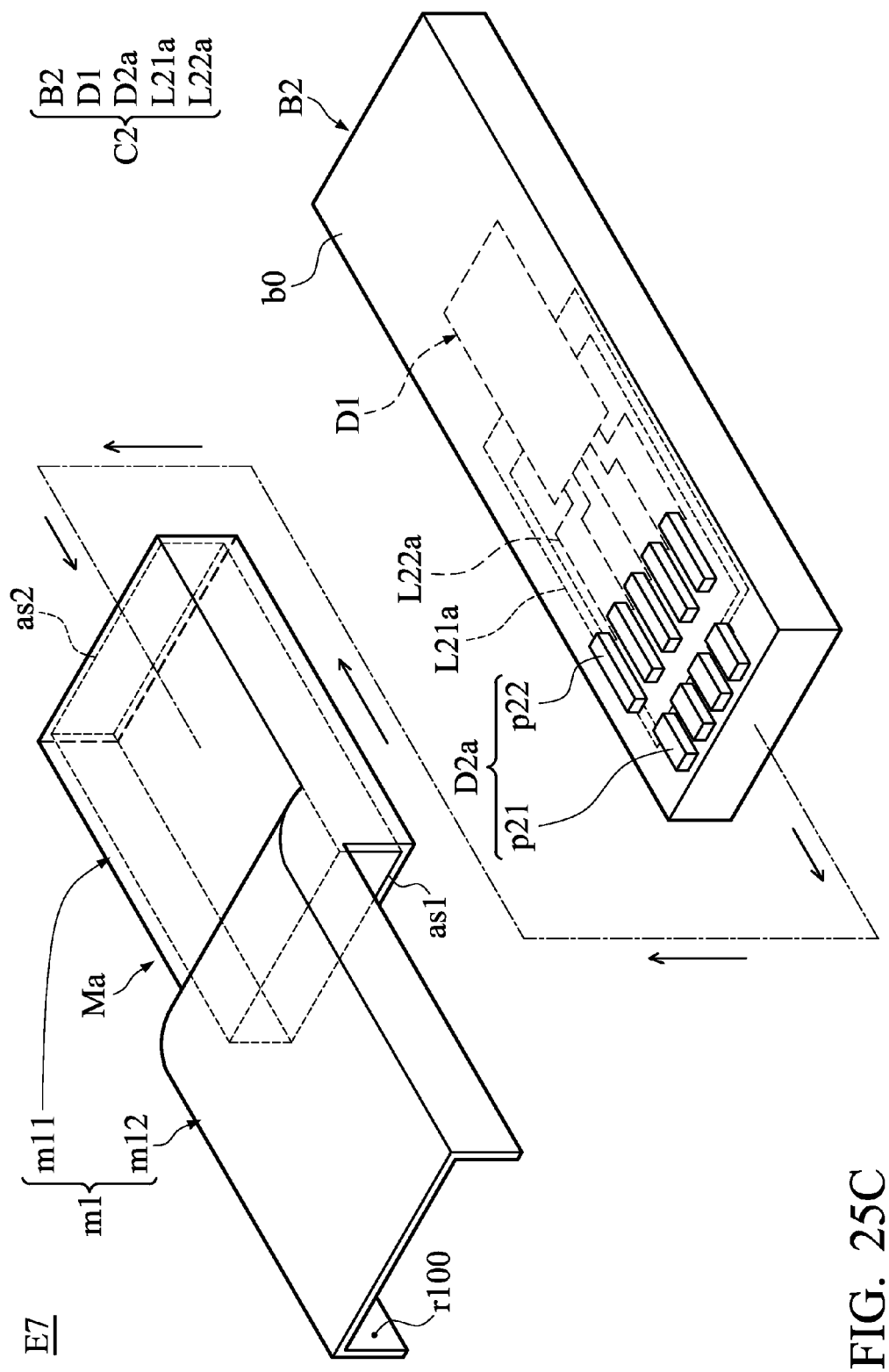
FIG. 25C is another exploded view of the assembly structure of the twenty-second embodiment of the disclosure.

FIG. 25A is an exploded view of an assembly structure E7 of a twenty-second embodiment, and FIGS. 25B and 25C are assembled views of the assembly structure E7 of the twenty-second embodiment in two different way, and FIG. 25C is another exploded view of the assembly structure E7 of the twenty-second embodiment.

In FIGS. 25A, 25B and 25C, the assembly structure E7 comprises the shell structure Ma mentioned in the twenty-first embodiment of FIGS. 24A, 24B and 24C and the card structure C3 mentioned in the third embodiment of FIG. 4. The assembling process of the shell structure Ma and the card structure C3 of the assembly structure E7 is similar to that of the shell structure Ma and the card structure C1 of the assembly structure E6, and the detail description of the assembly structure E7 is therefore omitted.

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A card structure, comprising:
   a first substrate comprising a base surface, at least one electronic part region disposed on the base surface, and a terminal region disposed on the base surface;
   a second substrate disposed on the base surface of the first substrate and coupled to the terminal region of the first substrate; and
   a connector disposed on the base surface of the first substrate to juxtapose the second substrate, comprising a connecting surface, a contact unit, and a plurality of contact regions disposed on the connecting surface and coupled to the contact unit;
   wherein the connector covers the at least one electronic part region of the first substrate and the plurality of contact regions of the connector are coupled to the terminal region of the first substrate when the connecting surface of the connector is connected to the base surface of the first substrate, such that the plurality of contact regions of the connector are coupled to the second substrate via the terminal region of the first substrate.

2. The card structure as claimed in claim 1, wherein the connector further comprises a receiving portion disposed on the connecting surface thereof, wherein the receiving portion of the connector receives the at least one electronic part region of the first substrate when the connecting surface of the connector is connected to the base surface of the first substrate.

3. The card structure as claimed in claim 2, wherein the receiving portion of the connector comprises a recessed portion.

4. The card structure as claimed in claim 1, wherein the connecting surface of the connector substantially comprises a similar U-shaped connecting surface formed by a first segment and two second segments, the two second segments are parallel to each other and joined with the first segment, the first segment is located between the two second segments and the second substrate, and the plurality of contact regions are disposed on the first segment of the similar U-shaped connecting surface.

5. The card structure as claimed in claim 1, wherein the connecting surface of the connector substantially comprises a similar U-shaped connecting surface formed by a first segment and two second segments, the two second segments are parallel to each other and joined with the first segment, the two second segments are located between the first segment and the second substrate, and the plurality of contact regions are disposed on the first segment of the similar U-shaped connecting surface.

6. The card structure as claimed in claim 1, wherein the contact unit of the connector comprises at least one first contact portion and at least one second contact portion, and the at least one first contact portion and the at least one second contact portion of the contact unit of the connector are coupled to the plurality of contact regions of the connector.

7. The card structure as claimed in claim 6, wherein the at least one first contact portion of the contact unit of the connector comprises a plurality of pad portions, and the at least one second contact portion of the contact unit of the connector comprises a plurality of elastic plates.

8. The card structure as claimed in claim 1, wherein the first substrate comprises a circuit unit.

9. The card structure as claimed in claim 1, wherein the second substrate comprises a chip on board device.

* * * * *